(12) United States Patent
Takabe

(10) Patent No.: US 12,343,990 B2
(45) Date of Patent: *Jul. 1, 2025

(54) PIEZOELECTRIC DEVICE, LIQUID EJECTING HEAD, AND LIQUID EJECTING APPARATUS

(71) Applicant: SEIKO EPSON CORPORATION, Tokyo (JP)

(72) Inventor: Motoki Takabe, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 27 days.

This patent is subject to a terminal disclaimer.

(21) Appl. No.: 18/098,169

(22) Filed: Jan. 18, 2023

(65) Prior Publication Data

US 2023/0226817 A1      Jul. 20, 2023

(30) Foreign Application Priority Data

Jan. 19, 2022    (JP) ................. 2022-006260

(51) Int. Cl.
*B41J 2/14*    (2006.01)
*B41J 2/045*   (2006.01)
*H10N 30/20*   (2023.01)
*H10N 30/80*   (2023.01)
*H10N 30/87*   (2023.01)

(52) U.S. Cl.
CPC ....... *B41J 2/04541* (2013.01); *B41J 2/04581* (2013.01); *B41J 2/14233* (2013.01); *H10N 30/2047* (2023.02); *H10N 30/802* (2023.02); *H10N 30/87* (2023.02)

(58) Field of Classification Search
None
See application file for complete search history.

(56) References Cited

U.S. PATENT DOCUMENTS

| | | |
|---|---|---|
| 2004/0174415 A1 | 9/2004 | Kojima |
| 2009/0289998 A1 | 11/2009 | Tanaka et al. |
| 2014/0043394 A1 | 2/2014 | Ishikawa et al. |
| 2014/0267478 A1 | 9/2014 | Yokoyama |

(Continued)

FOREIGN PATENT DOCUMENTS

| | | |
|---|---|---|
| JP | 2000-025225 A | 1/2000 |
| JP | 2010-208204 A | 9/2010 |

(Continued)

*Primary Examiner* — Erica S Lin
(74) *Attorney, Agent, or Firm* — Harness, Dickey & Pierce, P.L.C.

(57) ABSTRACT

A piezoelectric device includes a substrate on which a plurality of recesses are arranged in a first direction, a vibration plate, and a piezoelectric actuator having a first electrode, a second electrode and a third electrode, a fourth electrode, and a piezoelectric layer, in which a plurality of active portions are provided, the second electrode and the third electrode are provided from an edge of a region facing a recess to an outside of the recess, the first electrode is formed between the second electrode and the third electrode, the second electrode, the third electrode, and the fourth electrode configure common electrodes for the plurality of active portions, and the first electrode configures an individual electrode provided independently for each of the active portions.

16 Claims, 30 Drawing Sheets

(56) References Cited

U.S. PATENT DOCUMENTS

| | | | |
|---|---|---|---|
| 2015/0091962 A1* | 4/2015 | Naito | B41J 2/04593 347/11 |
| 2015/0224771 A1 | 8/2015 | Hirai et al. | |
| 2018/0236791 A1 | 8/2018 | Ohashi et al. | |
| 2018/0244071 A1 | 8/2018 | Fujimoto et al. | |
| 2020/0108613 A1 | 4/2020 | Tsuji et al. | |

FOREIGN PATENT DOCUMENTS

| | | |
|---|---|---|
| JP | 2014-034170 A | 2/2014 |
| JP | 2014-172342 A | 9/2014 |

* cited by examiner

PIEZOELECTRIC DEVICE, LIQUID EJECTING HEAD, AND LIQUID EJECTING APPARATUS

The present application is based on, and claims priority from JP Application Serial Number 2022-006260, filed Jan. 19, 2022, the disclosure of which is hereby incorporated by reference herein in its entirety.

BACKGROUND

1. Technical Field

The present disclosure relates to a piezoelectric device having a piezoelectric actuator, a liquid ejecting head and a liquid ejecting apparatus that eject a liquid from nozzles, and more particularly to an ink jet recording head and an ink jet recording apparatus that eject ink as the liquid.

2. Related Art

An ink jet recording head is known as a liquid ejecting head that is one of electronic devices. An ink jet recording head includes a substrate provided with pressure chambers communicating with nozzles, a vibration plate provided on one surface side of the substrate, and a piezoelectric actuator having a piezoelectric layer provided on the vibration plate. The piezoelectric actuator is driven to change the pressure of ink in the pressure chamber, and thus ink droplets are ejected from the nozzle (refer to, for example, JP-A-2010-208204).

However, the piezoelectric actuator has a problem that residual strain is accumulated in a layer of a piezoelectric material due to repeated driving, and thus an amount of displacement of the piezoelectric actuator is reduced.

Such a problem is not limited to liquid ejecting heads typified by ink jet recording heads, but also exists in other piezoelectric devices.

SUMMARY

According to an aspect of the present disclosure, there is provided a piezoelectric device including a substrate on which a plurality of recesses are arranged in a first direction; a vibration plate; and a piezoelectric actuator in which a first electrode, a second electrode and a third electrode, and a fourth electrode are stacked in this order, and a piezoelectric layer is disposed between the first electrode and the fourth electrode, between the second electrode and the fourth electrode, and between the third electrode and the fourth electrode, in which a plurality of active portions in which the piezoelectric layer is interposed between the first electrode, the second electrode and the third electrode, and the fourth electrode are provided, the second electrode and the third electrode are provided from an edge of a region facing a recess to an outside of the recess when viewed in a stacking direction at both ends of the recess in the first direction, the first electrode is formed between the second electrode and the third electrode in the first direction, the second electrode, the third electrode, and the fourth electrode configure common electrodes for the plurality of active portions, and the first electrode configures an individual electrode provided independently for each of the active portions.

According to another aspect of the present disclosure, there is provided a liquid ejecting head including a substrate on which pressure chambers communicating with nozzles ejecting a liquid are arranged in a first direction; a vibration plate; and a piezoelectric actuator in which a first electrode, a second electrode and a third electrode, and a fourth electrode are stacked in this order, and a piezoelectric layer is disposed between the first electrode and the fourth electrode, between the second electrode and the fourth electrode, and between the third electrode and the fourth electrode, in which a plurality of active portions in which the piezoelectric layer is interposed between the first electrode, the second electrode and the third electrode, and the fourth electrode are provided, the second electrode and the third electrode are provided to extend from an edge of a region facing a pressure chamber to an outside of the pressure chamber when viewed in a stacking direction at both ends of the pressure chamber in the first direction, the first electrode is formed between the second electrode and the third electrode in the first direction, the second electrode, the third electrode, and the fourth electrode configure common electrodes for the plurality of active portions, and the first electrode configures an individual electrode provided independently for each of the active portions.

According to still another aspect of the present disclosure, there is provided a liquid ejecting apparatus including the above liquid ejecting head.

According to still another aspect of the present disclosure, there is provided a liquid ejecting apparatus including a substrate on which a plurality of pressure chambers communicating with nozzles ejecting a liquid are arranged in a first direction; a vibration plate; a piezoelectric actuator in which a first electrode, a second electrode and a third electrode, and a fourth electrode are stacked in this order, and a piezoelectric layer is disposed between the first electrode and the fourth electrode, between the second electrode and the fourth electrode, and between the third electrode and the fourth electrode; and a control section that drives the piezoelectric actuator, in which a plurality of active portions in which the piezoelectric layer is interposed between the first electrode, the second electrode and the third electrode, and the fourth electrode are provided, the second electrode and the third electrode are provided to extend from an edge of a region facing a pressure chamber to an outside of the pressure chamber when viewed in a stacking direction at both ends of the pressure chamber in the first direction, the first electrode is formed between the second electrode and the third electrode in the first direction, the second electrode, the third electrode, and the fourth electrode configure common electrodes for the plurality of active portions, the first electrode configures an individual electrode provided independently for each of the active portions, the control section supplies an ejection pulse for ejecting the liquid from the nozzles to the first electrode, and the control section supplies a damping pulse for driving the piezoelectric actuator to the second electrode and the third electrode such that the liquid is not ejected from the nozzles at least after the ejection pulse.

According to still another aspect of the present disclosure, there is provided a liquid ejecting apparatus including a substrate on which a plurality of pressure chambers communicating with nozzles ejecting a liquid are arranged in a first direction; a vibration plate; a piezoelectric actuator in which a first electrode, a second electrode and a third electrode, and a fourth electrode are stacked in this order, and a piezoelectric layer is disposed between the first electrode and the fourth electrode, between the second electrode and the fourth electrode, and between the third electrode and the fourth electrode; and a control section that drives the piezoelectric actuator, in which a plurality of active portions in which the piezoelectric layer is interposed between the first electrode, the second electrode and the third electrode, and the fourth electrode are provided, the second electrode and the third electrode are provided to extend from an edge of a region facing a pressure chamber to an outside of the pressure chamber when viewed in a stacking direction at both ends of the pressure chamber in the first direction, the first electrode is formed between the second electrode and the third electrode in the first direction, the second electrode, the third electrode, and the fourth electrode configure common electrodes for the plurality of active portions, the first electrode configures an individual electrode provided independently for each of the active portions, the control section supplies a first drive signal including an ejection pulse for ejecting the liquid from the nozzles to the first electrode, and the control section supplies a first potential different from a potential supplied to the fourth electrode to the second electrode and the third electrode while the first drive signal is being supplied to the first electrode.

DESCRIPTION OF EXEMPLARY EMBODIMENTS

Figure 1:
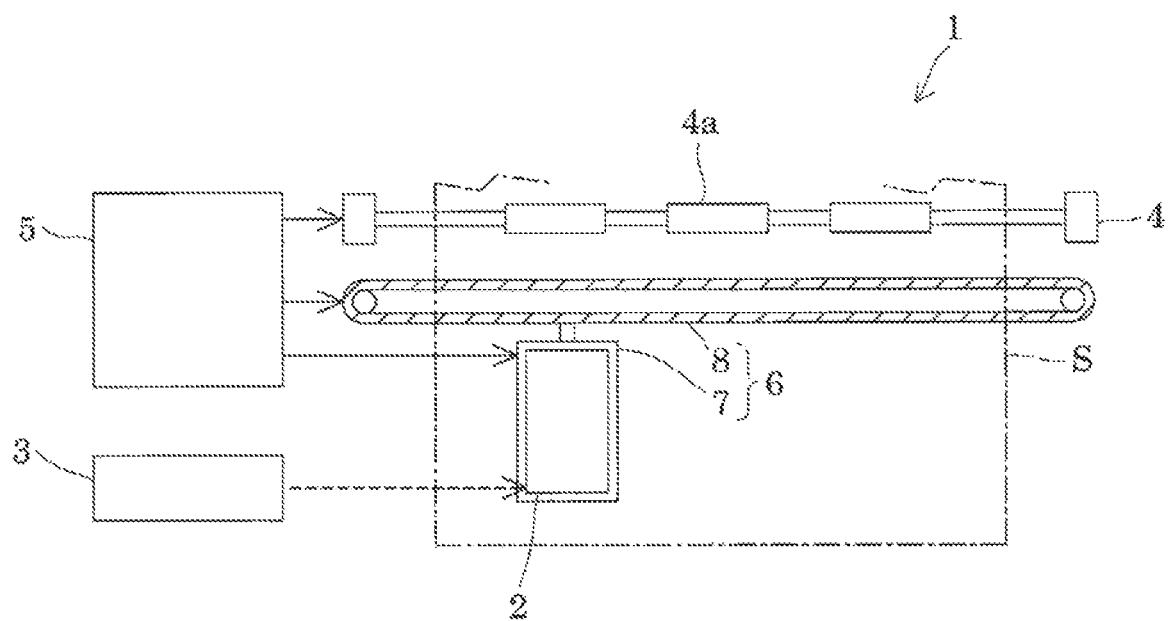
FIG. 1 is a schematic diagram of an ink jet recording apparatus.
Figure 1:
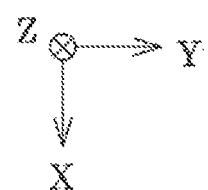

The present disclosure will be described in detail below based on embodiments. However, the following description shows one aspect of the present disclosure, and can be arbitrarily changed within the scope of the present disclosure. In each drawing, the same reference numerals denote the same members, and the description thereof is omitted as appropriate. In each drawing, X, Y, and Z represent three spatial axes orthogonal to each other. In the present specification, directions along these axes will be referred to as X, Y, and Z directions. A direction in which the arrow points in each drawing is defined as a positive (+) direction, and a direction opposite to the arrow is defined as a negative (−) direction. The three spatial axes X, Y, and Z, which are not limited to positive and negative directions, will be described as the X axis, Y axis, and Z axis. In each of the following embodiments, as an example, a "first direction" is the +X direction, and a "second direction" is the +Y direction. A "stacking direction" is the −Z direction. However, a description of a configuration in the stacking direction is made with reference to a drawing viewed in the +Z direction.

Embodiment 1

FIG. 1 is a diagram schematically illustrating an ink jet recording apparatus 1 as an example of a liquid ejecting apparatus according to Embodiment 1 of the present disclosure.

As illustrated in FIG. 1, the ink jet recording apparatus 1 that is an example of a liquid ejecting apparatus is a printing apparatus that ejects ink, which is a type of liquid, as ink droplets onto a medium S such as printing paper and lands the ink on the medium S, and thus prints an image or the like by arranging dots formed on the medium S. As the medium S, any material may be used.

In the following description, among the three spatial axes of X, Y, and Z, a movement direction of a recording head 2 that will be described later is defined as an X axis, a transport direction of the medium S orthogonal to the movement direction is defined as a Y axis, a plane parallel to a nozzle surface on which nozzles 21 of the recording head 2 are formed is defined as an XY plane, and a direction intersecting the nozzle surface, that is, the XY plane, which is a direction orthogonal to the XY plane in the present embodiment, is defined as a Z axis, and it is assumed that ink droplets are ejected in the +Z direction along the Z axis.

The ink jet recording apparatus 1 includes a liquid container 3, a transport mechanism 4 that transports the medium S, a control device 5, a moving mechanism 6, and a recording head 2.

The liquid container 3 individually stores a plurality of types of ink ejected from the recording head 2. Examples of the liquid container 3 include a cartridge attachable to and detachable from the ink jet recording apparatus 1, a bag-like ink pack made of a flexible film, and an ink tank capable of replenishing ink.

The control device 5, which will be described later in detail, includes, for example, a control processing section such as a central processing unit (CPU) or a field programmable gate array (FPGA), and a storage device such as a semiconductor memory, and comprehensively controls the transport mechanism 4, the moving mechanism 6, the recording head 2, and the like.

The transport mechanism 4 is controlled by the control device 5 to transport the medium S along the Y axis, and has, for example, transport rollers 4a.

The moving mechanism 6 is controlled by the control device 5 to reciprocate the recording head 2 along the X axis in the +X direction and the −X direction. Specifically, the moving mechanism 6 of the present embodiment includes a transport body 7 and a transport belt 8. The transport body 7 is a substantially box-shaped structure that accommodates the recording head 2, a so-called carriage, and is fixed to the transport belt 8. The transport belt 8 is an endless belt stretched along the X axis. When the transport belt 8 is rotated under the control of the control device 5, the recording head 2 is reciprocated together with the transport body 7 in the +X direction and the −X direction along guide rails (not illustrated). The liquid container 3 may also be mounted on the transport body 7 together with the recording head 2.

Under the control of the control device 5, the recording head 2 ejects the ink supplied from the liquid container 3 from each of the plurality of nozzles 21 as ink droplets onto the medium S in the +Z direction. The ejection of ink droplets from the recording head 2 is performed in parallel with the transport of the medium S by the transport mechanism 4 and the reciprocating movement of the recording head 2 by the moving mechanism 6, so that an ink image is formed on the surface of the medium S, that is, so-called printing is performed.

Figure 2:
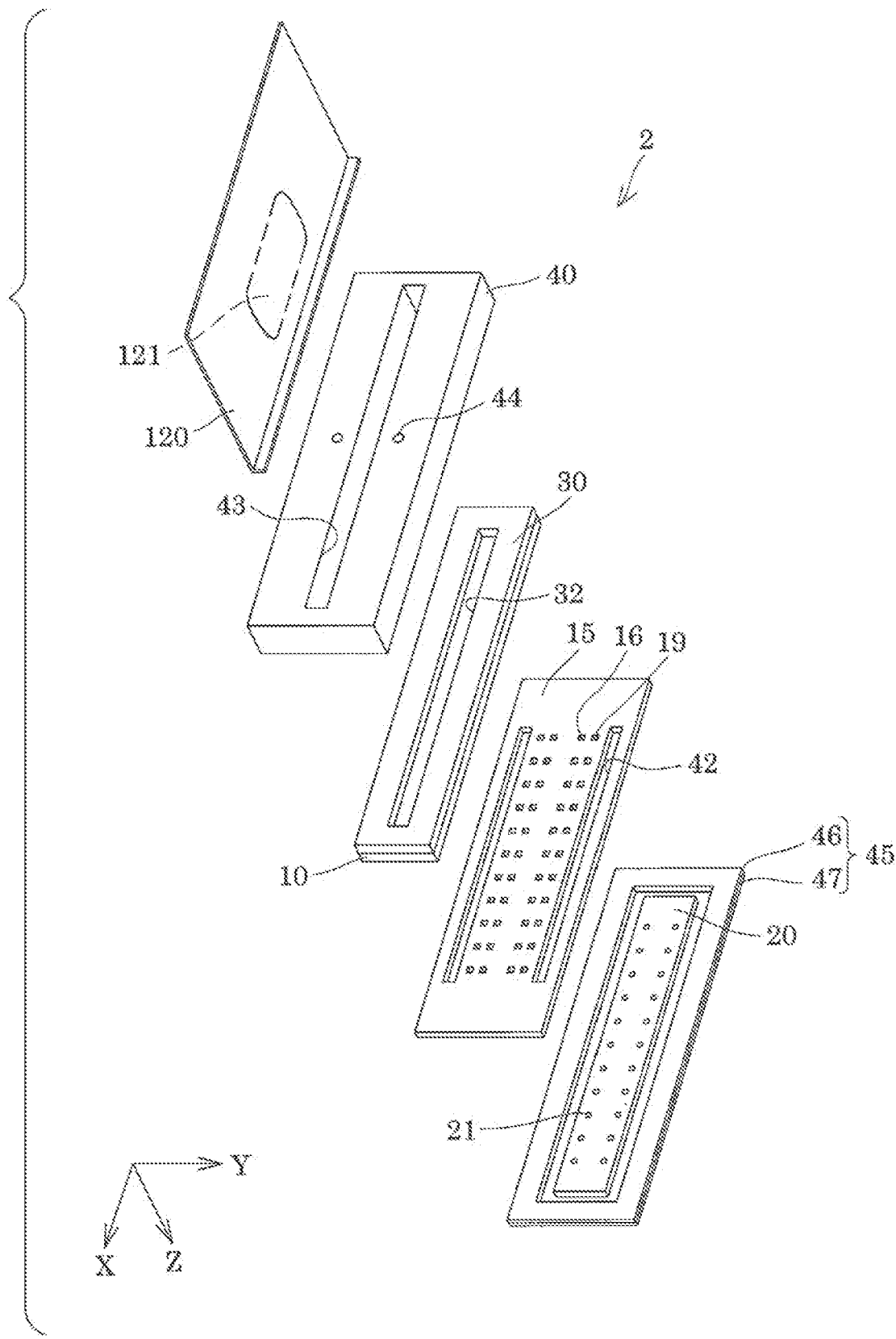
FIG. 2 is an exploded perspective view of a recording head according to Embodiment 1.
Figure 3:
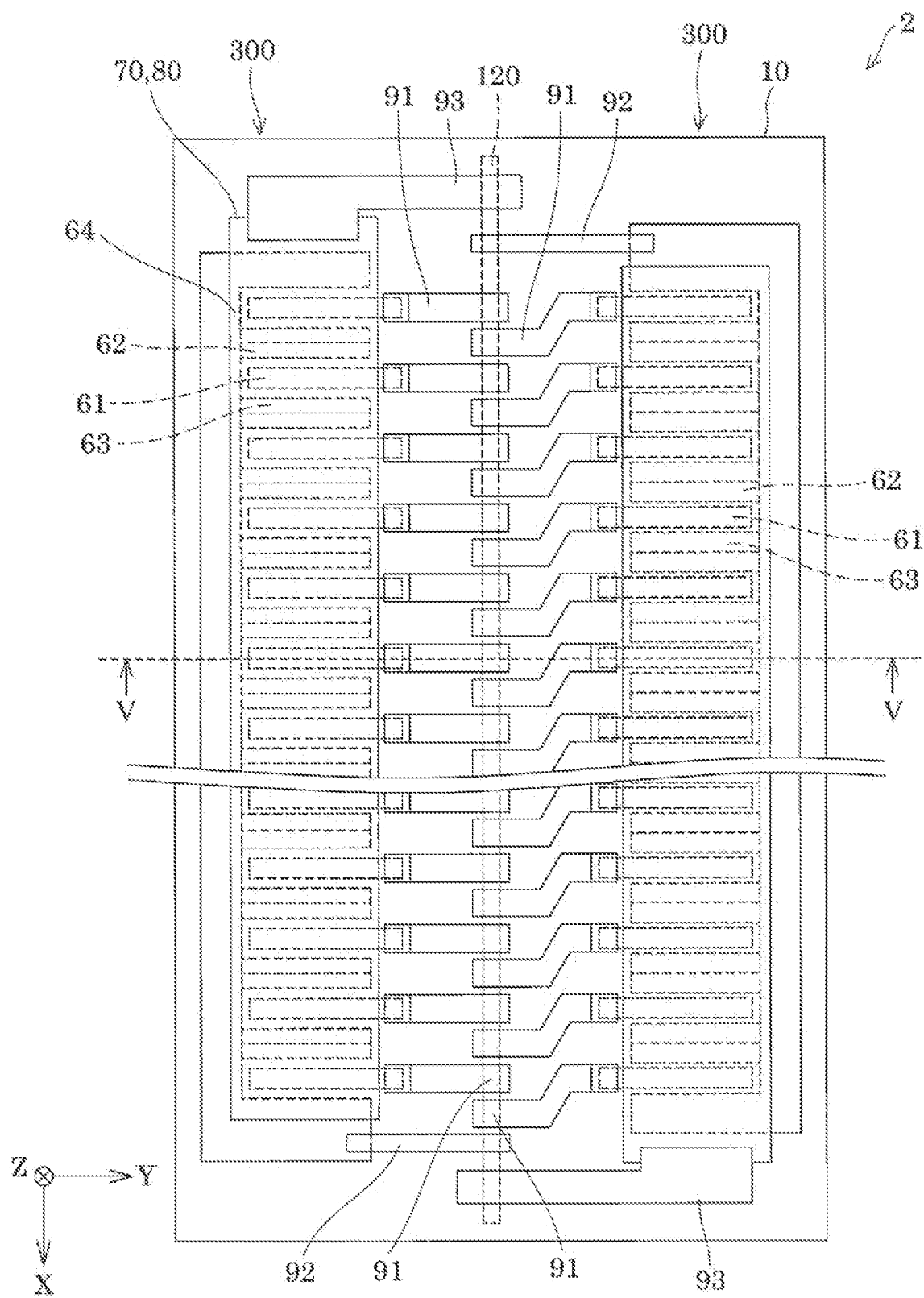
FIG. 3 is a plan view of a channel forming substrate according to Embodiment 1.
Figure 4:
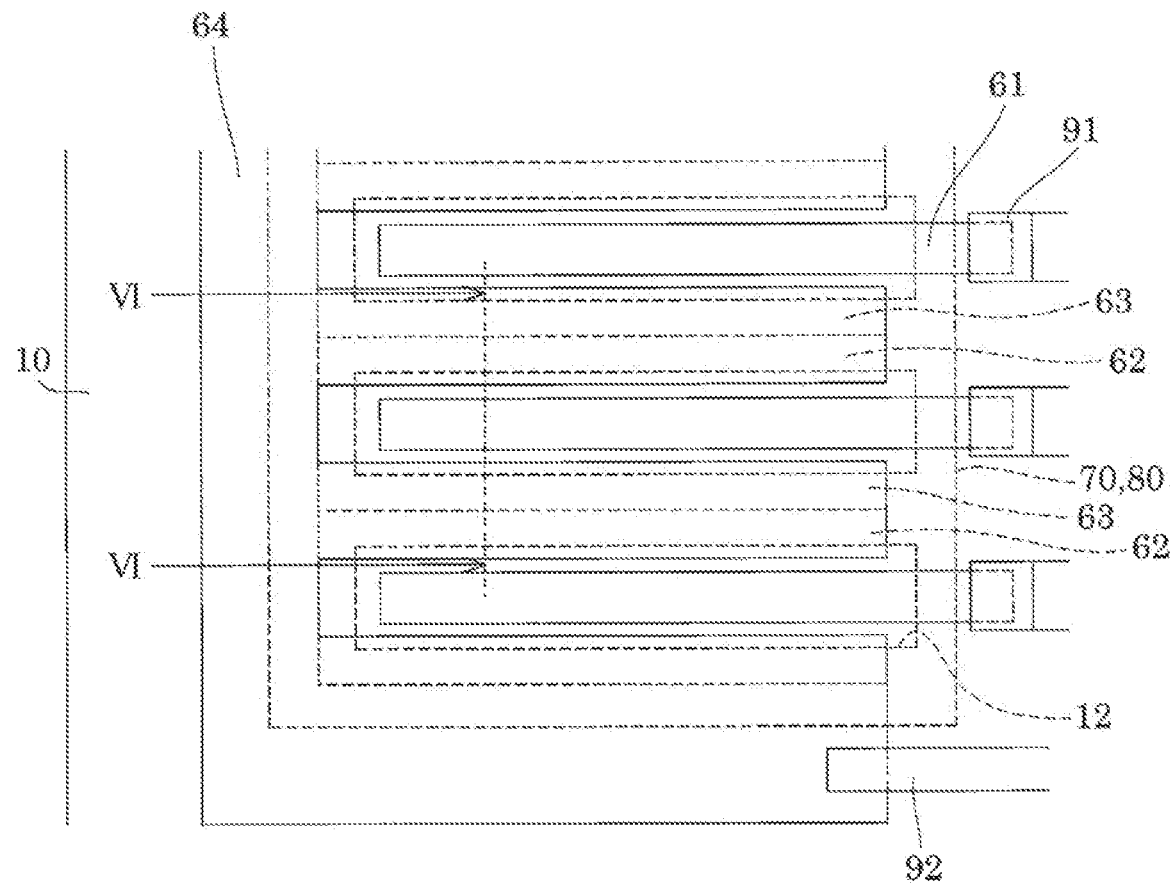
FIG. 4 is an enlarged plan view of a main portion of the channel forming substrate according to Embodiment 1.
Figure 5:
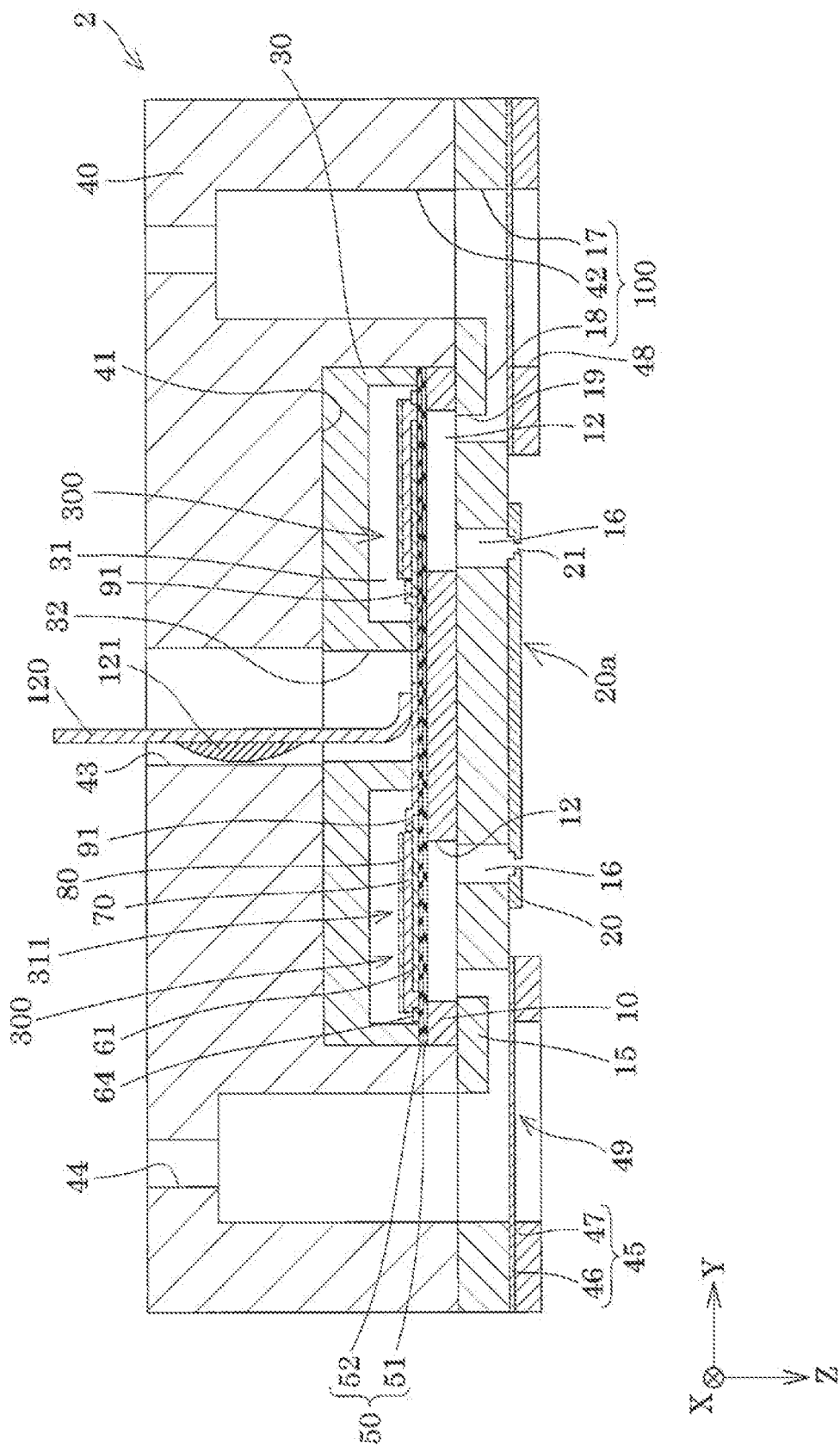
FIG. 5 is a sectional view of the recording head according to Embodiment 1.
Figure 6:
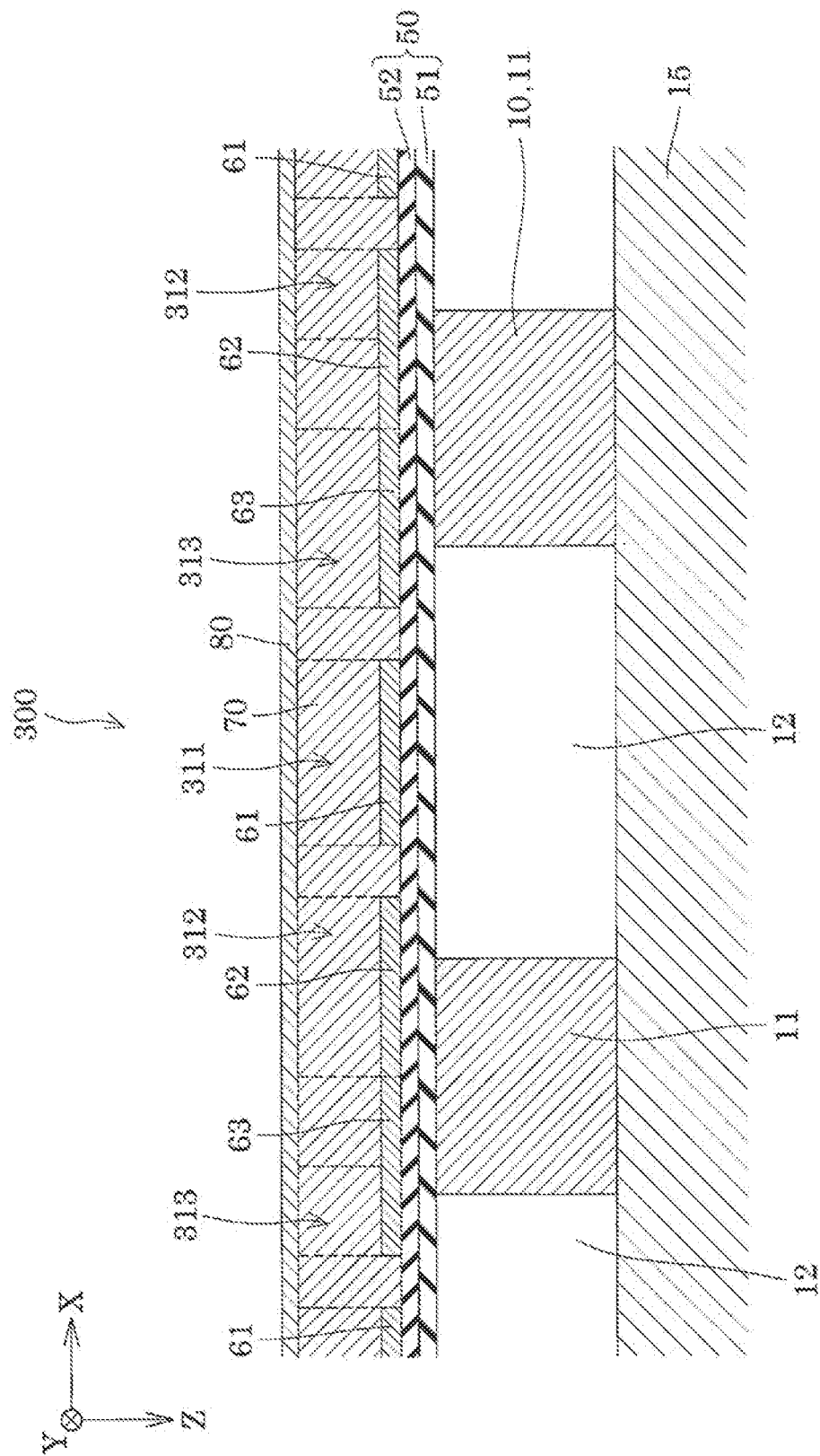
FIG. 6 is a sectional view of a main portion of the recording head according to Embodiment 1.

FIG. 2 is an exploded perspective view of the recording head 2 that is an example of a liquid ejecting head of the present embodiment. FIG. 3 is a plan view in which the channel forming substrate 10 of the recording head 2 is viewed in the +Z direction. FIG. 4 is an enlarged plan view of a main portion of the channel forming substrate 10 of the recording head 2. FIG. 5 is a sectional view of the recording head 2 taken along line V-V in FIG. 3. FIG. 6 is a sectional view of the recording head 2 taken along line VI-VI in FIG. 4.

As illustrated, the recording head 2 of the present embodiment includes a channel forming substrate 10 as an example of a "substrate". The channel forming substrate 10 is made of a silicon substrate.

A plurality of pressure chambers 12 are arranged in the +X direction, which is the first direction, in the channel forming substrate 10. The pressure chamber 12 is formed such that when viewed in the −Z direction, the +X direction is a lateral direction and the +Y direction is a longitudinal direction. In the present embodiment, the pressure chamber 12 has a rectangular shape when viewed in the −Z direction, but is not particularly limited to this, and may have a parallelogram shape, have a so-called corner-rounded oblong shape (also called a track shape) in which both ends are semicircular based on an oblong shape, or may have a polygonal shape. The plurality of pressure chambers 12 are arranged on a straight line in the +X direction such that positions thereof in the +Y direction are the same. The pressure chambers 12 adjacent to each other in the +X direction are partitioned by partition walls 11. Of course, the arrangement of the pressure chambers 12 is not particularly limited to the example in FIG. 3.

A shape of the pressure chamber 12 of the present embodiment when viewed in the +Z direction may be a so-called corner-rounded oblong shape in which both ends in a longitudinal direction are semicircular based on a rectangular shape, a parallelogram shape, or an oblong shape, may be an oval shape such as an elliptical shape or an egg shape, or may be a circular shape, a polygonal shape, or the like. In the present embodiment, the pressure chamber 12 has a lateral direction in the +X direction and a longitudinal direction in the +Y direction. By arranging the pressure chambers 12 in the +X direction, which is the lateral direction, the pressure chambers 12 can be arranged at high density. This pressure chamber 12 corresponds to a "recess" provided in the "substrate".

A communication plate 15 and a nozzle plate 20 are sequentially stacked on the +Z direction side of the channel forming substrate 10. Here, the concept that "A and B are stacked" includes other layers interposed between A and B.

The communication plate 15 is provided with a nozzle communication passage 16 that communicates the pressure chamber 12 and the nozzle 21.

The communication plate 15 is provided with a first manifold portion 17 and a second manifold portion 18 that configure a part of a manifold 100 serving as a common liquid chamber with which the plurality of pressure chambers 12 commonly communicate. The first manifold portion 17 is provided to penetrate the communication plate 15 in the +Z direction. The second manifold portion 18 is provided to be open on a surface of the communication plate 15 on the +Z direction side without penetrating the communication plate 15 in the +Z direction.

The communication plate 15 is provided with a supply communication passage 19 that communicates with one end of the pressure chamber 12 in the direction along the Y axis, independently for each pressure chamber 12. The supply communication passage 19 communicates between the second manifold portion 18 and the pressure chambers 12 to supply the ink in the manifold 100 to the pressure chambers 12.

The nozzle plate 20 is provided on the side of the communication plate 15 opposite to the channel forming substrate 10, that is, on the surface on the +Z direction side.

The nozzle plate 20 is provided with nozzles 21 communicating with the respective pressure chambers 12 via the nozzle communication passages 16. In the present embodiment, the plurality of nozzles 21 are provided in two rows of nozzle rows that are arranged in a row in the +X direction and are spaced apart in the +Y direction. As such a nozzle plate 20, a silicon substrate, a glass substrate, an SOI substrate, various ceramic substrates, a metal substrate such as a stainless steel substrate, an organic material such as a polyimide resin, or the like may be used. A surface of the nozzle plate 20 in the −Z direction where the nozzles 21 are open is a liquid ejecting surface 20a.

A vibration plate 50 and a piezoelectric actuator 300 are sequentially stacked on the surface of the channel forming substrate 10 on the −Z direction side. That is, the channel forming substrate 10, the vibration plate 50, and the piezoelectric actuator 300 are stacked in this order in the −Z direction. Details of the vibration plate 50 and the piezoelectric actuator 300 will be described later.

As illustrated in FIGS. 2 and 5, a protective substrate 30 having approximately the same size as the channel forming substrate 10 is bonded to the surface of the channel forming substrate 10 in the −Z direction. The protective substrate 30 has a holding portion 31 that is a space that protects the piezoelectric actuator 300. The protective substrate 30 is provided with a through-hole 32 penetrating in the +Z direction between two holding portions 31 arranged in the +Y direction. The ends of a first individual lead electrode 91, a first common lead electrode 92, and a second common lead electrode 93 drawn out from electrodes of the piezoelectric actuator 300 extend to be exposed in the through-hole 32, and the first individual lead electrode 91, the first common lead electrode 92, and the second common lead electrode 93, and a wiring substrate 120 coupled to the control device 5 are electrically coupled to each other within the through-hole 32.

As illustrated in FIG. 5, a case member 40 is fixed on the protective substrate 30 to define, together with the channel forming substrate 10, the manifold 100 communicating with the plurality of pressure chambers 12. The case member 40 has substantially the same shape as that of the communication plate 15 described above in a plan view in the +Z direction, and is bonded to the protective substrate 30 and also to the communication plate 15 described above. In the present embodiment, the case member 40 is bonded to the communication plate 15.

The case member 40 is provided with a third manifold portion 42 communicating with the first manifold portion 17. The third manifold portion 42 has a recessed shape that is open on a surface thereof in the +Z direction. The first manifold portion 17 and the second manifold portion 18 provided in the communication plate 15 and the third manifold portion 42 provided in the case member 40 configure the manifold 100 of the present embodiment. The manifold 100 is provided continuously over the +X direction in which the pressure chambers 12 are arranged. The case member 40 is provided with an inlet 44 that communicates with the manifolds 100 to supply ink to each of the manifolds 100. The case member 40 is provided with a coupling port 43 that communicates with the through-hole 32 of the protective substrate 30, which will be described later in detail, and into which the wiring substrate 120 is inserted.

A compliance substrate 45 is provided on the surface of the communication plate 15 on the +Z direction side where the first manifold portion 17 and the second manifold portion 18 are open. The compliance substrate 45 seals the openings of the first manifold portion 17 and the second manifold portion 18 on the liquid ejecting surface 20a side. Such a compliance substrate 45 includes a sealing film 46 made of a flexible thin film and a fixed substrate 47 made of a hard material such as metal in the present embodiment. Since a region of the fixed substrate 47 facing the manifold 100 is an opening 48 that is completely removed in the thickness direction, one surface of the manifold 100 is a compliance portion 49 which is a flexible portion sealed only by the flexible sealing film 46.

The vibration plate 50 and the piezoelectric actuator 300 of the present embodiment will be described.

As illustrated in FIGS. 5 and 6, the vibration plate 50 is provided on the channel forming substrate 10 in the −Z direction, and includes an elastic film 51 made of silicon oxide provided on the channel forming substrate 10 side with, and an insulator film 52 made of zirconium oxide provided on the −Z direction side of the elastic film 51. The elastic film 51 may be formed of a substrate integrated with the channel forming substrate 10, and such a structure may also be expressed as "stacked". Channels such as the pressure chambers 12 are formed by anisotropically etching the channel forming substrate 10, and the surfaces of the pressure chambers 12 in the −Z direction are defined by the elastic film 51. In the present embodiment, the elastic film 51 and the insulator film 52 are stacked as the vibration plate 50, but the present disclosure is not particularly limited to this.

As illustrated in FIGS. 4 to 6, the piezoelectric actuator 300 is also referred to as a piezoelectric element, and serves as pressure generating means for causing pressure changes in the ink within the pressure chamber 12. The piezoelectric actuator 300 includes a first electrode 61, a second electrode 62 and a third electrode 63, a fourth electrode 80 and a piezoelectric layer 70.

The first electrode 61, the second electrode 62 and the third electrode 63 are located in the +Z direction relative to the fourth electrode 80. That is, the fourth electrode 80 is located in the −Z direction relative to the first electrode 61, the second electrode 62 and the third electrode 63. In other words, the first electrode 61, the second electrode 62, the third electrode 63, and the fourth electrode 80 are stacked in this order in the −Z direction. Here, the stacking of the first electrode 61, the second electrode 62, the third electrode 63, and the fourth electrode 80 means that the first electrode 61, the second electrode 62, the third electrode 63, and the fourth electrode 80 are stacked with other layers interposed therebetween in the direction along the Z axis. In the present embodiment, the piezoelectric actuator 300 has the piezoelectric layer 70 between the first electrode 61 and the fourth electrode 80 in the direction along the Z axis. The piezoelectric actuator 300 has a piezoelectric layer 70 between the second electrode 62 and the fourth electrode 80. The piezoelectric actuator 300 has the piezoelectric layer 70 between the third electrode 63 and the fourth electrode 80. The first electrode 61 does not have the piezoelectric layer 70 in the +Z direction, which is the pressure chamber 12 side.

The first electrode 61, the second electrode 62, and the third electrode 63 are provided on the surface of the vibration plate 50 in the −Z direction. That is, the first electrode 61, the second electrode 62, and the third electrode 63 are provided at the same position in the direction along the Z axis.

The second electrode 62 and the third electrode 63 are provided from the end of the region facing the pressure chamber 12 to the outside of the pressure chamber 12 at both ends of the pressure chamber 12 in the +X direction, that is, the end in the +X direction and the end in the −X direction when viewed in the −Z direction that is a stacking direction. In the present embodiment, the second electrode 62 is provided from the edge of the region facing the pressure chamber 12 to the top of the partition wall 11 outside the pressure chamber 12 in the −X direction when viewed in the −Z direction at the end of the pressure chamber 12 in the −X direction. The third electrode 63 is provided from the edge of the region facing the pressure chamber 12 to the top of the partition wall 11 outside the pressure chamber 12 in the +X direction when viewed in the −Z direction at the end of the pressure chamber 12 in the +X direction.

The second electrode 62 and the third electrode 63 provided for one pressure chamber 12 are provided to be electrically coupled to each other on the channel forming substrate 10. Specifically, the second electrode 62 and the third electrode 63 are coupled to a common communication portion 64 that is continuously provided in the +X direction on one of the outer sides of the pressure chamber 12 in the direction along the Y axis, and thus are electrically coupled to each other via the common communication portion 64. In the present embodiment, the second electrode 62, the third electrode 63, and the common communication portion 64 are continuously provided by patterning the same metal layer. Of course, the second electrode 62, the third electrode 63 and the common communication portion 64 may be formed of different layers. In other words, the fact that the second electrode 62 and the third electrode 63 are electrically coupled on the channel forming substrate 10 also includes the fact that the second electrode 62 and the third electrode 63 are electrically coupled via another member. The fact that the second electrode 62 and the third electrode 63 are continuous on the channel forming substrate 10 includes the fact that the second electrode 62 and the third electrode 63 are directly continuous on the channel forming substrate 10 and also includes that the second electrode 62 and the third electrode 63 are continuous on the vibration plate 50 provided on the channel forming substrate 10. In other words, the term "on the substrate" includes both "directly on the substrate" and "above" which indicates a state in which another member is interposed.

The second electrode 62 and the third electrode 63 are continuously provided without being divided on the partition wall 11 between the pressure chambers 12 adjacent to each other in the +X direction. That is, of the two pressure chambers 12 arranged in the +X direction, the third electrode 63 provided for one pressure chamber 12 and the second electrode 62 provided for the other pressure chamber 12 are continuously provided on the partition wall 11 between the two pressure chambers 12 without interruption. In the present embodiment, the second electrode 62 and the third electrode 63 of the two pressure chambers 12 arranged in the +X direction are separated at the center of the partition wall 11 in the +X direction and have the names.

The first electrode 61 is provided between the second electrode 62 and the third electrode 63 in the +X direction. Here, the fact that the first electrode 61 is formed between the second electrode 62 and the third electrode 63 in the +X direction means that the center of the first electrode 61 in the +X direction is located between the respective centers of the second electrode 62 and the third electrode 63 in the +X direction. In the present embodiment, the first electrode 61, the second electrode 62, and the third electrode 63 are disposed on the same position in the −Z direction by being provided on the flat surface of the vibration plate 50 in the −Z direction. Therefore, the first electrode 61, the second electrode 62, and the third electrode 63 are disposed at positions that do not overlap each other when viewed in the −Z direction. That is, the first electrode 61 is disposed with a gap between the first electrode 61 and the second electrode 62 in the +X direction of the second electrode 62, and is disposed with a gap between the first electrode 61 and the third electrode 63 in the −X direction of the third electrode 63. Of course, when the first electrode 61, the second electrode 62, and the third electrode 63 are disposed at different positions in the −Z direction, the first electrode 61, and the second electrode 62 and the third electrode 63 may be disposed at positions that partially overlap each other when viewed in the −Z direction.

The piezoelectric layer 70 is continuously provided in the +X direction to have a predetermined width in the +Y direction. That is, the piezoelectric layer 70 is continuously provided over the first electrode 61, the second electrode 62, and the third electrode 63 in the +X direction. The piezoelectric layer 70 is continuously provided in the +X direction for the plurality of pressure chambers 12 without interruption. The piezoelectric layer 70 is provided to have substantially the same thickness in the +X direction. The piezoelectric layer 70 may have a recess corresponding to each partition wall 11. A width of the recess in the +X direction may be smaller than a width of the partition wall 11. The recess may be provided to penetrate through the piezoelectric layer 70 in the +Z direction that is a thickness direction, or may be provided halfway through the thickness of the piezoelectric layer 70. That is, the piezoelectric layer 70 may be completely removed or a part of the piezoelectric layer 70 may remain on a bottom surface of the recess in the +Z direction.

The piezoelectric layer 70 on the nozzle 21 side in the Y axis is formed to be shorter than the end of the first electrode 61 outside the pressure chamber 12, and the end of the first electrode 61 on the nozzle 21 side is not covered with the piezoelectric layer 70.

The piezoelectric layer 70 on the opposite side to the nozzle 21 in the Y axis is formed to be shorter than the ends of the second electrode 62 and the third electrode 63 outside the pressure chamber 12, and the ends of the second electrode 62 and the third electrode 63 opposite to the nozzle 21, that is, the portions communicating with the common communication portion 64 are not covered with the piezoelectric layer 70.

Such a piezoelectric layer 70 is configured by using a piezoelectric material made of a perovskite structure composite oxide represented by the general formula $ABO_3$. As the perovskite structure composite oxide used for the piezoelectric layer 70, for example, a lead-based piezoelectric material containing lead or a lead-free piezoelectric material not containing lead may be used. In the present embodiment, lead zirconate titanate (PZT) is used for the piezoelectric layer 70.

The fourth electrode 80 is provided on the surface of the piezoelectric layer 70 on the −Z direction side. The fourth electrode 80 covers the pressure chamber 12 in the +X direction when viewed in the +Z direction. That is, the fourth electrode 80 is disposed at a position overlapping the pressure chamber 12 in the +X direction when viewed in the +Z direction. In the present embodiment, the fourth electrode 80 is provided continuously over the surface of the piezoelectric layer 70 on the −Z direction side. That is, the fourth electrode 80 is continuously provided to include positions overlapping the first electrode 61, the second electrode 62, and the third electrode 63 when viewed in the +Z direction. In other words, the piezoelectric layer 70 is formed between the first electrode 61 and the fourth electrode 80, between the second electrode 62 and the fourth electrode 80, between the third electrode 63 and the fourth electrode 80. In the present embodiment, since the first electrode 61, the second electrode 62, and the third electrode 63 are disposed at the same position in the +Z direction, a distance between the first electrode 61 and the fourth electrode 80 is the same as a distance between the second electrode 62 and the third electrode and the fourth electrode 80 in the +Z direction.

In such a piezoelectric actuator 300, when a voltage is applied between two electrodes facing each other, a portion interposed between the two electrodes and causing piezoelectric strain in the piezoelectric layer 70 will be referred to as an active portion. In the present embodiment, the portion interposed between the first electrode 61 and the fourth electrode 80 will be referred to as a first active portion 311, and the portion interposed between the second electrode 62 and the fourth electrode 80 will be referred to as a second active portion 312, and the portion interposed between the third electrode 63 and the fourth electrode 80 will be referred to as a third active portion 313. That is, a total of three active portions, that is, one first active portion 311, one second active portion 312, and one third active portion 313 are provided for one pressure chamber 12. In two pressure chambers 12 adjacent in the +X direction, the second electrode 62 provided for one pressure chamber 12 and the third electrode 63 provided for the other pressure chamber 12 are continuous. Therefore, the second active portion 312 provided for one pressure chamber 12 and the third active portion 313 provided for the other pressure chamber 12 are continuous. In the present embodiment, the second active portion 312 and the third active portion 313 of the two pressure chambers 12 arranged in the +X direction are located at the position separating the second electrode 62 and the third electrode 63, that is, the center of the partition wall 11 in the +X direction and have the names.

The first electrode 61 is individually cut for each pressure chamber 12 to configure an individual electrode provided independently for each active portion. Here, the fact that the first electrode 61 is an individual electrode of each active portion means that the plurality of first electrodes 61 provided in the plurality of first active portions 311 on the channel forming substrate 10 are not electrically coupled to each other and are provided independently. The term "on the channel forming substrate 10" includes both "directly on the channel forming substrate 10" as described above and "above" which indicates a state in which another member such as the vibration plate 50 is interposed.

The second electrode 62 and the third electrode 63 configure a common electrode for a plurality of active portions. Here, the fact that the second electrode 62 is a common electrode for the plurality of active portions means that the plurality of second electrodes 62 provided in the plurality of second active portions 312 are electrically coupled to each other on the channel forming substrate 10. The fact that the third electrode 63 is a common electrode for the plurality of active portions means that the plurality of third electrodes 63 provided in the plurality of third active portions 313 are electrically coupled to each other on the channel forming substrate 10. In the present embodiment, the second electrode 62 and the third electrode 63 are electrodes common to the second active portion 312 and the third active portion 313 corresponding to one pressure chamber 12. Therefore, the second electrode 62 and the third electrode 63 are common electrodes that are common to the plurality of second active portions 312 and the plurality of third active portions 313 that both correspond to the plurality of pressure chambers 12.

By using the second electrode 62 and the third electrode 63 as common electrodes for the plurality of second active portions 312 and the plurality of third active portions 313 as described above, a space for isolating the second electrode 62 and the third electrode 63 on the partition wall 11 is not necessary, and thus the pressure chambers 12 can be densely disposed in the +X direction. Since it is not necessary to draw out a wiring individually from the second electrode 62 and the third electrode 63 on the channel forming substrate 10, a space for drawing out the wiring becomes unnecessary, and thus a size of the recording head 2 can be reduced.

The fourth electrode 80 configures a common electrode common to a plurality of active portions. Here, that the fourth electrode 80 is a common electrode for a plurality of active portions means that the fourth electrode 80 is commonly provided for all the active portions, that is, the plurality of first active portions 311, the plurality of second active portions 312, and the plurality of third active portion 313.

A portion of the piezoelectric actuator 300 facing the pressure chamber 12 in the direction along the Z axis is a flexible portion, and a portion outside the pressure chamber 12 is a non-flexible portion.

As illustrated in FIG. 4, each first electrode 61 is coupled to a first individual lead electrode 91 which is a lead wiring. The first individual lead electrode 91 has one end coupled to one end of the first electrode 61 and the other end drawn out onto the channel forming substrate 10 to be disposed between the two rows of pressure chambers 12 on the Y axis. The first individual lead electrodes 91 are respectively provided independently for the first electrodes 61 such that the first electrodes 61 are not electrically coupled to each other.

As illustrated in FIGS. 3 and 4, the second electrode 62 and the third electrode 63 are coupled to a first common lead electrode 92 which is a lead wiring. The first common lead electrode 92 has one end coupled to one electrode serving as one end of the second electrode 62 and the third electrode 63 disposed in parallel along the X axis, and the other end drawn out to be disposed between two rows of pressure chambers 12 on the Y axis. Since the second electrode 62 and the third electrode 63 are continuously provided, the first common lead electrode 92 may be coupled to either the second electrode 62 or the third electrode 63.

As illustrated in FIG. 3, the fourth electrode 80 is coupled to a second common lead electrode 93 which is a lead wiring. The second common lead electrode 93 has one end coupled to one end of the fourth electrode 80 in the X axis direction and the other end drawn out to be disposed between the two rows of pressure chambers 12 on the Y axis.

A wiring substrate 120 having flexibility is coupled to the ends of the first individual lead electrode 91, the first common lead electrode 92, and the second common lead electrode 93 opposite to the ends coupled to the piezoelectric actuator 300. A drive circuit 121 having switching elements for driving the piezoelectric actuator 300 is mounted on the wiring substrate 120. The end of the wiring substrate 120 opposite to the end coupled to the first individual lead electrode 91, the first common lead electrode 92, and the second common lead electrode 93 is coupled to the control device 5, and a control signal from the control device 5 is supplied to the recording head 2 via the wiring substrate 120.

Figure 7:
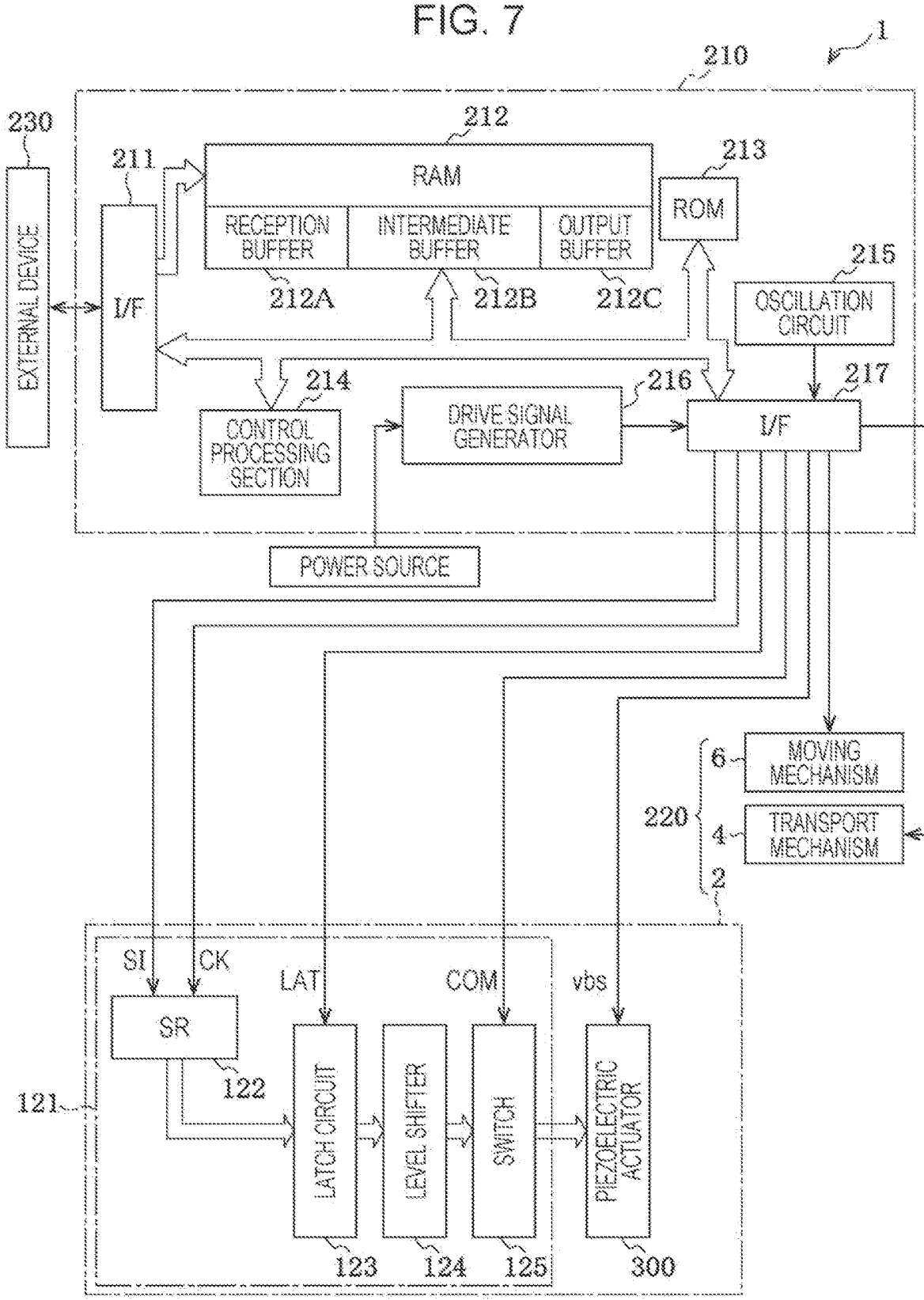
FIG. 7 is a block diagram illustrating an electrical configuration of the ink jet recording apparatus.

Here, the control device 5 of the present embodiment will be described with reference to FIG. 7. FIG. 7 is a block diagram illustrating a control configuration of the ink jet recording apparatus 1.

As illustrated in FIG. 7, the ink jet recording apparatus 1 includes a printer controller 210 which is a control section of the present embodiment and a print engine 220. The printer controller 210 is an element that controls the entire ink jet recording apparatus 1, and is provided in the control device 5 provided in the ink jet recording apparatus 1 in the present embodiment.

The printer controller 210 includes an external interface 211 (hereinafter referred to as an external I/F 211), a RAM 212 that temporarily stores various pieces of data, a ROM 213 that stores control programs and the like, and a control processing section 214 that includes a CPU and the like. The printer controller 210 also includes an oscillation circuit 215 that generates a clock signal, a drive signal generator 216 that generates a drive signal to be supplied to the recording head 2, and an internal interface 217 (hereinafter referred to as internal I/F 217) that transmits dot pattern data (bitmap data) or the like developed based on a drive signal or print data to the print engine 220.

The external I/F 211 receives print data including, for example, character codes, graphic functions, and image data from an external device 230 such as a host computer. A busy signal (BUSY) and an acknowledge signal (ACK) are output to the external device 230 via the external I/F 211.

The RAM 212 functions as a reception buffer 212A, an intermediate buffer 212B, an output buffer 212C, and a work memory (not illustrated). The reception buffer 212A temporarily stores print data received by the external I/F 211, the intermediate buffer 212B stores intermediate code data converted by the control processing section 214, and the output buffer 212C stores dot pattern data. The dot pattern data includes print data obtained by decoding (translating) gradation data.

The ROM 213 also stores font data, graphic functions, and the like in addition to control programs (control routines) for performing various types of data processing.

The control processing section 214 reads the print data in the reception buffer 212A and stores the intermediate code data obtained by converting the print data in the intermediate buffer 212B. The intermediate code data read from the intermediate buffer 212B is analyzed, and the intermediate code data is developed into dot pattern data by referring to font data and graphic functions stored in the ROM 213. The control processing section 214 stores the developed dot pattern data in the output buffer 212C after applying necessary decoration processing.

When dot pattern data for one line is obtained for the recording head 2, this dot pattern data for one line is output to the recording head 2 via the internal I/F 217.

The print engine 220 includes a recording head 2, a transport mechanism 4 and a moving mechanism 6. Since the transport mechanism 4 and the moving mechanism 6 have been described above, duplicate descriptions will be omitted.

The recording head 2 includes a shift register 122, a latch circuit 123, a level shifter 124, and a drive circuit 121 having a switch 125, and the piezoelectric actuator 300. These shift register 122, latch circuit 123, level shifter 124, and switch 125 generate an application pulse from the drive signal generated by the drive signal generator 216. Here, the application pulse is actually applied to the piezoelectric actuator 300.

Figure 8:
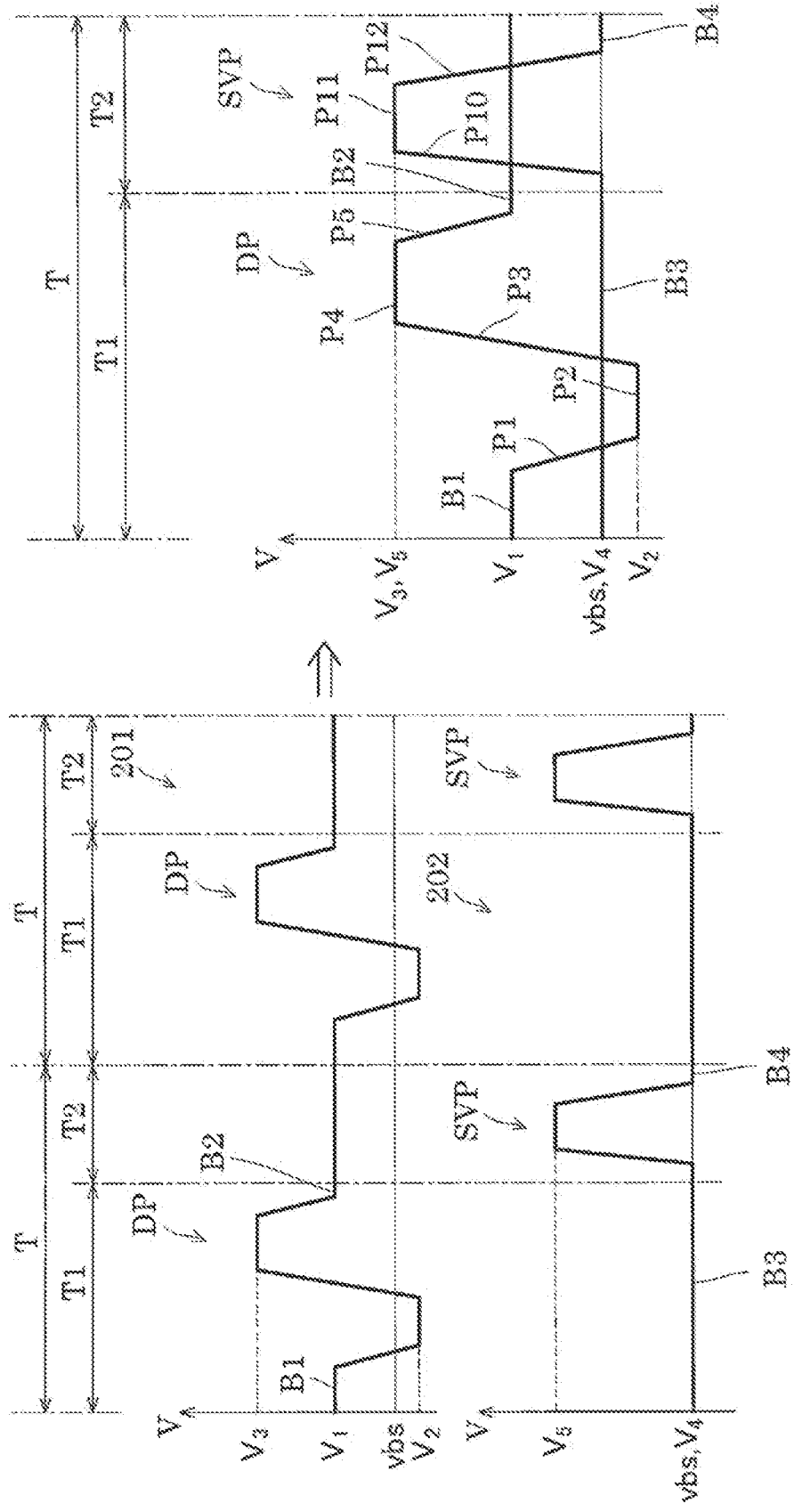
FIG. 8 illustrates drive waveforms of a bias potential, a first drive signal, and a second drive signal.

Here, a drive waveform representing a drive signal generated by the drive signal generator 216 will be described. FIG. 8 illustrates drive waveforms representing a bias potential vbs, a first drive signal 201, and a second drive signal 202. FIGS. 9 to 13 are sectional views taken along the line B-B illustrating a state in which the piezoelectric actuator 300 and the vibration plate 50 are deformed by drive signals.

As illustrated in FIG. 8, the drive signal generator 216 generates the first drive signal 201 and the second drive signal 202 as drive signals. The first drive signal 201 is supplied to the first electrode 61 and the second drive signal 202 is supplied to the second electrode 62 and the third electrode 63.

The first drive signal 201 and the second drive signal 202 are repeatedly generated by the drive signal generator 216 every unit cycle T defined by a clock signal oscillated from the oscillation circuit 215. The unit cycle T is also referred to as an ejection cycle T or a recording cycle T, and corresponds to one pixel of an image or the like printed on a medium S. In the present embodiment, the unit cycle T is divided into two cycles such as a first period T1 and a second period T2.

The first drive signal 201 is a signal having an ejection pulse DP for driving the first active portion 311 of the piezoelectric actuator 300 such that ink droplets are ejected from the nozzle 21 in the first period T1 within one recording cycle T, and is repeatedly generated every recording cycle T. When a dot pattern for one line (one raster) is formed in a recording region of the medium S during printing, the ejection pulse DP of the first drive signal 201 is selectively supplied to the first active portion 311 of the piezoelectric actuator 300 corresponding to each nozzle 21. That is, the control section generates an application pulse from the head control signal and the first drive signal 201 for each first active portion 311 corresponding to the nozzle 21 and supplies the application pulse to the piezoelectric actuator 300.

The application pulse generated from the first drive signal 201 is supplied to the first electrode 61 that is each individual electrode of the first active portion 311. The bias potential vbs is supplied to the fourth electrode 80 that is a common electrode for the plurality of first active portions 311. Therefore, a potential applied to the first electrode 61 by the application pulse has the bias potential vbs applied to the fourth electrode 80 as a reference potential. The bias potential vbs supplied to the fourth electrode 80 corresponds to a "second potential" disclosed in the claims. In the present embodiment, the application pulse supplied to the first electrode 61 is described by using the first drive signal 201. Each potential of the first drive signal 201 is described as a potential supplied to the first electrode 61. However, as described above, the voltage actually applied between the first electrode 61 and the fourth electrode 80 is a potential difference between the potential of the first drive signal 201 supplied to the first electrode 61 and the bias potential vbs supplied to the fourth electrode 80.

The ejection pulse DP includes a first expansion element P1, a first expansion maintaining element P2, a first contraction element P3, a first contraction maintaining element P4, and a first return element P5. The application pulse generated from the first drive signal 201 always supplies a first potential $V_1$ that is an intermediate potential to the first electrode 61 when the ejection pulse DP is not supplied. Therefore, the unit cycle T of the first drive signal 201 includes a first reference element B1 and a second reference element B2 that supply the first potential $V_1$ before and after the ejection pulse DP. That is, in the first drive signal 201, the first reference element B1, the ejection pulse DP, and the second reference element B2 are generated in this order within the unit cycle T. The second reference element B2 is generated in a period including the second period T2.

Figure 9:
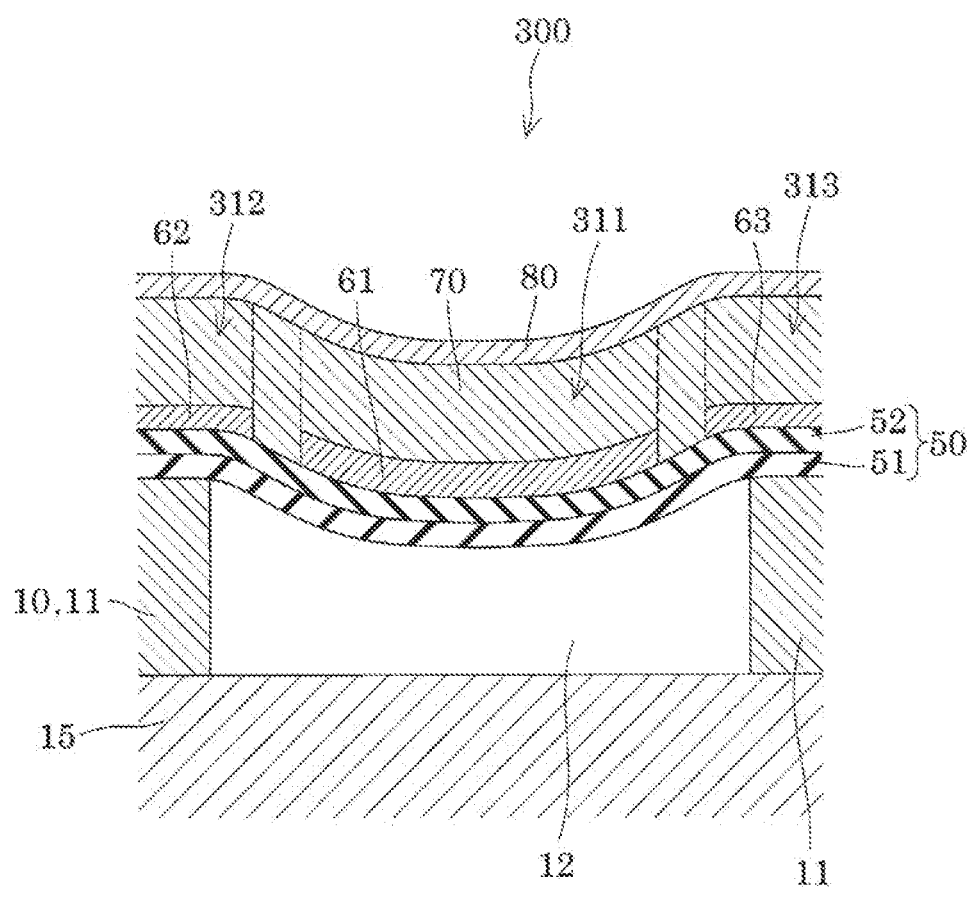
FIG. 9 is a sectional view for describing deformation states of a piezoelectric actuator and a vibration plate.

Such first reference element B1 and second reference element B2 continue to apply the first potential $V_1$ larger than the bias potential vbs to the first electrode 61, and thus a state in which the piezoelectric actuator 300 and the vibration plate 50 are flexurally deformed in the +Z direction on the pressure chamber 12 side is maintained. Consequently, a volume of the pressure chamber 12 is maintained as a first volume that is smaller than a reference volume. In the present embodiment, the fact that the piezoelectric actuator 300 and the vibration plate 50 are deformed in the +Z direction on the pressure chamber 12 side means that, as illustrated in FIG. 9, the surface of the piezoelectric actuator 300 in the +Z direction on the pressure chamber 12 side is deformed into a protruding state in a projection shape. However, when the initial deflection of the piezoelectric actuator 300 is deformed to protrude in a projection shape toward the −Z side that is the opposite side to the pressure chamber 12, a case where the piezoelectric actuator 300 is deformed in a small amount of protrusion in the −Z direction in a state of being deformed to protrude in a projection shape in the −Z direction by the first reference element B1 and the second reference element B2 is also included. In other words, the fact that the piezoelectric actuator 300 and the vibration plate are deformed in the +Z direction toward the pressure chamber 12 side includes a state in which the surface on the −Z side that is the opposite side to the pressure chamber 12 protrudes in a projection shape. In other words, an attitude of the piezoelectric actuator 300 by the first reference element B1 and the second reference element B2 is determined depending on the characteristics of the stacked film including the vibration plate 50 that determine the initial deflection of the piezoelectric actuator 300, that is, the internal stress or a position of a neutral line of each film, and a magnitude of the first potential $V_1$ by the first reference element B1 and the second reference element B2 with respect to a displacement characteristic of the piezoelectric layer 70, that is, an amount of displacement. The reference volume is a volume of the pressure chamber 12 in a state in which no voltage is applied to the piezoelectric actuator 300, that is, a state in which the first active portion 311, the second active portion 312, and the third active portion 313 are not driven.

Figure 10:
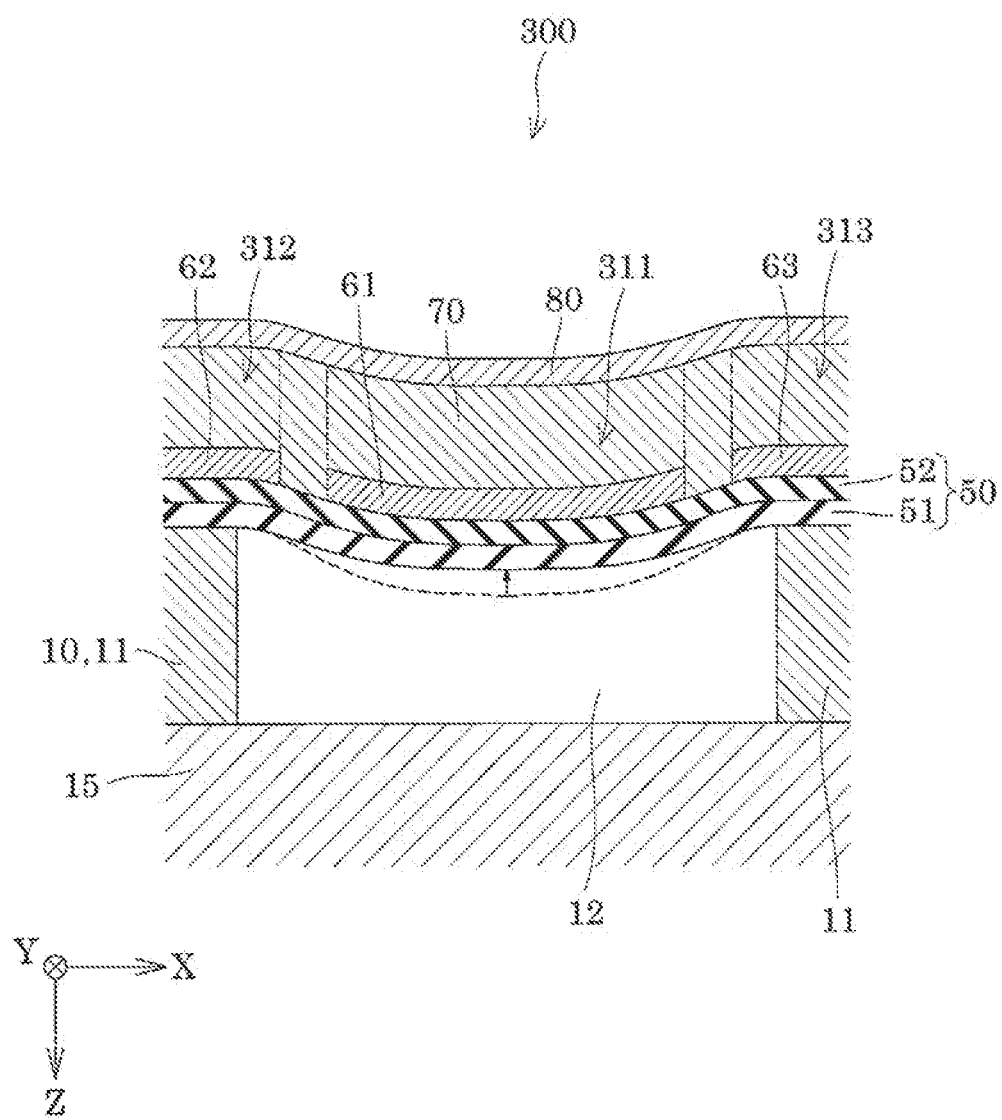
FIG. 10 is a sectional view for describing deformation states of the piezoelectric actuator and the vibration plate.

The first expansion element P1 applies the first potential $V_1$ to a second potential $V_2$ to the first electrode 61 to deform the piezoelectric actuator 300 and vibration plate 50 in the −Z direction, as illustrated in FIG. 10. Consequently, the volume of the pressure chamber 12 is increased from a first volume to a second volume, the meniscus of the ink in the nozzle 21 is drawn toward the pressure chamber 12, and the ink is supplied to the pressure chamber 12 from the manifold 100 side.

The first expansion maintaining element P2 continues to apply the second potential $V_2$ to the first electrode 61 to maintain the volume of the pressure chamber 12 expanded by the first expansion element P1 at the second volume for a certain period of time.

Figure 11:
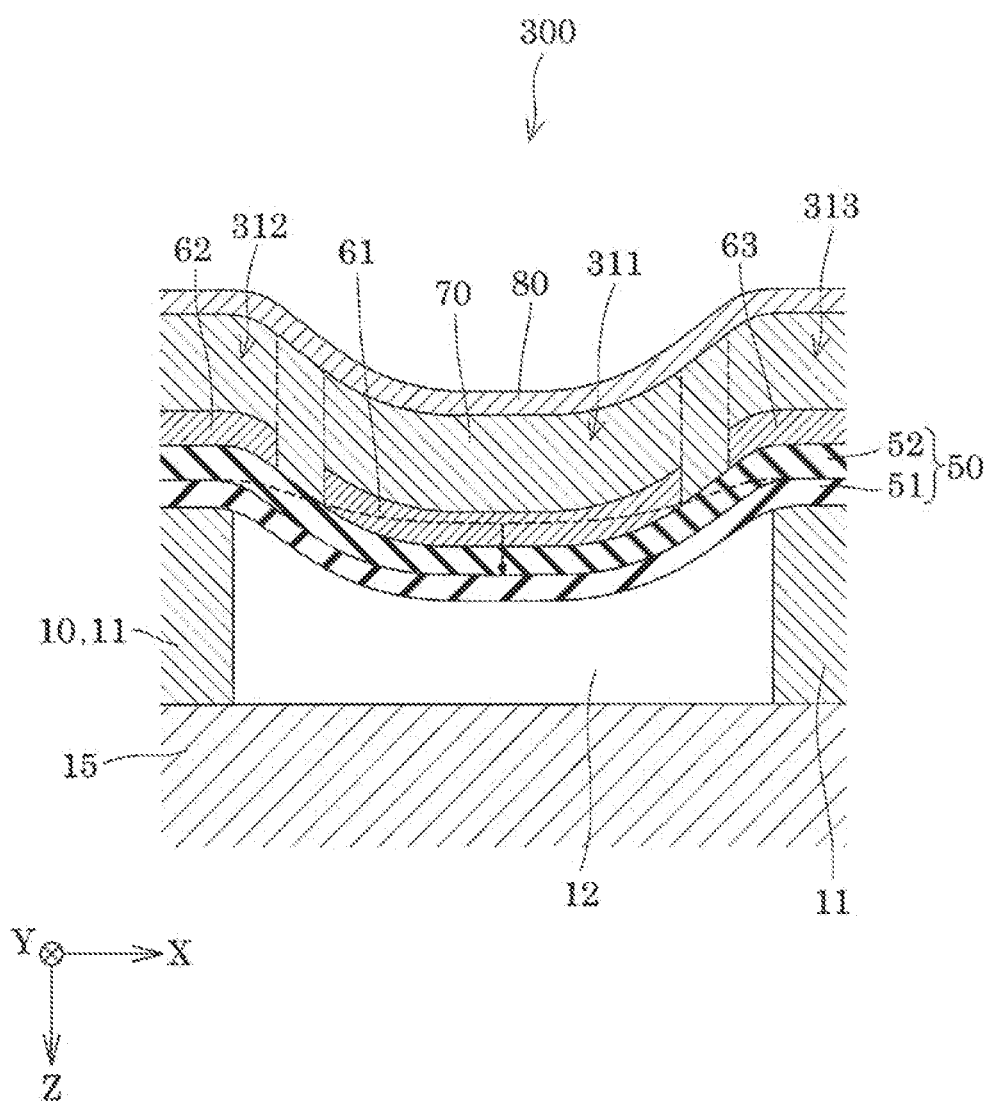
FIG. 11 is a sectional view for describing deformation states of a piezoelectric actuator and a vibration plate.

The first contraction element P3 applies the second potential $V_2$ to a third potential $V_3$ to the first electrode 61 to deform the piezoelectric actuator 300 and the vibration plate 50 in the +Z direction as illustrated in FIG. 11. Consequently, the volume of the pressure chamber 12 is rapidly reduced from the second volume to a third volume, and the ink in the pressure chamber 12 is pressurized to be ejected as ink droplets from the nozzle 21.

The first contraction maintaining element P4 continues to apply the third potential $V_3$ to the first electrode 61 to maintain the volume of the pressure chamber 12 as a third volume for a certain period of time. While the first contraction maintaining element P4 is being supplied, the ink pressure in the pressure chamber 12, which has decreased due to ejection of the ink droplets, attenuates while repeatedly rising and falling due to its natural vibration.

Figure 12:
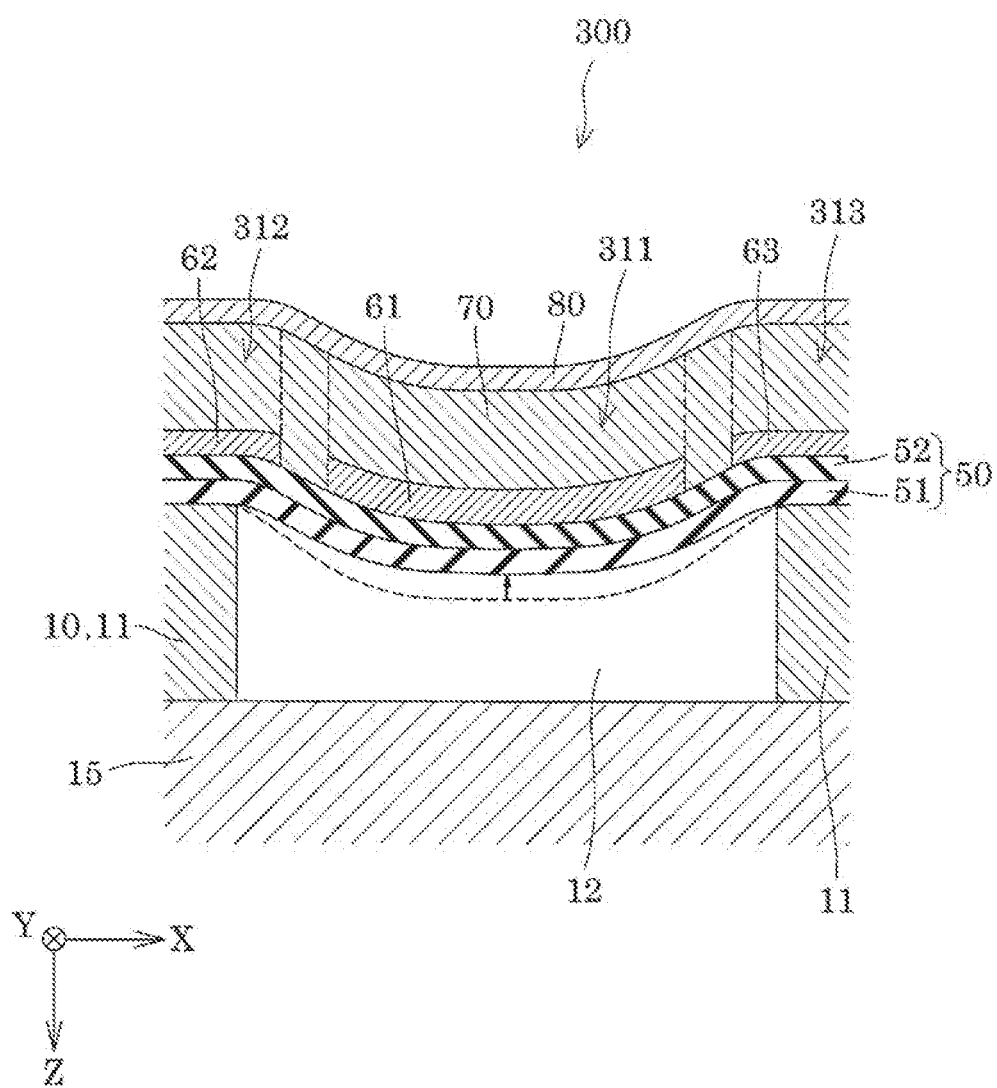
FIG. 12 is a sectional view for describing deformation states of the piezoelectric actuator and the vibration plate.

The first return element P5 applies a fourth potential $V_4$ to the first potential $V_1$ to the first electrode 61 to deform the piezoelectric actuator 300 and vibration plate 50 in the −Z direction as illustrated in FIG. 12. Consequently, the volume of the pressure chamber 12 is increased from the third volume to the first volume and returns.

Thereafter, the second reference element B2 continues to apply the first potential $V_1$ to the first active portion 311, and thus the volume of the pressure chamber 12 is maintained as the first volume contracted from the reference volume.

In such a first drive signal 201, the ejection pulse DP is not supplied to the first electrode 61 of the first active portion 311 of the piezoelectric actuator 300 that does not eject ink droplets, and the first potential $V_1$ of the first reference element B1 and the second reference element B2 is applied as an intermediate potential.

As illustrated in FIG. 8, the second drive signal 202 is repeatedly generated by the drive signal generator 216 every unit cycle T defined by the clock signal oscillated from the oscillation circuit 215. In the present embodiment, the second drive signal is a signal having a damping pulse SVP for driving the second active portion 312 and the third active portion 313 of the piezoelectric actuator 300 such that ink droplets are not ejected from the nozzles 21 in the second period T2 within one recording cycle T, and is repeatedly generated every recording cycle T. When a dot pattern for one line (for one raster) is formed in the recording region of the medium S during printing, the damping pulse SVP of the second drive signal 202 is selectively applied to the second active portion 312 and the third active portion 313 of the piezoelectric actuator 300 corresponding to each nozzle 21. That is, the control section generates application pulses for the second active portion 312 and the third active portion 313 corresponding to each nozzle 21 from the head control signal and the second drive signal 202, and supplies the application pulses to the piezoelectric actuator 300.

The application pulse generated from the second drive signal 202 is supplied to the second electrode 62 and the third electrode 63 that are common electrodes for the plurality of second active portions 312 and the plurality of third active portions 313. The bias potential vbs is supplied to the fourth electrode 80 that is a common electrode for the plurality of second active portions 312 and the plurality of third active portions 313, as described above. Therefore, a potential applied to the second electrode 62 and the third electrode 63 due to the application pulse has the bias potential vbs applied to the fourth electrode 80 as a reference potential. In the present embodiment, the application pulse supplied to the second electrode 62 and the third electrode 63 is described by using the second drive signal 202. Each potential of the second drive signal 202 is described as a potential supplied to the second electrode 62 and the third electrode 63. However, as described above, a voltage actually applied between the second electrode 62 and the third electrode 63 and the fourth electrode 80 is a potential difference between a potential of the second drive signal 202 supplied to the second electrode 62 and the third electrode 63 and the bias potential vbs supplied to the fourth electrode 80.

Here, the damping pulse SVP supplied to the second electrode 62 and the third electrode 63 includes a second expansion element P10, a second expansion maintaining element P11, and a second return element P12. The application pulse generated from the second drive signal 202 always supplies a fourth potential $V_4$ that is an intermediate potential to the second electrode 62 and the third electrode 63 when the damping pulse SVP is not supplied. Therefore, the unit cycle T of the second drive signal 202 includes a third reference element B3 and a fourth reference element B4 that supply the fourth potential $V_4$ before and after the damping pulse SVP. That is, in the second drive signal 202, the third reference element B3, the damping pulse SVP, and the fourth reference element B4 are generated in this order within the unit cycle T. The third reference element B3 is generated in a period including the first period T1.

Such third reference element B3 and fourth reference element B4 supply the fourth potential $V_4$ that is the same as the bias potential vbs to the second electrode 62 and the third electrode 63 such that a state in which the second active portion 312 and the third active portion 313 is not driven is maintained. The third reference element B3 is supplied during the first period T1 during which the piezoelectric actuator 300 is driven by the ejection pulse DP. Therefore, when the first active portion 311 is driven by the ejection pulse DP and ink droplets are ejected from the nozzle 21, the second active portion 312 and the third active portion 313 are not driven, and thus the damping pulse SVP does not influence the ejection of ink droplets using the ejection pulse DP. Since the third reference element B3 does not drive the second active portion 312 and the third active portion 313, after the first period T1 of the third reference element B3, the volume of the pressure chamber 12 is same as after the ejection pulse DP, that is, the first volume by the second reference element B2.

The second expansion element P10, the second expansion maintaining element P11, and the second return element P12 are supplied to the second electrode 62 and the third electrode 63 during the second period T2, that is, while the second reference element B2 of the first drive signal 201 is being supplied.

Figure 13:
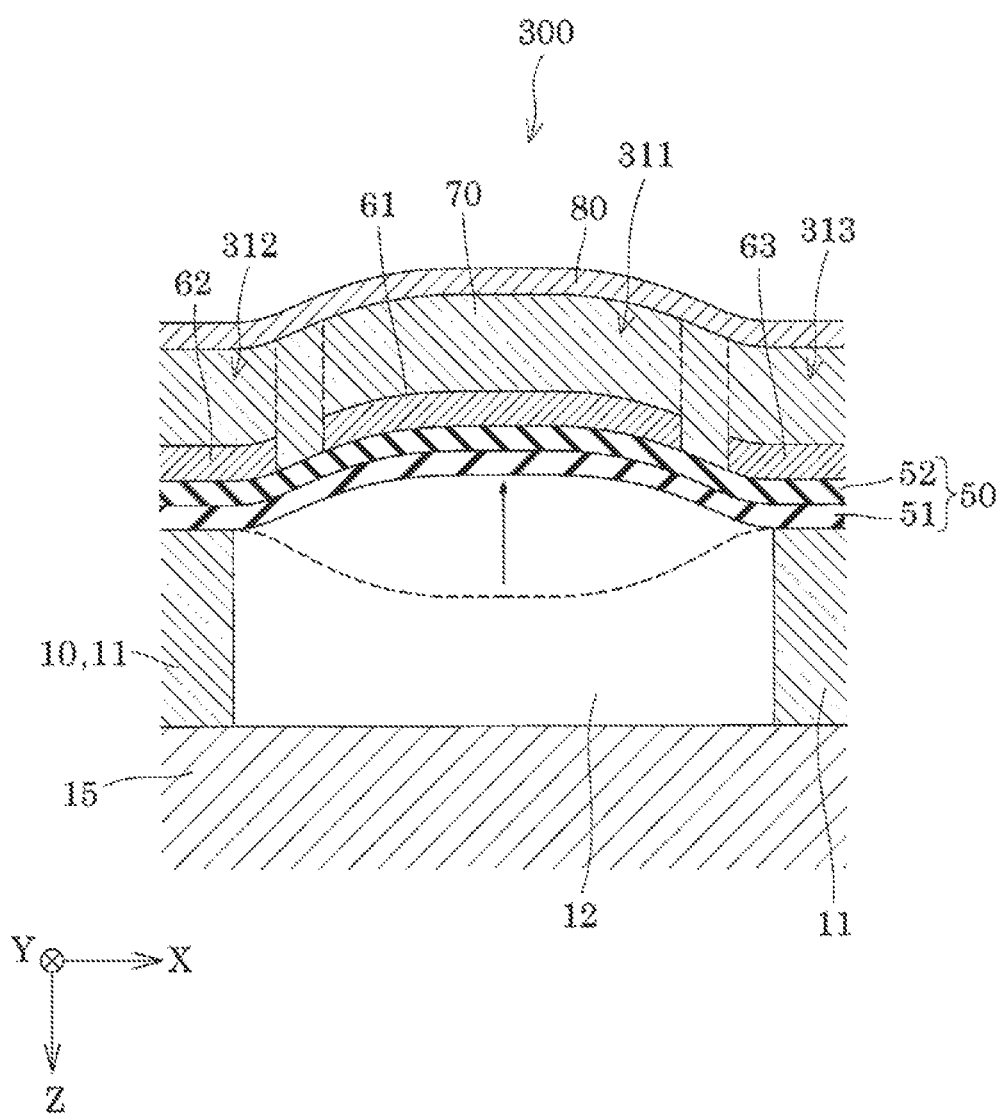
FIG. 13 is a sectional view for describing deformation states of the piezoelectric actuator and the vibration plate.

The second expansion element P10 applies a fifth potential $V_5$ to the second electrode 62 and the third electrode 63 to deform the piezoelectric actuator 300 and vibration plate 50 in the −Z direction that is an opposite side to the pressure chamber 12 as illustrated in FIG. 13. Consequently, the volume of the pressure chamber 12 is increased from the first volume to the fourth volume.

The second active portion 312 and the third active portion 313 are provided to straddle the wall of the pressure chamber 12 from the region overlapping the pressure chamber 12 to the region overlapping the partition wall 11 when viewed in the +Z direction. Therefore, when the second active portion 312 and the third active portion 313 are driven, the piezoelectric actuator 300 and the vibration plate 50 are deformed in the −Z direction on the opposite side to the pressure chamber 12. The fact that the piezoelectric actuator 300 and the vibration plate 50 are deformed in the −Z direction on the opposite side to the pressure chamber 12 means that, in the present embodiment, the surface of the piezoelectric actuator 300 in the −Z direction on the opposite side to the pressure chamber 12 is deformed into a protruding state in a projection shape as illustrated in FIG. 13. However, when the initial deflection of the piezoelectric actuator 300 and the vibration plate 50, that is, in the present embodiment, a state in which the piezoelectric actuator 300 and the vibration plate 50 are deformed by the second reference element B2 is deformed such that the surface in the +Z direction protrudes in a projection shape, a case where the piezoelectric actuator 300 and the vibration plate 50 are deformed in a small amount of protrusion in the +Z direction in a state of being deformed to protrude in a projection shape in the +Z direction by the second expansion element P10. In other words, the fact that the piezoelectric actuator 300 and the vibration plate 50 are deformed in the −Z direction on the opposite side to the pressure chamber 12 also includes a state in which the surface in the +Z direction on the pressure chamber 12 side protrudes in a projection shape. The attitude of the piezoelectric actuator 300 and the vibration plate 50 by the second expansion element P10 is determined depending on an attitude of the piezoelectric actuator 300 at the second reference element B2 and a magnitude of a fifth potential $V_5$, that is, an amount of displacement.

The fifth potential $V_5$ of the second expansion element P10 is preferably the same potential as the first potential $V_1$ of the first reference element B1 or the third potential $V_3$ of the first contraction element P3 of the first drive signal 201. By setting the fifth potential $V_5$ of the second expansion element P10 to the same potential as the first potential $V_1$ of the first reference element B1 of the first drive signal 201 or the third potential $V_3$ of the first contraction element P3, a circuit of the drive signal generator 216 can be simplified compared with a case of generating different potentials.

The second expansion maintaining element P11 continues to apply the fifth potential $V_5$ to the second electrode 62 and the third electrode 63 to maintain the volume of the pressure chamber 12 expanded by the second expansion element P10 as the fourth volume for a certain period of time.

The second return element P12 applies the fifth potential $V_5$ to fourth potential $V_4$ to the second electrode 62 and the third electrode 63 to deform the piezoelectric actuator 300 and vibration plate 50 in the +Z direction. Consequently, the volume of the pressure chamber 12 is reduced from the fourth volume and returned to the first volume.

By inserting the second expansion element P10, the second expansion maintaining element P11, and the second return element P12 of the damping pulse SVP after the ejection pulse DP as described above, residual vibration of the ink in the pressure chamber 12 after the ink is ejected from the nozzle 21 can be converged in a short time. In other words, when the second active portion 312 and the third active portion 313 of the piezoelectric actuator 300 are driven by the damping pulse SVP, the second active portion 312 and the third active portion 313 contract along the Z axis as illustrated in FIG. 13, and the piezoelectric actuator 300 and the vibration plate 50 are deformed to protrude in a projection shape in the −Z direction on the opposite side to the pressure chamber 12. In this case, a tensile stress is applied to the portion including the first active portion 311 interposed between the second active portion 312 and the third active portion 313, and thus the apparent Young's modulus increases. Since the apparent Young's modulus of the piezoelectric actuator 300 increases, the residual vibration of the ink in the pressure chamber 12 after the ink is ejected can be converged in a short time.

The second active portion 312 and the third active portion 313 of the piezoelectric actuator 300 are driven by the damping pulse SVP such that the piezoelectric actuator 300 is deformed to protrude in a projection shape in the −Z direction on the opposite side to the pressure chamber 12, and thus the residual strain of the piezoelectric layer 70 can be eliminated. In other words, by repeatedly driving the piezoelectric actuator 300 with the ejection pulse DP, the piezoelectric actuator 300 is repeatedly deformed to protrude in a projection shape only in one direction, in the present embodiment, in the +Z direction on the pressure chamber 12 side. Thus, the residual strain is generated in the piezoelectric layer 70, and the original state cannot be restored even when the piezoelectric actuator 300 is not driven. When the residual strain of the piezoelectric actuator 300 is large, an amount of displacement of the piezoelectric actuator 300 is reduced when the piezoelectric actuator 300 is driven, and ejection characteristics such as a weight and a flight speed of ink droplets deteriorate. In the present embodiment, by driving the piezoelectric actuator 300 with the damping pulse SVP, the piezoelectric actuator 300 can be deformed to protrude in a projection shape in a direction different from the ejection pulse DP, that is, in the −Z direction. Therefore, it is possible to eliminate the residual strain of the piezoelectric layer 70 and curb the decrease in an amount of displacement of the piezoelectric actuator 300 even when the piezoelectric actuator 300 is repeatedly driven. Therefore, it is possible to curb deterioration in the ejection characteristics of the ink droplets ejected from the nozzles 21.

Since the second electrode 62 and the third electrode 63 are common electrodes for the plurality of second active portions 312 and the plurality of third active portions 313, the second active portion 312 and the third active portion 313 corresponding to the pressure chambers 12 communicating with the nozzles 21 that do not eject ink droplets are simultaneously driven by the damping pulse SVP. However, since the piezoelectric actuator 300 is driven by the damping pulse SVP not to eject ink droplets, there is no particular problem even when the second active portion 312 and the third active portion 313 corresponding to the nozzles 21 that do not eject ink droplets are driven by the damping pulse SVP. Since the damping pulse SVP also functions as a so-called micro-vibration pulse, by driving the second active portion 312 and the third active portion 313 corresponding to the nozzles 21 that do not eject ink droplets with the damping pulse SVP, the ink in the vicinity of the nozzle 21 can be slightly vibrated. Therefore, it is possible to curb sedimentation of components contained in the ink in the vicinity of the pressure chamber 12 and the nozzle 21 or to curb accumulation of thickened ink, and thus to curb ejection failure of ink droplets due to the thickened ink. That is, it is preferable to supply the damping pulse SVP to the second electrode 62 and the third electrode 63 corresponding to the pressure chamber 12 communicating with the nozzle 21 to which the ejection pulse is not supplied.

In the configuration described above, the bias potential vbs is supplied to the fourth electrode 80, and the fifth potential $V_5$ that is the same as the bias potential vbs is supplied to the second electrode 62 and the third electrode 63 by the third reference element B3 and the fourth reference element B4. However, it is not particularly limited to this. For example, the bias potential vbs may not be supplied to the fourth electrode 80, but may be ground (GND), and the fifth potential $V_5$ of the third reference element B3 and the fourth reference element B4 may be ground (GND).

Figure 14:
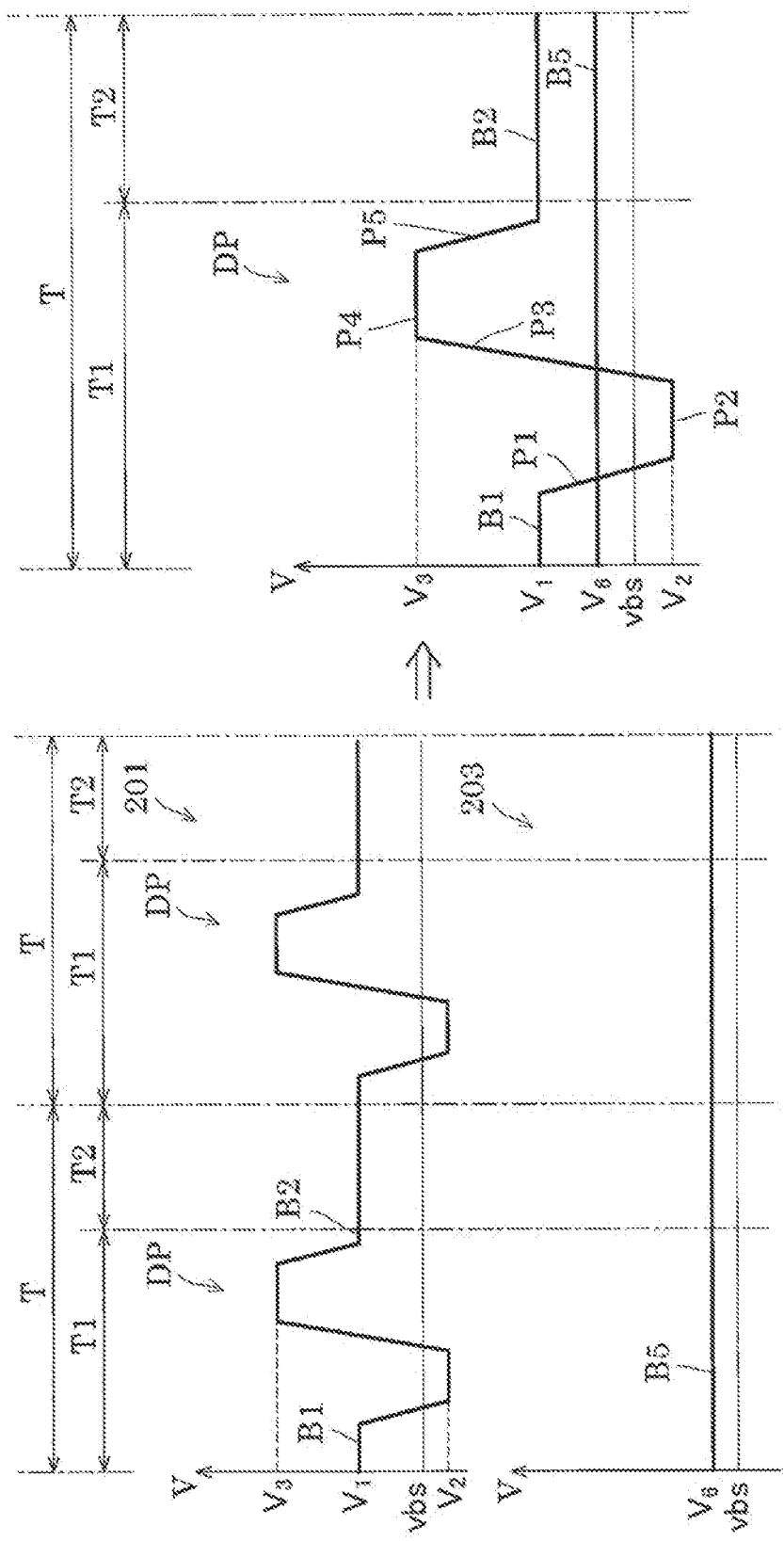
FIG. 14 illustrates drive waveforms of the bias potential, the first drive signal, and a third drive signal.

Here, a modification example of the control section of the present embodiment will be described with reference to FIG. 14. FIG. 14 illustrates drive waveforms representing the bias potential vbs, the first drive signal 201, and the third drive signal 203.

As illustrated in FIG. 14, the third drive signal 203 is supplied to the second electrode 62 and the third electrode 63. The damping pulse SVP is not provided in the third drive signal 203. The third drive signal 203 always supplies a sixth potential $V_6$ that is an intermediate potential to the second electrode 62 and the third electrode 63. In other words, it can be said that the third drive signal 203 includes a fifth reference element B5 that supplies the sixth potential $V_6$.

Here, the sixth potential $V_6$ supplied to the second electrode 62 and the third electrode 63 is a potential different from supplied to the fourth electrode 80, that is, the bias potential vbs in the present embodiment. The sixth potential $V_6$ in the present embodiment is preferably higher than the bias potential vbs. That is, it is preferable to satisfy the relationship of the sixth potential $V_6$>the bias potential vbs. By setting the sixth potential $V_6$ to a potential higher than the bias potential vbs as described above, it is possible to suppress application of an electric field reverse to the ejection pulse DP to the piezoelectric actuator 300. Therefore, it is possible to curb the piezoelectric actuator 300 from being cracked or destroyed. This sixth potential $V_6$ corresponds to a "first potential" in Embodiment 1. That is, in the configuration illustrated in FIG. 8, the fourth potential $V_4$ is the same potential as the bias potential vbs supplied to the fourth electrode 80, and in the configuration illustrated in FIG. 14, the sixth potential $V_6$ is higher than the bias potential vbs that is a "second potential". As a condition for satisfying both of the configurations in FIGS. 8 and 14, a potential supplied to the second electrode 62 and the third electrode 63 the bias potential vbs.

By constantly supplying the sixth potential $V_6$ to the second electrode 62 and the third electrode 63 while the ejection pulse DP is being supplied to the first electrode 61, it is possible to eliminate an increase in residual strain that occurs when the piezoelectric actuator 300 is repeatedly driven by the ejection pulse DP even when the damping pulse SVP is not supplied and to curb a decrease in displacement due to repeated driving. By maintaining a state in which the sixth potential $V_6$ is supplied to the second electrode 62 and the third electrode 63, a natural vibration cycle Tc of the pressure chamber 12 can be adjusted. Here, the magnitude of the sixth potential $V_6$ supplied to the second electrode 62 and the third electrode 63 and the magnitude of the natural vibration cycle Tc of the pressure chamber 12 have an inversely proportional relationship. Therefore, by supplying the sixth potential $V_6$ to the second electrode 62 and the third electrode 63, the natural vibration cycle Tc of the pressure chamber 12 can be reduced, and ink droplets can be continuously ejected at a high speed. In a head unit in which a plurality of recording heads 2 are unitized or in the ink jet recording apparatus 1 having a plurality of recording heads 2, even when there is a variation in the natural vibration cycle Tc among the plurality of recording heads 2, by changing the sixth potential $V_6$ for each recording head 2, the variation in the natural vibration cycle Tc among the plurality of recording heads 2 can be reduced. Therefore, it is possible to curb variations in ejection characteristics such as ink weight and ejection speed of ink droplets ejected from a plurality of recording heads 2.

Figure 15:
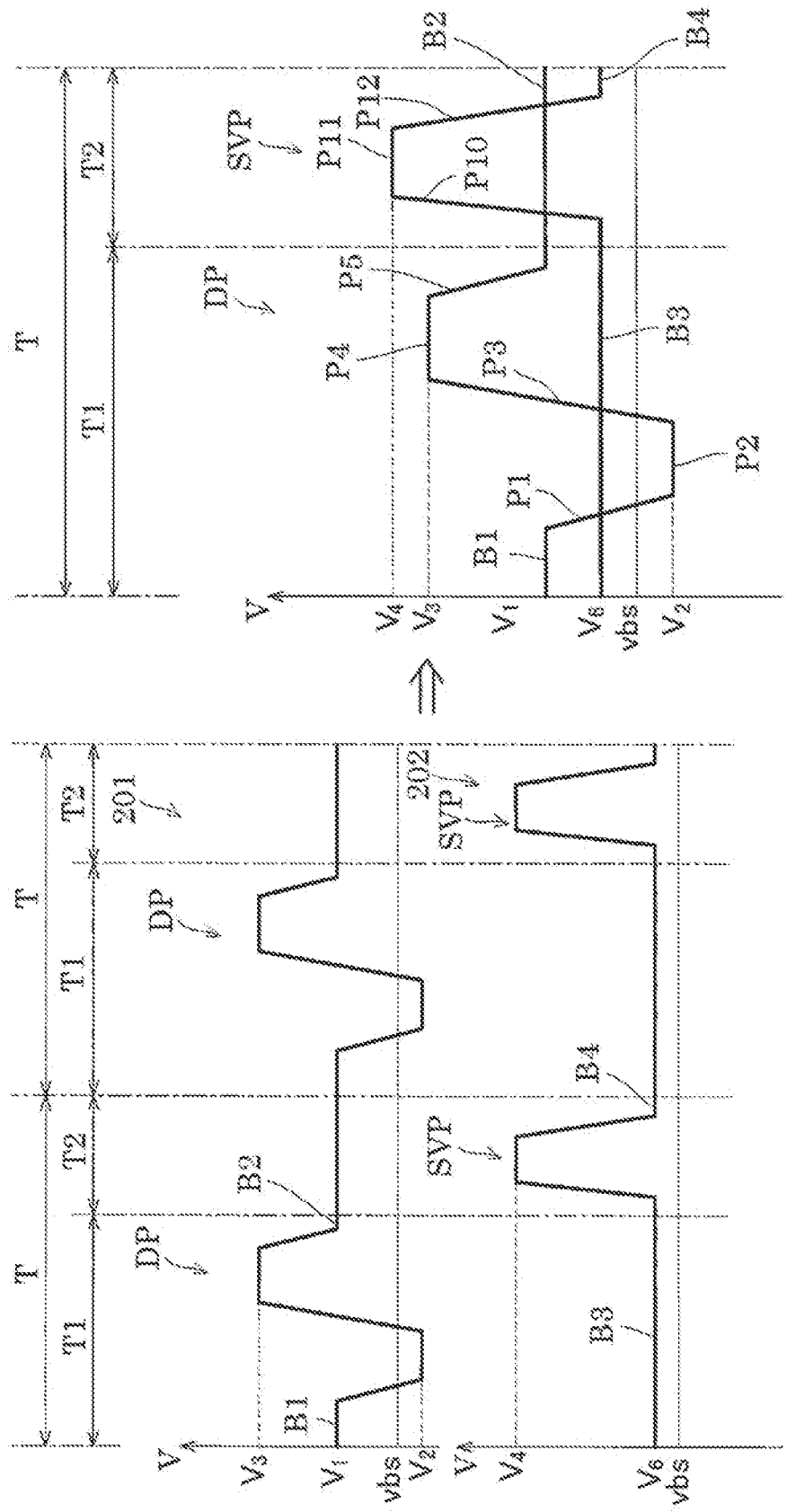
FIG. 15 illustrates drive waveforms of modification examples of the bias potential, the first drive signal, and the second drive signal.

The configuration in which the sixth potential $V_6$ is constantly supplied to the second electrode 62 and the third electrode 63 while the ejection pulse DP is being supplied to the first electrode 61 may be applied to the second drive signal 202 having the damping pulse SVP. Here, FIG. 15 illustrates a configuration in which the sixth potential $V_6$ is applied to the second drive signal 202. FIG. 15 illustrates drive waveforms showing modification examples of the bias potential vbs, the first drive signal 201, and the second drive signal 202.

As illustrated in FIG. 15, the second drive signal 202 always supplies the sixth potential $V_6$ that is an intermediate potential to the second electrode 62 and the third electrode 63 when the damping pulse SVP is not supplied. That is, the second drive signal 202 has the third reference element B3, the damping pulse SVP, and the fourth reference element B4, and supplies the sixth potential $V_6$ to the second electrode 62 and the third electrode 63 in the third reference element B3 and the fourth reference element B4.

The third reference element B3 and the fourth reference element B4 supply the sixth potential $V_6$ higher than the bias potential vbs to the second electrode 62 and the third electrode 63. In other words, the third reference element B3 supplies the sixth potential $V_6$ to the second electrode 62 and the third electrode 63 during the first period T1 during which the ejection pulse DP is supplied to the first electrode 61. Therefore, the natural vibration cycle Tc of the pressure chamber 12 can be reduced while the ejection pulse DP is being supplied, and the natural vibration cycle Tc can be adjusted. Since the second drive signal 202 has the damping pulse SVP, the same effects as those described above due to the damping pulse SVP can be achieved.

In the example illustrated in FIG. 15, the waveform of the damping pulse SVP is the same as that in FIG. 8 such that the fourth potential $V_4$ is a potential higher than the third potential $V_3$, but the present disclosure is not particularly limited to this, and the fourth potential $V_4$ may be the same potential as the third potential $V_3$. Consequently, it is possible to simplify a circuit of the drive signal generator 216 compared with a case where different potentials such as the fourth potential $V_4$ and the third potential $V_3$ are generated.

As described above, the recording head 2 that is an example of a piezoelectric device of the present disclosure includes the channel forming substrate 10 that is a substrate on which the pressure chambers 12 which are recesses communicating with the nozzles 21 for ejecting a liquid are arranged in the +X direction that is the first direction, the vibration plate 50, and the piezoelectric actuator 300. The piezoelectric actuator 300 has the first electrode 61, the second electrode 62, the third electrode 63, and the fourth electrode 80 in this order. The piezoelectric actuator 300 has the piezoelectric layers 70 between the first electrode 61 and the fourth electrode 80, between the second electrode 62 and the fourth electrode 80, and between the third electrode 63 and the fourth electrode 80. The plurality of first active portions 311, the plurality of second active portions 312 and the plurality of third active portions 313, which are active portions in which the piezoelectric layer 70 is interposed between the first electrode 61, the second electrode 62, and the third electrode 63, and the fourth electrode 80, are provided. The second electrode 62 and the third electrode 63 are provided at both ends of the pressure chamber 12 in the +X direction from the edge of the region facing the pressure chamber 12 to the outside of the pressure chamber 12 when viewed in the −Z direction that is a stacking direction. The first electrode 61 is formed between the second electrode 62 and the third electrode 63 in the +X direction, and the fourth electrode 80 configures a common electrode for the plurality of first active portions 311, second active portions 312, and third active portions 313.

As described above, the first electrode 61 that drives the piezoelectric actuator 300 to be deformed toward the pressure chamber 12 side, and the second electrode 62 and the third electrode 63 that drive the piezoelectric actuator 300 to be deformed toward the opposite side to the pressure chamber 12 are provided. Therefore, compared with a case where the piezoelectric actuator 300 is deformed only in one direction along the Z axis, the residual strain in the piezoelectric layer 70 is less likely to occur even when the piezoelectric actuator 300 is repeatedly driven. Therefore, even when the piezoelectric actuator 300 is repeatedly driven, it is possible to curb a decrease in an amount of displacement. Therefore, even when the piezoelectric actuator 300 is repeatedly driven, it is possible to prevent deterioration in the ejection characteristics such as the ink weight of ink droplets ejected from the nozzles 21 and to continue high-quality printing. An amount of displacement can be improved compared with a case where the piezoelectric actuator 300 is driven only in one direction along the Z axis. Therefore, the weight of ink droplets ejected from the nozzles 21 can be increased.

The recording head 2 that is an example of a piezoelectric device of the present disclosure includes the channel forming substrate 10 that is a substrate on which the pressure chambers 12 which are recesses communicating with the nozzles 21 for ejecting a liquid are arranged in the +X direction that is the first direction, the vibration plate 50, and the piezoelectric actuator 300. The piezoelectric actuator 300 has the first electrode 61, the second electrode 62, the third electrode 63, and the fourth electrode 80 in this order. The piezoelectric actuator 300 has the piezoelectric layers 70 between the first electrode 61 and the fourth electrode 80, between the second electrode 62 and the fourth electrode 80, and between the third electrode 63 and the fourth electrode 80. The plurality of first active portions 311, the plurality of second active portions 312 and the plurality of third active portions 313, which are active portions in which the piezoelectric layer 70 is interposed between the first electrode 61, the second electrode 62, and the third electrode 63, and the fourth electrode 80, are provided. The second electrode 62 and the third electrode 63 are provided at both ends of the pressure chamber 12 in the +X direction from the edge of the region facing the pressure chamber 12 to the outside of the pressure chamber 12 when viewed in the −Z direction that is a stacking direction. The first electrode 61 is formed between the second electrode 62 and the third electrode 63 in the +X direction, and the second electrode 62, the third electrode 63, and the fourth electrode 80 configure common electrodes for the plurality of first active portions 311, second active portions 312, and third active portions 313, and the first electrode 61 configures an individual electrode provided independently for each of the first active portions 311.

As described above, the first electrode 61 that drives the piezoelectric actuator 300 to be deformed toward the pressure chamber 12 side, and the second electrode 62 and the third electrode 63 that drive the piezoelectric actuator 300 to be deformed toward the opposite side to the pressure chamber 12 are provided. Therefore, the residual strain of the piezoelectric layer 70 when the piezoelectric actuator 300 is repeatedly driven can be reduced, and a decrease in displacement due to repeated driving can be curbed. Therefore, when the piezoelectric actuator 300 is repeatedly driven, it is possible to curb the deterioration in the ejection characteristics such as a weight and a flight speed of ink droplets ejected from the nozzles 21.

The second electrode 62 configures a common electrode for the plurality of second active portions 312, and the third electrode 63 configures a common electrode for the plurality of third active portions 313. Therefore, it is possible to reduce the number of second common lead electrodes 93, which are lead wirings drawn out from the second electrode 62 and the third electrode 63. Therefore, it is possible to reduce a size of the recording head 2 by reducing a space in which a wiring is routed and reducing an area of the channel forming substrate 10 in the XY plane.

The piezoelectric layer 70 and the fourth electrode 80 do not need to be patterned in accordance with the first electrode 61. That is, the piezoelectric layer 70 and the fourth electrode 80 can be formed with substantially uniform thickness over the first electrode 61, the second electrode 62 and the third electrode 63. Therefore, it is possible to prevent the piezoelectric layer 70 from being degraded due to patterning, and it is possible to prevent the piezoelectric characteristics from partially deteriorating.

In the recording head 2 of the present embodiment, a gap between the first electrode 61 and the fourth electrode 80 and a gap between the second electrode 62 and the third electrode 63 and the fourth electrode 80 in the −Z direction that is a stacking direction are preferably the same. According to this, a structure can be simplified, the number of manufacturing steps can be reduced, and cost can be reduced. Since the gaps are the same, variations in residual strain in the piezoelectric layer 70 are less likely to occur that is preferable.

In the recording head 2 of the present embodiment, it is preferable that the piezoelectric layer 70 is not provided on the pressure chamber 12 side that is a recess of the first electrode 61. According to this, the piezoelectric layer 70 that increases the dielectric loss tangent tan δ is not present on the pressure chamber 12 side of the first electrode 61, and heat generation due to dielectric loss is less likely to occur when the piezoelectric actuator 300 is driven, and thus the temperature of the ink in the pressure chamber 12 is less likely to increase.

In the recording head 2 of the present embodiment, it is preferable that the first electrode 61, and the second electrode 62 and the third electrode 63 do not overlap each other in the +X direction that is the first direction when viewed in a stacking direction. The first electrode 61, and the second electrode 62 and the third electrode 63 can be prevented from being electrically coupled. The first electrode 61, and the second electrode 62 and the third electrode 63 do not overlap in the +X direction, and can thus be formed at the same position in the −Z direction. Therefore, the first electrode 61, and the second electrode 62, and the third electrode 63 can be simultaneously formed at the same layer, and the number of manufacturing steps can be reduced, and thus cost can be reduced.

In the recording head 2 of the present embodiment, the fourth electrode 80 preferably covers the pressure chamber 12 that is a recess in the +X direction that is the first direction when viewed in the −Z direction that is a stacking direction. Since the first electrode 61 and the piezoelectric layer 70 provided in the −Z direction of the pressure chamber 12 are covered with the fourth electrode 80, the piezoelectric layer 70 is prevented from being damaged by moisture, and thus shortening of the life of the piezoelectric layer 70 can be curbed.

In the recording head 2 of the present embodiment, it is preferable that the pressure chamber 12 that is a recess has, as a longitudinal direction, the +Y direction that is the second direction perpendicular to the +X direction that is the first direction, when viewed in the −Z direction that is a stacking direction. According to this, the pressure chambers 12 can be densely disposed in the +X direction while ensuring the volume of the pressure chambers 12.

In the recording head 2 of the present embodiment, the vibration plate 50 preferably contains zirconium oxide. When a material containing lead is used for the piezoelectric layer 70, it is possible to suppress diffusion of lead into the vibration plate 50.

The ink jet recording apparatus 1 that is an example of a liquid ejecting apparatus of the present disclosure includes the recording head 2 described above. It is possible to implement a highly reliable ink jet recording apparatus 1 in which printing quality does not easily deteriorate even after repeated printing.

The ink jet recording apparatus 1 that is an example of the liquid ejecting apparatus of the present embodiment includes the channel forming substrate 10 that is a substrate on which the pressure chambers 12 which are recesses communicating with the nozzles 21 for ejecting a liquid are arranged in the +X direction that is the first direction, the vibration plate 50, the piezoelectric actuator 300, and the control section that drives the piezoelectric actuator 300. The piezoelectric actuator 300 has the first electrode 61, the second electrode 62, the third electrode 63, and the fourth electrode 80 in this order. The piezoelectric actuator 300 has the piezoelectric layers 70 between the first electrode 61 and the fourth electrode 80, between the second electrode 62 and the fourth electrode 80, and between the third electrode 63 and the fourth electrode 80. The plurality of first active portions 311, the plurality of second active portions 312 and the plurality of third active portions 313, which are active portions in which the piezoelectric layer 70 is interposed between the first electrode 61, the second electrode 62, and the third electrode 63, and the fourth electrode 80, are provided. The second electrode 62 and the third electrode 63 are provided at both ends of the pressure chamber 12 in the +X direction from the edge of the region facing the pressure chamber 12 to the outside of the pressure chamber 12 when viewed in the −Z direction that is a stacking direction. The first electrode 61 is formed between the second electrode 62 and the third electrode 63 in the +X direction, and the second electrode 62, the third electrode 63, and the fourth electrode 80 configure common electrodes for the plurality of first active portions 311, second active portions 312, and third active portions 313, and the first electrode 61 configures an individual electrode provided independently for each of the first active portions 311. The control section supplies the first electrode 61 with the ejection pulse DP for ejecting a liquid from the nozzle 21. The control section supplies the second electrode 62 and the third electrode 63 with the damping pulse SVP for driving the piezoelectric actuator 300 such that the liquid is not ejected from the nozzle 21 at least after the ejection pulse DP.

As described above, the control section supplies the ejection pulse DP to the first electrode 61 to deform the piezoelectric actuator 300 toward the pressure chamber 12 when ink droplets are ejected. By supplying the damping pulse SVP after the ejection pulse DP, the piezoelectric actuator 300 is deformed toward the opposite side to the pressure chamber 12. Therefore, even when ink droplets are repeatedly ejected with the ejection pulse DP, by supplying the damping pulse SVP, an increase in the residual strain of the piezoelectric layer 70 can be curbed, and a reduction in an amount of displacement due to repeated driving of the piezoelectric actuator 300 can be curbed. By inserting the damping pulse SVP after the ejection pulse DP, the apparent Young's modulus of the piezoelectric layer 70 can be increased, and the residual vibration after the ejection pulse DP can be converged in a short time. Therefore, ejection of ink droplets can be repeated in a short time, and high-speed continuous ejection can be realized. By supplying the damping pulse SVP to the second electrode 62 and the third electrode 63 corresponding to the pressure chamber 12 that does not eject ink droplets, the ink in the vicinity of the pressure chambers 12 and the nozzles 21 is slightly vibrated. Therefore, it is possible to curb sedimentation of components contained in the ink or to curb accumulation of thickened ink, and thus to curb ejection failure of ink droplets due to the thickened ink.

In the ink jet recording apparatus 1 of the present embodiment, the control section preferably deforms the vibration plate 50 to project on the opposite side to the pressure chamber 12 with the damping pulse SVP. As described above, the vibration plate 50 is deformed to project in the −Z direction on the opposite side to the pressure chamber 12 with the damping pulse SVP such that it is possible to reduce the residual strain of the piezoelectric layer 70 due to repeated driving using the ejection pulse DP.

In the ink jet recording apparatus 1 of the present embodiment, the control section preferably deforms the vibration plate 50 to project toward the pressure chamber 12 side with the ejection pulse DP. According to this, the driving efficiency of the piezoelectric actuator 300 becomes favorable, and the ejection characteristics of ink droplets can be improved.

In the ink jet recording apparatus 1 of the present embodiment, it is preferable that the control section supplies the first drive signal 201 including the ejection pulse DP to the first electrode 61, and supplies the sixth potential $V_6$ that is a first potential different from a potential supplied to the fourth electrode 80 to the second electrode 62 and the third electrode 63 while the first drive signal 201 is being supplied to the first electrode 61. According to this, while the first drive signal 201 is being supplied to the first electrode 61, by maintaining the state in which the sixth potential $V_6$ is supplied to the second electrode 62 and the third electrode 63, the natural vibration cycle Tc of the pressure chamber 12 can be adjusted. Therefore, it is possible to reduce the natural vibration cycle Tc of the pressure chamber 12 and continuously eject ink droplets at a high speed. In a head unit in which a plurality of recording heads 2 are unitized or in the ink jet recording apparatus 1 having a plurality of recording heads 2, even when there is a variation in the natural vibration cycle Tc among the plurality of recording heads 2, by changing the sixth potential $V_6$ for each recording head 2, the variation in the natural vibration cycle Tc among the plurality of recording heads 2 can be reduced. Therefore, it is possible to curb variations in ejection characteristics such as ink weight and ejection speed of ink droplets ejected from a plurality of recording heads 2. In the example described above, the bias potential vbs is supplied to the fourth electrode 80, but the present disclosure is not particularly limited to this, and the fourth electrode 80 may be ground (GND).

The ink jet recording apparatus 1 that is an example of the liquid ejecting apparatus of the present embodiment includes the channel forming substrate 10 that is a substrate on which the pressure chambers 12 which are recesses communicating with the nozzles 21 for ejecting a liquid are arranged in the +X direction that is the first direction, the vibration plate 50, the piezoelectric actuator 300, and the control section that drives the piezoelectric actuator 300. The piezoelectric actuator 300 has the first electrode 61, the second electrode 62, the third electrode 63, and the fourth electrode 80 in this order. The piezoelectric actuator 300 has the piezoelectric layers 70 between the first electrode 61 and the fourth electrode 80, between the second electrode 62 and the fourth electrode 80, and between the third electrode 63 and the fourth electrode 80. The plurality of first active portions 311, the plurality of second active portions 312 and the plurality of third active portions 313, which are active portions in which the piezoelectric layer 70 is interposed between the first electrode 61, the second electrode 62, and the third electrode 63, and the fourth electrode 80, are provided. The second electrode 62 and the third electrode 63 are provided at both ends of the pressure chamber 12 in the +X direction from the edge of the region facing the pressure chamber 12 to the outside of the pressure chamber 12 when viewed in the −Z direction that is a stacking direction. The first electrode 61 is formed between the second electrode 62 and the third electrode 63 in the +X direction, and the second electrode 62, the third electrode 63, and the fourth electrode 80 configure common electrodes for the plurality of first active portions 311, second active portions 312, and third active portions 313, and the first electrode 61 configures an individual electrode provided independently for each of the first active portions 311. The control section supplies the first drive signal 201 including the ejection pulse DP for ejecting a liquid from the nozzle 21 to the first electrode 61. The control section supplies the sixth potential $V_6$ that is a first potential different from the potential supplied to the fourth electrode 80 to the second electrode 62 and the third electrode 63 while the first drive signal 201 is being supplied to the first electrode 61.

According to this, while the first drive signal 201 is being supplied to the first electrode 61, by maintaining the state in which the sixth potential $V_6$ is supplied to the second electrode 62 and the third electrode 63, the natural vibration cycle Tc of the pressure chamber 12 can be adjusted. Therefore, it is possible to reduce the natural vibration cycle Tc of the pressure chamber 12 and continuously eject ink droplets at a high speed. In a head unit in which a plurality of recording heads 2 are unitized or in the ink jet recording apparatus 1 having a plurality of recording heads 2, even when there is a variation in the natural vibration cycle Tc among the plurality of recording heads 2, by changing the sixth potential $V_6$ for each recording head 2, the variation in the natural vibration cycle Tc among the plurality of recording heads 2 can be reduced. Therefore, it is possible to curb variations in ejection characteristics such as ink weight and ejection speed of ink droplets ejected from a plurality of recording heads 2. In the example described above, the bias potential vbs is supplied to the fourth electrode 80, but the present disclosure is not particularly limited to this, and the fourth electrode 80 may be ground (GND).

In the ink jet recording apparatus 1 of the present embodiment, it is preferable that while the first drive signal 201 is being supplied, the control section supplies the bias potential vbs that is a second potential to the fourth electrode 80, and the sixth potential $V_6$ that is a first potential is equal to or higher than the bias potential vbs. By setting the sixth potential $V_6$ to a potential higher than the bias potential vbs as described above, it is possible to suppress application of an electric field reverse to the ejection pulse DP to the piezoelectric actuator 300. Therefore, it is possible to curb the piezoelectric actuator 300 from being cracked or destroyed.

Embodiment 2

Figure 16:
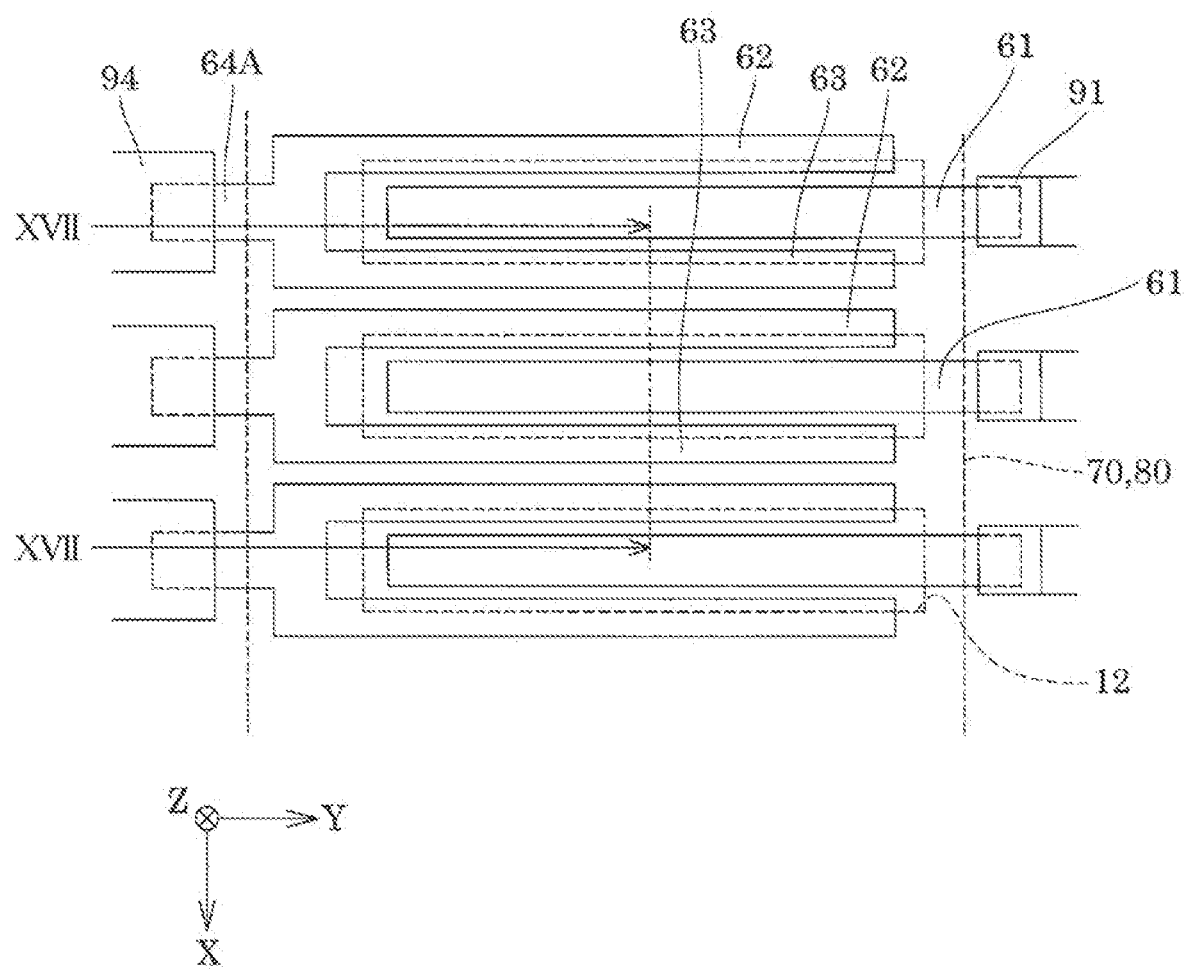
FIG. 16 is an enlarged plan view of a main portion of a channel forming substrate according to Embodiment 2.
Figure 17:
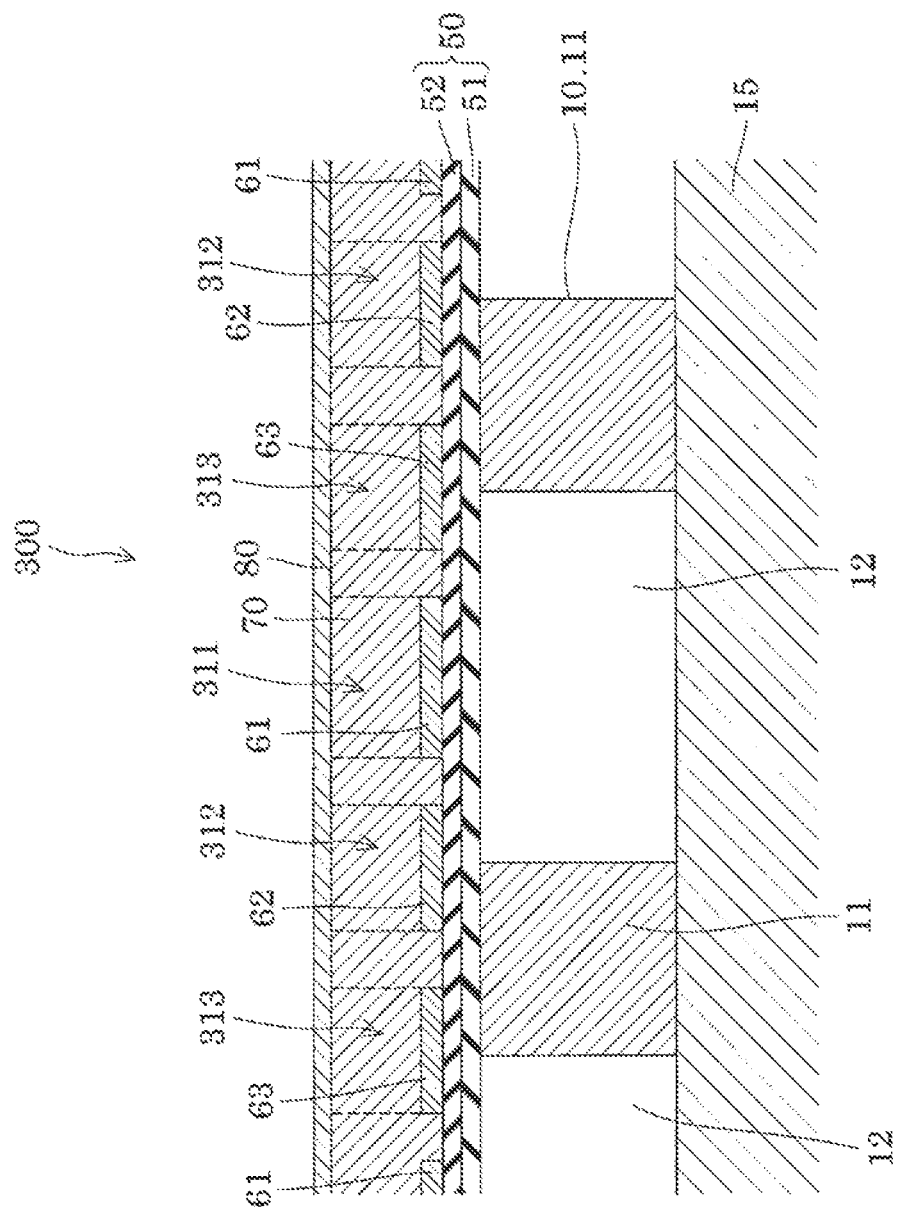
FIG. 17 is a sectional view of a main portion of a recording head according to Embodiment 2.

FIG. 16 is an enlarged plan view of a main portion of a channel forming substrate 10 of a recording head 2 that is an example of a liquid ejecting head according to Embodiment 2 of the present disclosure when viewed in the +Z direction. FIG. 17 is a sectional view taken along the line XVII-XVII in FIG. 16. The same reference numeral is given to a member similar to that of the above embodiment, and the redundant description will be omitted.

As illustrated, a piezoelectric actuator 300 includes a first electrode 61, a second electrode 62, a third electrode 63, a piezoelectric layer 70, and a fourth electrode 80 for one pressure chamber 12.

The first electrode 61, the second electrode 62 and the third electrode 63 are located in the +Z direction relative to the fourth electrode 80. That is, the fourth electrode 80 is located in the −Z direction relative to the first electrode 61, the second electrode 62 and the third electrode 63. In other words, the first electrode 61, the second electrode 62, the third electrode 63, and the fourth electrode 80 are stacked in this order in the −Z direction. Here, the stacking of the first electrode 61, the second electrode 62, the third electrode 63, and the fourth electrode 80 means that the first electrode 61, the second electrode 62, the third electrode 63, and the fourth electrode 80 are stacked with other layers interposed therebetween in the direction along the Z axis. In the present embodiment, the piezoelectric actuator 300 has the piezoelectric layer 70 between the first electrode 61 and the fourth electrode 80 in the direction along the Z axis. The piezoelectric actuator 300 has a piezoelectric layer 70 between the second electrode 62 and the fourth electrode 80. The piezoelectric actuator 300 has the piezoelectric layer 70 between the third electrode 63 and the fourth electrode 80.

The first electrode 61, the second electrode 62, and the third electrode 63 are provided on the surface of the vibration plate 50 in the −Z direction. That is, the first electrode 61, the second electrode 62, and the third electrode 63 are provided at the same position in the direction along the Z axis.

The second electrode 62 and the third electrode 63 are provided from the end of the region facing the pressure chamber 12 to the outside of the pressure chamber 12 at both ends of the pressure chamber 12 in the +X direction, that is, the end in the +X direction and the end in the −X direction when viewed in the −Z direction that is a stacking direction. In the present embodiment, the second electrode 62 is provided from the edge of the region facing the pressure chamber 12 to the top of the partition wall 11 outside the pressure chamber 12 in the −X direction when viewed in the −Z direction at the end of the pressure chamber 12 in the −X direction. The third electrode 63 is provided from the edge of the region facing the pressure chamber 12 to the top of the partition wall 11 outside the pressure chamber 12 in the +X direction when viewed in the −Z direction at the end of the pressure chamber 12 in the +X direction.

The second electrode 62 and the third electrode 63 are separated for each pressure chamber 12 to form individual electrodes provided independently for each active portion. Here, the fact that the second electrode 62 and the third electrode 63 are individual electrodes for the active portions means that, in the present embodiment, a plurality of second electrodes 62 provided for the plurality of second active portions 312 on the channel forming substrate 10 are not electrically coupled to each other and are provided independently. The term "on the channel forming substrate 10" includes a state directly on the channel forming substrate 10 as described above and a state in which another member such as the vibration plate 50 is interposed, that is, the so-called "above". In the two pressure chambers 12 arranged in the +X direction, the second electrode 62 of one pressure chamber 12 and the third electrode 63 of the other pressure chamber 12 are disposed with a gap so as not to communicate with each other on the partition wall 11 that separates the two pressure chambers 12 in the +X direction.

In the present embodiment, the second electrode 62 and the third electrode 63 provided for one pressure chamber 12 are electrically coupled to each other on the channel forming substrate 10. Specifically, the second electrode 62 and the third electrode 63 are coupled to an individual communication portion 64A that is separated and independently provided for each pressure chamber 12 on one of the outer sides of the pressure chambers 12 in the direction along the Y axis, and are electrically coupled to each other via the individual communication portion 64A. In the present embodiment, the second electrode 62, the third electrode 63, and the individual communication portion 64A are continuously provided by patterning the same metal layer. Of course, the second electrode 62, the third electrode 63, and the individual communication portion 64A may be formed of different layers. In other words, the fact that the second electrode 62 and the third electrode 63 are electrically coupled on the channel forming substrate 10 also includes the fact that the second electrode 62 and the third electrode 63 are electrically coupled via another member. The fact that the second electrode 62 and the third electrode 63 provided to correspond to one pressure chamber 12 are continuous on the channel forming substrate 10 includes that the second electrode 62 and the third electrode 63 are directly on and above the channel forming substrate 10. By electrically coupling the second electrode 62 and the third electrode 63 provided to correspond to one pressure chamber 12 as described above, it is not necessary to provide a lead wiring for each of the second electrode 62 and the third electrode 63 or to couple terminals of the wiring substrate 120. Therefore, a space for routing wiring and a space for coupling the wiring substrate 120 on the channel forming substrate 10 are not required, and thus an area of the channel forming substrate 10 along the XY plane can be reduced. However, by electrically coupling the second electrode 62 and the third electrode 63 provided to correspond to one pressure chamber 12, the second active portion 312 and the third active portion 313 cannot be driven individually and are driven at the same time. A second individual lead electrode 94 that is a lead wiring is coupled to the individual communication portion 64A. The second individual lead electrode 94 is provided along the Y axis such that one end is coupled to the individual communication portion 64A and the other end is disposed outside the two rows of pressure chambers on the Y axis. Thus, a wiring substrate different from the wiring substrate 120 is coupled to the second individual lead electrode 94 although not illustrated. Of course, a second individual lead electrode 94 may be drawn out in the same direction as the first individual lead electrode 91 from either the second electrode 62 or the third electrode 63 provided for one pressure chamber 12. The first individual lead electrode 91 and the second individual lead electrode 94 are drawn out in the same direction as described above, and can thus be coupled to one wiring substrate 120. However, by drawing out the first individual lead electrode 91 and the second individual lead electrode 94 in the same direction, there is concern that the pressure chambers 12 cannot be densely disposed in the +X direction in order to secure a space for wiring, or the channel forming substrate 10 may become large in the +X direction.

The piezoelectric layer 70 and the fourth electrode 80 are the same as those of Embodiment 1 described above, and redundant description will be omitted. That is, the fourth electrode 80 serves as a common electrode for the plurality of active portions, that is, here, the plurality of first active portions 311, the plurality of second active portions 312, and the plurality of third active portions 313.

Figure 18:
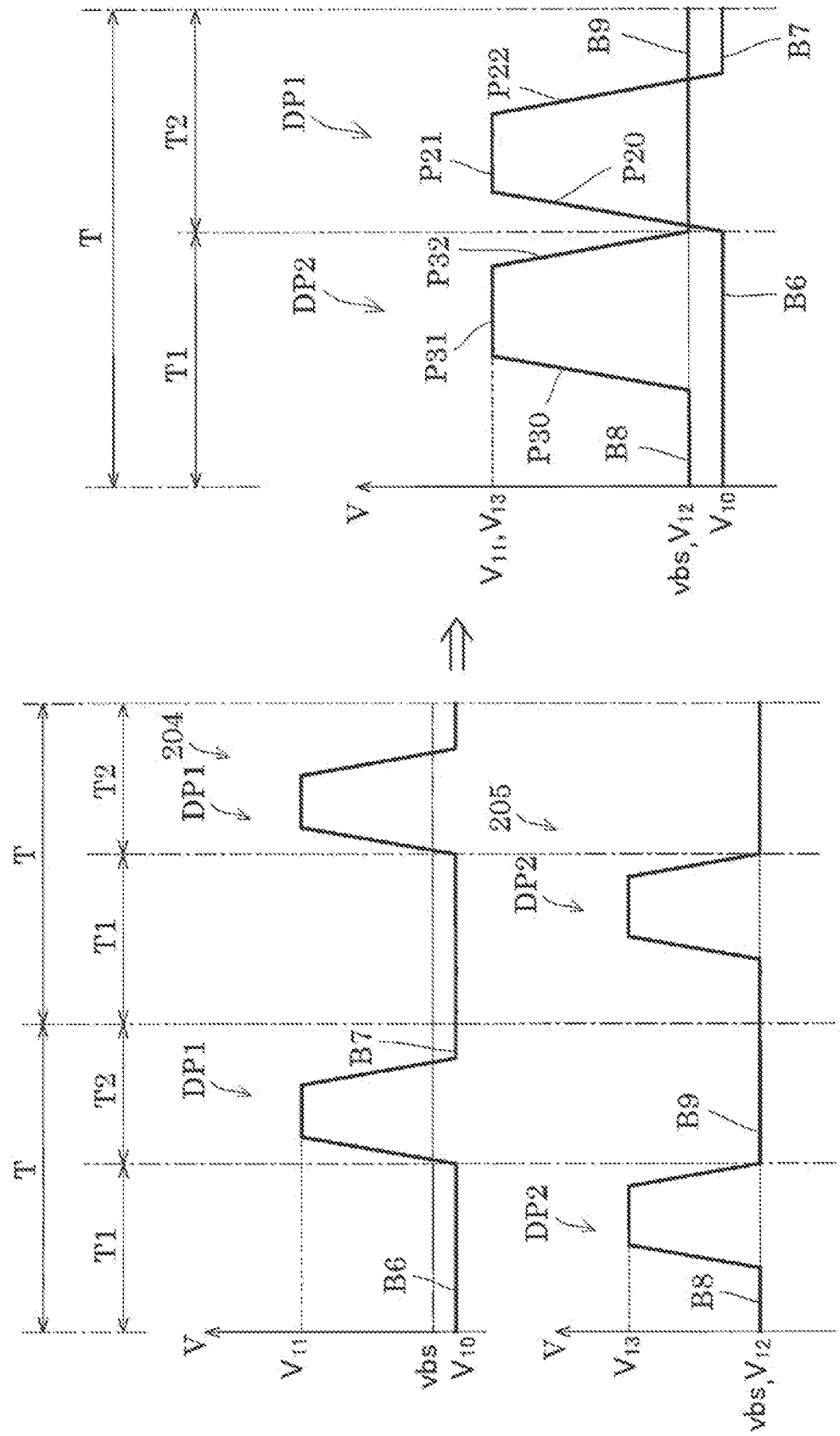
FIG. 18 illustrates drive waveforms of a bias potential, a fourth drive signal, and a fifth drive signal.
Figure 19:
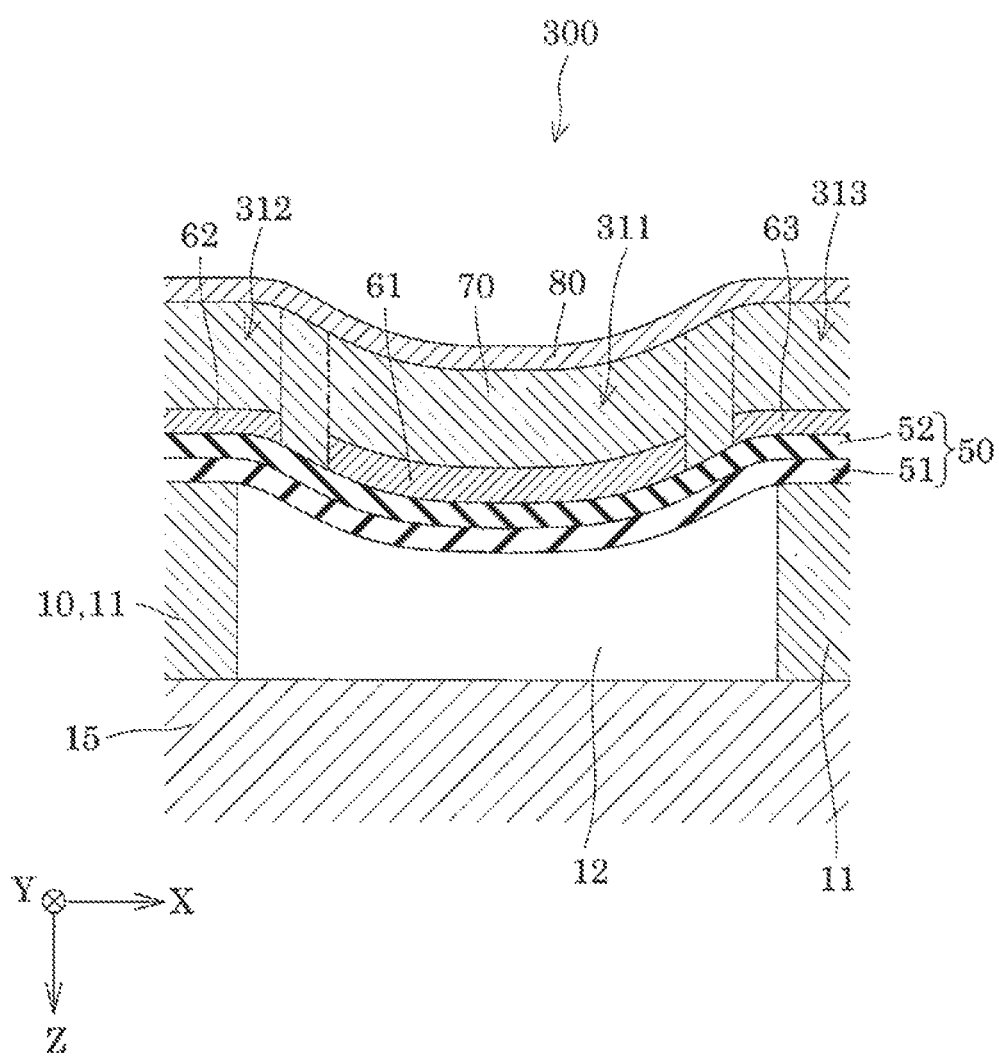
FIG. 19 is a sectional view for describing deformation states of a piezoelectric actuator and a vibration plate.
Figure 20:
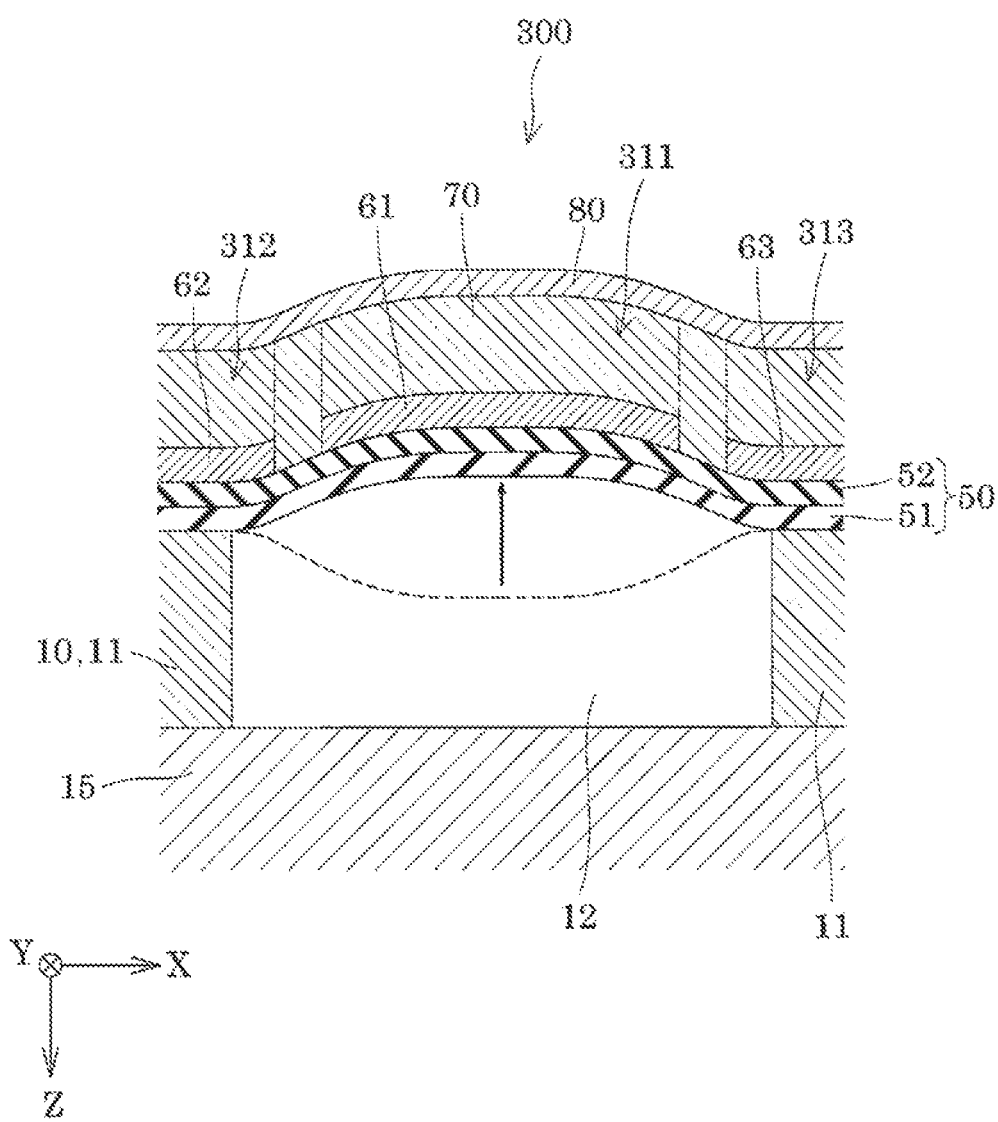
FIG. 20 is a sectional view for describing deformation states of the piezoelectric actuator and the vibration plate.
Figure 21:
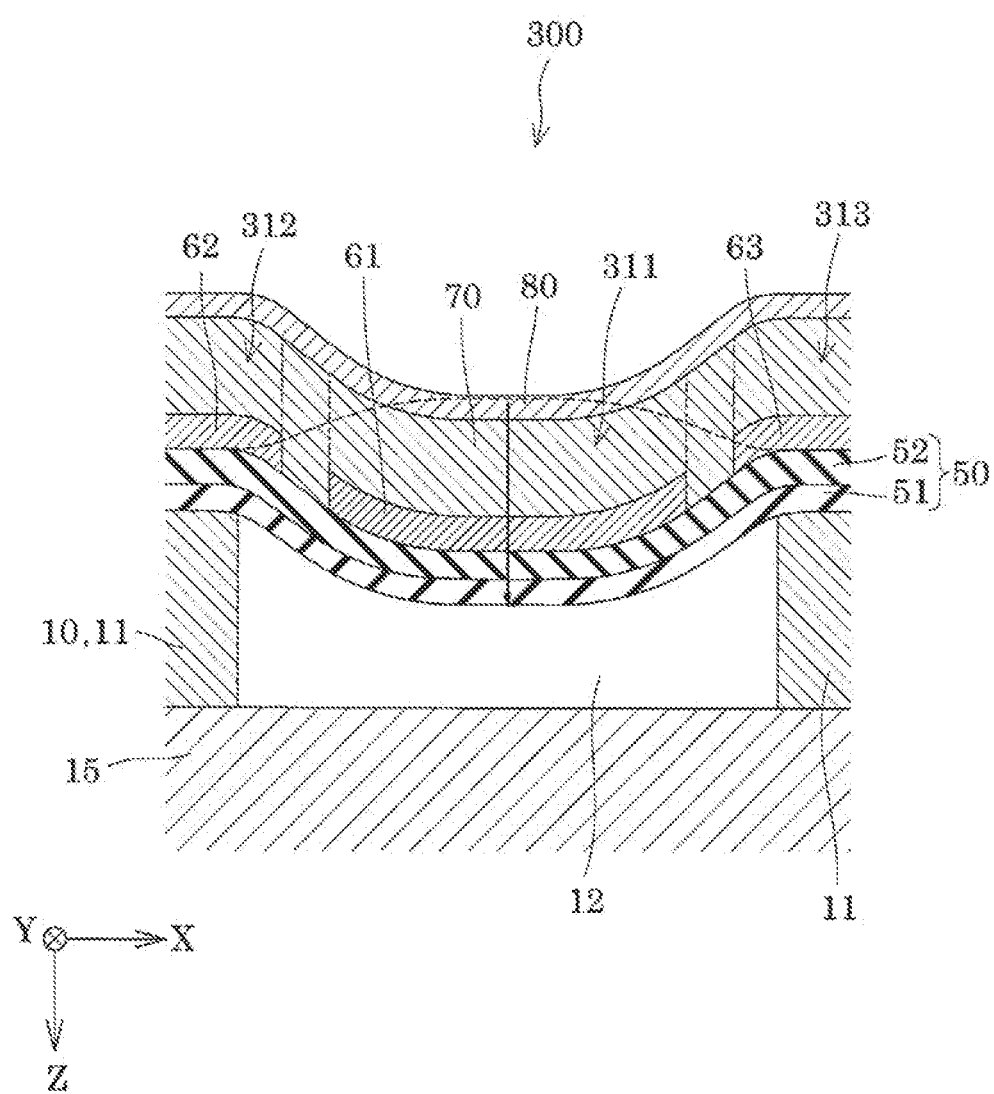
FIG. 21 is a sectional view for describing deformation states of the piezoelectric actuator and the vibration plate.

A drive signal for driving the recording head 2 having such a piezoelectric actuator 300 will be described with reference to FIG. 18. FIG. 18 illustrates drive waveforms representing a bias potential, a fourth drive signal 204, and a fifth drive signal 205. FIGS. 19 to 21 are sectional views taken along line C-C illustrating a state in which the piezoelectric actuator 300 and the vibration plate 50 are deformed by drive signals.

As illustrated in FIG. 18, the drive signal generator 216 generates the fourth drive signal 204 and the fifth drive signal 205 as drive signals. The fourth drive signal 204 corresponds to a "first drive signal" of Embodiment 2 and is supplied to the first electrode 61. The fifth drive signal 205 is supplied to the second electrode 62 and the third electrode 63.

The fourth drive signal 204 and the fifth drive signal 205 are repeatedly generated by the drive signal generator 216 every unit cycle T defined by a clock signal oscillated from the oscillation circuit 215. The unit cycle T is also referred to as an ejection cycle T or a recording cycle T, and corresponds to one pixel of an image or the like printed on a medium S. In the present embodiment, the unit cycle T is divided into two cycles such as a first period T1 and a second period T2.

The fourth drive signal 204 is a signal having a first ejection pulse DP1 for driving the first active portion 311 in the second period T2 of one recording cycle T, and is repeatedly generated every recording cycle T. The first ejection pulse DP1 is selectively supplied to the first active portion 311 corresponding to the pressure chamber 12 communicating with the nozzle 21 that ejects a liquid. That is, the control section generates an application pulse from the head control signal and the fourth drive signal 204 for each first active portion 311 corresponding to the nozzle 21 and supplies the application pulse to the piezoelectric actuator 300. The application pulse generated from the fourth drive signal 204 is supplied to the first electrode 61 of the first active portion 311. The bias potential vbs is supplied to the fourth electrode 80 that is a common electrode for the plurality of first active portions 311. Therefore, a potential applied to the first electrode 61 by the application pulse has the bias potential vbs applied to the fourth electrode 80 as a reference potential. The bias potential vbs applied to the fourth electrode 80 corresponds to a "second potential" disclosed in the claims.

The first ejection pulse DP1 includes a third contraction element P20, a third contraction maintaining element P21, and a third return element P22. The application pulse generated from the fourth drive signal 204 always supplies a tenth potential $V_{10}$ that is an intermediate potential to the first electrode 61 when the ejection pulse DP is not supplied. Therefore, the unit cycle T of the fourth drive signal 204 includes a sixth reference element B6 and a seventh reference element B7 that supply the tenth potential $V_{10}$ before and after the first ejection pulse DP1. That is, in the fourth drive signal 204, the sixth reference element B6, the first ejection pulse DP1, and the seventh reference element B7 are generated in this order within the unit cycle T. The sixth reference element B6 is generated in a period including the first period T1.

The sixth reference element B6 and the seventh reference element B7 continuously apply the tenth potential $V_{10}$ lower than the bias potential vbs to the first electrode 61, and thus, as illustrated in FIG. 19, a state in which the piezoelectric actuator 300 and the vibration plate 50 are flexurally deformed in the +Z direction on the pressure chamber 12 side is maintained. Consequently, the volume of the pressure chamber 12 is maintained as a tenth volume that is smaller than a reference volume.

The third contraction element P20 of the first ejection pulse DP1 applies the tenth potential $V_{10}$ to an eleventh potential $V_{11}$ to the first electrode 61 to deform the piezoelectric actuator 300 and the vibration plate 50 in the +Z direction as illustrated in FIG. 21. Consequently, the volume of the pressure chamber 12 is reduced from the tenth volume to an eleventh volume.

The third contraction maintaining element P21 continues to apply the eleventh potential $V_{11}$ to the first electrode 61, and maintains the volume of the pressure chamber 12 expanded by the third contraction element P20 as the eleventh volume for a certain period of time.

The third return element P22 applies the eleventh potential $V_{11}$ to the tenth potential $V_{10}$ to the first electrode 61 to deform the piezoelectric actuator 300 and the vibration plate 50 in the +Z direction. Consequently, the volume of the pressure chamber 12 is reduced from the eleventh volume and returned to the tenth volume.

The fifth drive signal 205 is a signal having a second ejection pulse DP2 for driving the second active portion 312 and the third active portion 313 in the first period T1 of one recording cycle T, and is repeatedly generated every recording cycle T. The second ejection pulse DP2 is selectively supplied to the second active portion 312 and the third active portion 313 corresponding to the pressure chamber 12 communicating with the nozzle 21 that ejects the liquid. That is, the control section generates an application pulse from the head control signal and the fifth drive signal 205 for each set of the second active portion 312 and the third active portion 313 corresponding to the nozzle 21, and supplies the application pulse to the piezoelectric actuator 300. The application pulse generated from the fifth drive signal 205 is supplied to the second electrode 62 and the third electrode 63 of the second active portion 312 and the third active portion 313. In the present embodiment, the application pulse is simultaneously supplied to a set of the second electrode 62 and the third electrode 63 via the individual communication portion 64A. The bias potential vbs is supplied to the fourth electrode 80 that is a common electrode for the plurality of second active portions 312 and the plurality of third active portions 313. Therefore, a potential applied to the second electrode 62 and the third electrode 63 by the application pulse has the bias potential vbs applied to the fourth electrode 80 as a reference potential. The second ejection pulse DP2 is generated during the first period T1 during which the first ejection pulse DP1 of the fourth drive signal 204 is not generated. That is, the first ejection pulse DP1 and the second ejection pulse DP2 are not input at the same time.

The second ejection pulse DP2 includes a fourth expansion element P30, a fourth expansion maintaining element P31, and a fourth return element P32. The application pulse generated from the fifth drive signal 205 always supplies a twelfth potential $V_{12}$ that is an intermediate potential to the second electrode 62 and the third electrode 63 when the second ejection pulse DP2 is not supplied. Therefore, the unit cycle T of the fifth drive signal 205 includes an eighth reference element B8 and a ninth reference element B9 that supply a twelfth potential $V_{12}$ before and after the second ejection pulse DP2. That is, in the fifth drive signal 205, the eighth reference element B8, the second ejection pulse DP2, and the ninth reference element B9 are generated in this order within the unit cycle T. The ninth reference element B9 is generated during a period including the second period T2 during which the first ejection pulse DP1 of the fourth drive signal 204 is generated.

The eighth reference element B8 and the ninth reference element B9 supply the twelfth potential $V_{12}$ that is the same as the bias potential vbs to the second electrode 62 and the third electrode 63 such that a state in which the second active portion 312 and the third active portion 313 are not driven is maintained. The ninth reference element B9 is supplied during the second period T2 during which the piezoelectric actuator 300 is driven by the first ejection pulse DP1. Therefore, driving of the first active portion 311 is not influenced since the second active portion 312 and the third active portion 313 are not driven while the first active portion 311 is being driven by the first ejection pulse DP1. Since the eighth reference element B8 and the ninth reference element B9 do not drive the second active portion 312 and the third active portion 313, the volume of the pressure chamber 12 at the eighth reference element B8 and the ninth reference element B9 is determined by a state of the fourth drive signal 204, that is, a drive state of the first active portion 311.

The fourth expansion element P30 of the second ejection pulse DP2 applies the twelfth potential $V_{12}$ to a thirteenth potential $V_{13}$ to the second electrode 62 and the third electrode 63 to deform the piezoelectric actuator 300 and the vibration plate 50 in the −Z direction as illustrated in FIG. 20. Consequently, the volume of the pressure chamber 12 is increased from the original volume to a twelfth volume. As described above, at the eighth reference element B8, as illustrated in FIG. 19, the volume of the pressure chamber 12 is the tenth volume smaller than the reference volume that is the volume of the pressure chamber 12 when nothing is driven by supplying the tenth potential $V_{10}$ to the first electrode 61 of the first active portion 311 with the sixth reference element B6 of the fourth drive signal 204. Therefore, the fourth expansion element P30 expands the pressure chamber 12 from the tenth volume that is smaller than the reference volume to the twelfth volume, and thus it is possible to achieve the expansion larger than the expansion from the reference volume to the twelfth volume. The thirteenth potential $V_{13}$ is preferably the same potential as the eleventh potential $V_{11}$ of the first ejection pulse DP1. The thirteenth potential $V_{13}$ is the maximum potential of the second ejection pulse DP2, and the eleventh potential $V_{11}$ is the maximum potential of the first ejection pulse DP1. Therefore, it is preferable to set the maximum potentials of the first ejection pulse DP1 and the second ejection pulse DP2 to be the same potential. By setting the maximum potentials of the first ejection pulse DP1 and the second ejection pulse DP2 to be the same potential, a circuit of the drive signal generator 216 can be simplified compared with a case of generating different potentials.

The fourth expansion maintaining element P31 continues to apply the thirteenth potential $V_{13}$ to the second electrode 62 and the third electrode 63 to maintain the volume of the pressure chamber 12 expanded by the fourth expansion element P30 as the twelfth volume for a certain period of time.

The fourth return element P32 applies the thirteenth potential $V_{13}$ to the twelfth potential $V_{12}$ to the second electrode 62 and the third electrode 63 to deform the piezoelectric actuator 300 and vibration plate 50 in the +Z direction. Consequently, the volume of the pressure chamber 12 is reduced from the twelfth volume to the tenth volume.

A timing at which the second ejection pulse DP2 ends is the same as a timing at which the first ejection pulse DP1 starts. That is, a timing at which the fourth return element P32 of the second ejection pulse DP2 ends is the same as a timing at which the third contraction element P20 of the first ejection pulse DP1 starts. When the first ejection pulse DP1 and the second ejection pulse DP2 are not supplied at the same time, the timing at which the fourth return element P32 of the second ejection pulse DP2 ends and the timing at which the third contraction element P20 of the first ejection pulse DP1 starts may be different. For example, it is preferable that an interval between the timing at which the fourth return element P32 of the second ejection pulse DP2 ends and the timing at which the third contraction element P20 of the first ejection pulse DP1 starts is ½ of the natural vibration cycle Tc of the pressure chamber 12. Consequently, when the meniscus in the nozzle 21 is directed in the +Z direction due to the residual vibration caused by the first ejection pulse DP1, the second ejection pulse DP2 can be supplied, and it is possible to suppress movement of the ink meniscus generated by driving the first ejection pulse DP1 from being blocked due to driving of the second ejection pulse DP2 and thus to eject ink droplets.

By supplying the first ejection pulse DP1 and the second ejection pulse DP2 to the first electrode 61, and the second electrode 62 and the third electrode 63, respectively, ink droplets are ejected from the corresponding nozzle 21.

Specifically, first, in a state in which the volume of the pressure chamber 12 is the tenth volume illustrated in FIG. 19, the piezoelectric actuator 300 and the vibration plate 50 are moved in the −Z direction by the fourth expansion element P30 of the second ejection pulse DP2 as illustrated in FIG. 20, and thus the volume of the pressure chamber 12 is increased from the tenth volume to the twelfth volume. Consequently, the meniscus of the ink in the nozzle 21 is drawn toward the pressure chamber 12 and ink is supplied to the pressure chamber 12 from the manifold 100 side.

Next, after the increased twelfth volume is maintained by the fourth expansion maintaining element P31 for a certain period of time, the piezoelectric actuator 300 and the vibration plate 50 are moved in the +Z direction by the fourth return element P32, and thus the volume of the pressure chamber 12 is reduced from the twelfth volume to the tenth volume.

Following the fourth return element P32, the piezoelectric actuator 300 and vibration plate 50 are further moved in the +Z direction as illustrated in FIG. 21 by the third contraction element P20 of the supplied first ejection pulse DP1, and thus the volume of the pressure chamber 12 is reduced from the tenth volume to the eleventh volume. In other words, by continuously supplying the fourth return element P32 of the second ejection pulse DP2 and the third contraction element P20 of the first ejection pulse DP1, the piezoelectric actuator 300 and the vibration plate 50 rapidly reduce the volume of the pressure chamber 12 from the twelfth volume to the eleventh volume. Consequently, the ink in the pressure chamber 12 is pressurized and ink droplets are ejected from the nozzle 21.

After ejection of the ink droplets, the eleventh volume is maintained for a certain period of time by the third contraction maintaining element P21 of the first ejection pulse DP1. While the third contraction maintaining element P21 is being supplied, the ink pressure in the pressure chamber 12, which has decreased due to the ejection of the ink droplets, is attenuated while repeating increase and decrease by the natural vibration of the pressure chamber 12, and the volume of the pressure chamber 12 is increased and returned to the original tenth volume by the third return element P22.

As described above, by driving the first active portion 311 with the first ejection pulse DP1 and driving the second active portion 312 and the third active portion 313 with the second ejection pulse DP2 to eject ink droplets, an excluded volume when the twelfth volume is reduced to the eleventh volume can be increased. Therefore, ink droplets having a large ink weight can be ejected.

The ink droplets are ejected by the first ejection pulse DP1 for deforming the piezoelectric actuator 300 and the vibration plate 50 to protrude in a projection shape in the +Z direction on the pressure chamber 12 side, and the second ejection pulse DP2 for deforming the piezoelectric actuator 300 and the vibration plate 50 to protrude in a projection shape in the −Z direction on the opposite side to the pressure chamber 12. Therefore, even when the piezoelectric actuator 300 is repeatedly driven, residual strain is less likely to occur in the piezoelectric layer 70 compared with a case where the piezoelectric actuator 300 is deformed in only one direction to eject ink droplets. Therefore, even when the piezoelectric actuator 300 is repeatedly driven, it is possible to curb a decrease in an amount of displacement.

Since a trapezoidal wave with a relatively simple shape can be used as the first ejection pulse DP1 and the second ejection pulse DP2, there is no need to generate a waveform with a complicated shape as the ejection pulse, a circuit configuration of the drive signal generator 216 can be simplified and control can be easily performed.

As described above, the recording head 2 that is an example of a piezoelectric device of the present disclosure includes the channel forming substrate 10 that is a substrate on which the pressure chambers 12 which are recesses communicating with the nozzles 21 for ejecting a liquid are arranged in the +X direction that is the first direction, the vibration plate 50, and the piezoelectric actuator 300. The piezoelectric actuator 300 has the first electrode 61, the second electrode 62, the third electrode 63, and the fourth electrode 80 in this order. The piezoelectric actuator 300 has the piezoelectric layers 70 between the first electrode 61 and the fourth electrode 80, between the second electrode 62 and the fourth electrode 80, and between the third electrode 63 and the fourth electrode 80. The plurality of first active portions 311, the plurality of second active portions 312 and the plurality of third active portions 313, which are active portions in which the piezoelectric layer 70 is interposed between the first electrode 61, the second electrode 62, and the third electrode 63, and the fourth electrode 80, are provided. The second electrode 62 and the third electrode 63 are provided at both ends of the pressure chamber 12 in the +X direction from the edge of the region facing the pressure chamber 12 to the outside of the pressure chamber 12 when viewed in the −Z direction that is a stacking direction. The first electrode 61 is formed between the second electrode 62 and the third electrode 63 in the +X direction, and the fourth electrode 80 configures a common electrode for the plurality of first active portions 311, second active portions 312, and third active portions 313.

As described above, the first electrode 61 that drives the piezoelectric actuator 300 to be deformed toward the pressure chamber 12 side, and the second electrode 62 and the third electrode 63 that drive the piezoelectric actuator 300 to be deformed toward the opposite side to the pressure chamber 12 are provided. Therefore, compared with a case where the piezoelectric actuator 300 is deformed only in one direction along the Z axis, the residual strain in the piezoelectric layer 70 is less likely to occur even when the piezoelectric actuator 300 is repeatedly driven. Therefore, even when the piezoelectric actuator 300 is repeatedly driven, it is possible to curb a decrease in an amount of displacement. Therefore, even when the piezoelectric actuator 300 is repeatedly driven, it is possible to prevent deterioration in the ejection characteristics such as the ink weight of ink droplets ejected from the nozzles 21 and to continue high-quality printing. An amount of displacement can be improved compared with a case where the piezoelectric actuator 300 is driven only in one direction along the Z axis. Therefore, the weight of ink droplets ejected from the nozzles 21 can be increased.

In the recording head 2 of the present embodiment, it is preferable that the second electrode 62 and the third electrode 63 configure individual electrodes provided independently in each of the second active portion 312 and the third active portion 313 that are active portions. That is, the second electrode 62 serves as an individual electrode for each second active portion 312 with respect to the plurality of second active portions 312, and the third electrode 63 serves as an individual electrode for each third active portion 313 with respect to the plurality of third active portions 313. As described above, by using the second electrode 62 and the third electrode 63 as individual electrodes for the second active portion 312 and the third active portion 313, respectively, the second active portion 312 and the third active portion 313 can be selectively driven for the plurality of pressure chambers 12.

In the recording head 2 of the present embodiment, it is preferable that the second electrode 62 and the third electrode 63 provided for the pressure chamber 12 that is one recess are electrically coupled on the channel forming substrate 10 that is a substrate. By electrically coupling the second electrode 62 and the third electrode 63 provided for one pressure chamber 12 on the channel forming substrate 10, it is not necessary to independently provide the second individual lead electrode 94 for each of the second electrode 62 and the third electrode 63, and a space for routing the second individual lead electrodes 94 on the channel forming substrate 10 and a space for coupling to the wiring substrate 120 are not required. Therefore, the number of the second individual lead electrodes 94 can be reduced, and thus a size of the channel forming substrate 10 can be reduced.

The ink jet recording apparatus 1 that is an example of the liquid ejecting apparatus of the present embodiment includes the channel forming substrate 10 that is a substrate on which the pressure chambers 12 which are recesses communicating with the nozzles 21 for ejecting a liquid are arranged in the +X direction that is the first direction, the vibration plate 50, the piezoelectric actuator 300, and the control section that drives the piezoelectric actuator 300. The piezoelectric actuator 300 has the first electrode 61, the second electrode 62, the third electrode 63, and the fourth electrode 80 in this order. The piezoelectric actuator 300 has the piezoelectric layers 70 between the first electrode 61 and the fourth electrode 80, between the second electrode 62 and the fourth electrode 80, and between the third electrode 63 and the fourth electrode 80. The plurality of first active portions 311, the plurality of second active portions 312 and the plurality of third active portions 313, which are active portions in which the piezoelectric layer 70 is interposed between the first electrode 61, the second electrode 62, and the third electrode 63, and the fourth electrode 80, are provided. The second electrode 62 and the third electrode 63 are provided at both ends of the pressure chamber 12 in the +X direction from the edge of the region facing the pressure chamber 12 to the outside of the pressure chamber 12 when viewed in the −Z direction that is a stacking direction. The first electrode 61 is formed between the second electrode 62 and the third electrode 63 in the +X direction, and the fourth electrode 80 configures a common electrode for the plurality of first active portions 311, second active portions 312, and third active portions 313. The control section supplies the first ejection pulse DP1 to the first electrode 61 to drive the piezoelectric actuator 300 when the piezoelectric actuator 300 is deformed toward the pressure chamber 12 side. When the piezoelectric actuator 300 is deformed toward the opposite side to the pressure chamber 12, the control section supplies the second ejection pulse DP2 to the second electrode 62 and the third electrode 63 to drive the piezoelectric actuator 300. The control section causes the nozzle 21 to eject a liquid with the first ejection pulse DP1 and the second ejection pulse DP2.

The control section drives the piezoelectric actuator 300 with the first ejection pulse DP1 and the second ejection pulse DP2, and thus the residual strain is less likely to occur in the piezoelectric layer 70 even when the piezoelectric actuator 300 is repeatedly driven compared with a case where the piezoelectric actuator 300 is deformed in only one direction along the Z axis. Therefore, even when the piezoelectric actuator 300 is repeatedly driven, it is possible to curb a decrease in an amount of displacement. Therefore, even when the piezoelectric actuator 300 is repeatedly driven, it is possible to prevent deterioration in the ejection characteristics such as the ink weight of ink droplets ejected from the nozzles 21 and to continue high-quality printing. An amount of displacement can be improved compared with a case where the piezoelectric actuator 300 is driven only in one direction along the Z axis. Therefore, the weight of ink droplets ejected from the nozzles 21 can be increased.

In the ink jet recording apparatus 1 of the present embodiment, it is preferable that the control section does not supply the first ejection pulse DP1 and the second ejection pulse DP2 at the same time. Consequently, it is possible to curb the piezoelectric actuator 300 from being deformed excessively and thus to curb damage such as cracks from occurring in the piezoelectric actuator 300.

In the ink jet recording apparatus 1 of the present embodiment, it is preferable that the first ejection pulse DP1 and the second ejection pulse DP2 have the same maximum potential. That is, the thirteenth potential $V_{13}$ that is the maximum potential of the second ejection pulse DP2 and the eleventh potential $V_{11}$ that is the maximum potential of the first ejection pulse DP1 are set to the same potential, and thus a circuit of the drive signal generator 216 can be simplified compared with a case of generating different potentials.

Figure 22:
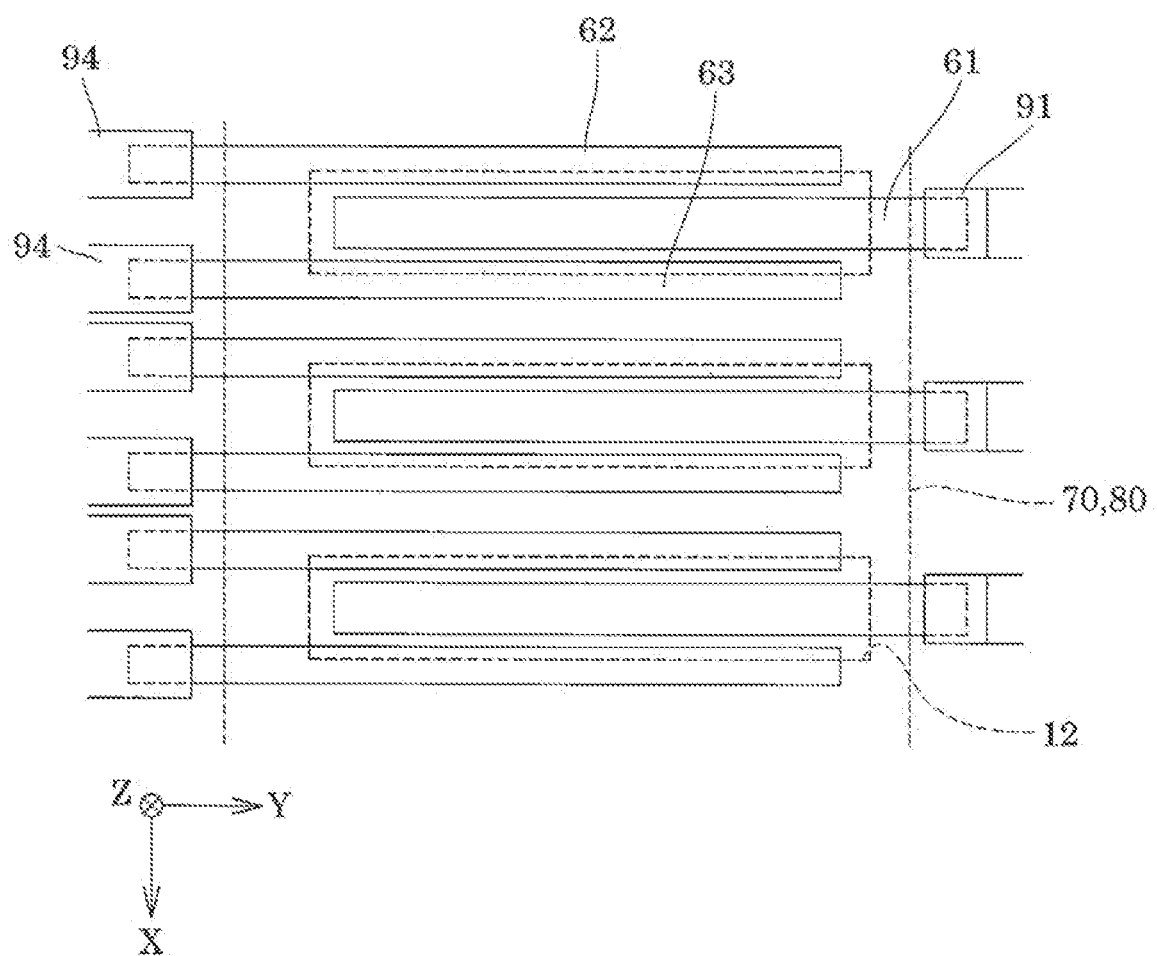
FIG. 22 is an enlarged plan view of a main portion of a channel forming substrate of a modification example according to Embodiment 2.

In the above-described example, the second electrode 62 and the third electrode 63 provided to correspond to one pressure chamber 12 are electrically coupled on the channel forming substrate 10, but the present disclosure is not particularly limited to this. FIG. 22 illustrates a modification example of the recording head 2 of the present embodiment. FIG. 22 is a plan view in which the channel forming substrate 10 illustrating a modification example of the recording head 2 according to Embodiment 2 is viewed in the +Z direction.

As illustrated in FIG. 22, the second electrode 62 and the third electrode 63 provided to correspond to one pressure chamber 12 are separated from each other on the channel forming substrate 10 so as not to be electrically coupled. The second individual lead electrodes 94 is provided independently for each of the second electrode 62 and the third electrode 63.

As described above, by not electrically coupling the second electrode 62 and the third electrode 63 for one pressure chamber 12 on the channel forming substrate 10, different waveforms, that is, different potentials can be supplied to the second electrode 62 and the third electrode 63. For example, by varying the thirteenth potential $V_{13}$ of the second ejection pulse DP2 supplied to each of the second electrode 62 and the third electrode 63, a flight direction of the ink droplets ejected from the nozzle 21 is bent in a direction along the X axis. Therefore, when the ink droplets do not fly in the +Z direction perpendicular to the liquid ejecting surface 20a, the thirteenth potential $V_{13}$ of the second ejection pulse DP2 to be supplied to each of the second electrode 62 and the third electrode 63 may be adjusted such that the ink droplets fly in the +Z direction. In other words, by adjusting the thirteenth potential $V_{13}$ supplied to each of the second electrode 62 and the third electrode 63, the flight direction of the ink droplets can be adjusted, and it is possible to curb deviation in a landing position of the ink droplets on the medium S and thus to improve printing quality.

That is, in the recording head 2 illustrated in FIG. 22, it is preferable that the second electrode 62 and the third electrode 63 are not electrically coupled on the channel forming substrate 10 that is a substrate. According to this, the second electrode 62 and the third electrode 63 can be driven by being supplied with different potentials. Therefore, the second electrode 62 and the third electrode 63 are driven by being supplied with different potentials, and thus an angle of ejection direction of the ink droplets, that is, a tilt angle in the +X direction with respect to the +Z direction can be adjusted.

Figure 23:
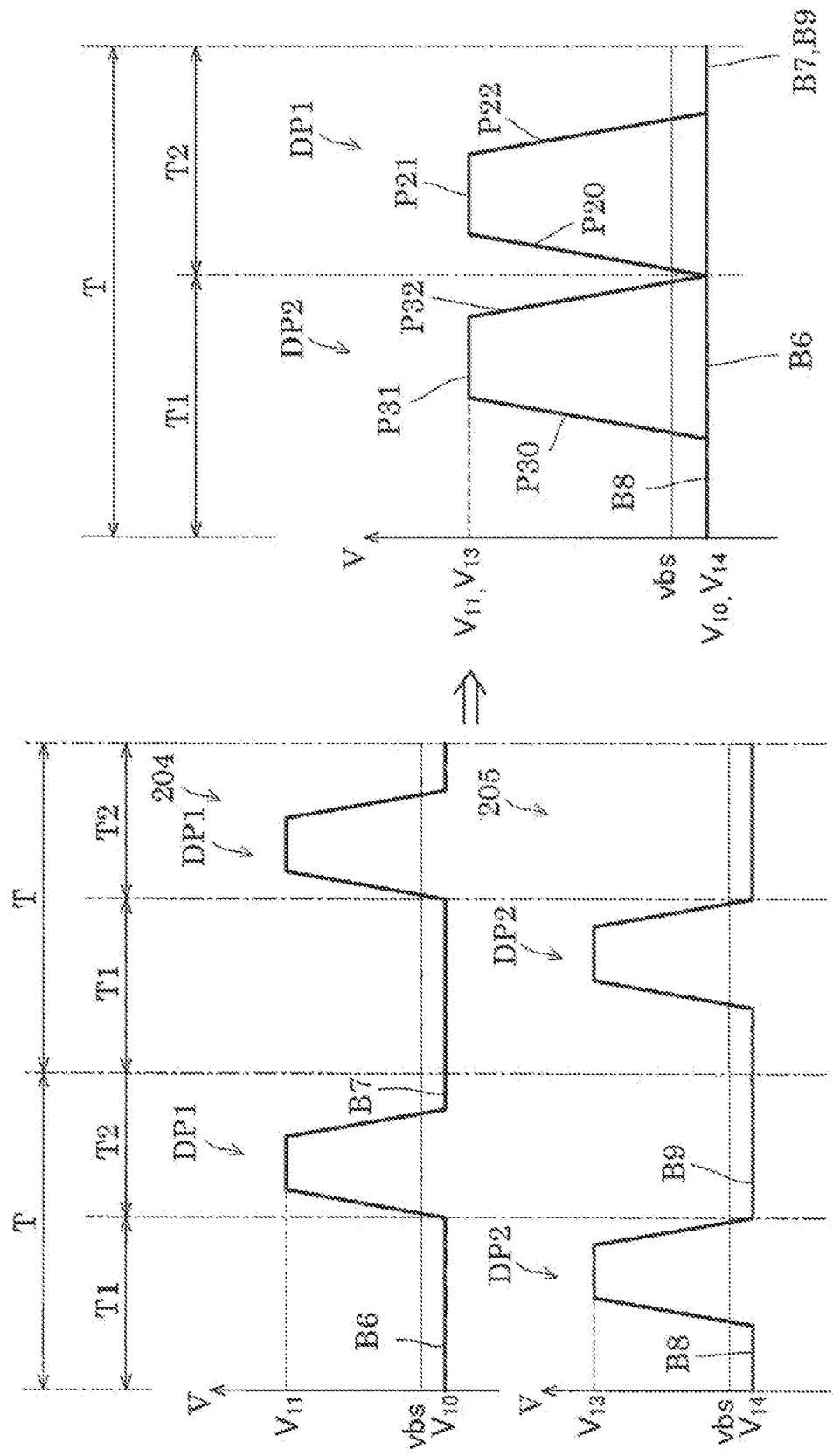
FIG. 23 illustrates drive waveforms of modification examples of the bias potential, the fourth drive signal, and the fifth drive signal.

Here, a modification example of the fifth drive signal 205 of the present embodiment will be described with reference to FIG. 23. FIG. 23 illustrates drive waveforms representing modification examples of the bias potential vbs, the fourth drive signal 204, and the fifth drive signal 205.

As illustrated in FIG. 23, the fifth drive signal 205 has an eighth reference element B8, a second ejection pulse DP2, and a ninth reference element B9.

The eighth reference element B8 and the ninth reference element B9 supply a potential supplied to the fourth electrode 80 to the second electrode 62 and the third electrode 63, that is, in the present embodiment, a fourteenth potential $V_{14}$ different from the bias potential vbs. Here, the fourteenth potential $V_{14}$ corresponds to a "first potential" in Embodiment 2. The fourteenth potential $V_{14}$ is a potential lower than the bias potential vbs in the present embodiment. That is, the fourteenth potential $V_{14}$<the bias potential vbs. The fourteenth potential $V_{14}$ is preferably the same potential as the tenth potential $V_{10}$ of the sixth reference element B6 and the seventh reference element B7 of the first ejection pulse DP1. By setting the fourteenth potential $V_{14}$ and the tenth potential $V_{10}$ to the same potential, a circuit of the drive signal generator 216 can be simplified compared with a case of generating different potentials.

The fourth expansion element P30 of the second ejection pulse DP2 applies the fourteenth potential $V_{14}$ to the thirteenth potential $V_{13}$ to the second electrode 62 and the third electrode 63. The fourth return element P32 applies the thirteenth potential $V_{13}$ to the fourteenth potential $V_{14}$ to the second electrode 62 and the third electrode 63. The thirteenth potential $V_{13}$ is preferably the same potential as the tenth potential $V_{10}$ of the first ejection pulse DP1. Consequently, the first ejection pulse DP1 and the second ejection pulse DP2 are allowed to have the same waveform shape. Here, the fact that the first ejection pulse DP1 and the second ejection pulse DP2 have the same waveform shape means that the first ejection pulse DP1 and the second ejection pulse DP2 have the same lowest potential, highest potential, and slope. By setting the first ejection pulse DP1 and the second ejection pulse DP2 to have the same waveform shape as described above, the drive signal generator 216 can be easily controlled.

By maintaining a state in which the fourteenth potential $V_{14}$ is supplied to the second electrode 62 and the third electrode 63 by the eighth reference element B8 and the ninth reference element B9, the natural vibration cycle Tc of the pressure chamber 12 can be adjusted. Here, the magnitude of the fourteenth potential $V_{14}$ supplied to the second electrode 62 and the third electrode 63 and the magnitude of the natural vibration cycle Tc of the pressure chamber 12 have an inversely proportional relationship. Therefore, by supplying the fourteenth potential $V_{14}$ to the second electrode 62 and the third electrode 63, the natural vibration cycle Tc of the pressure chamber 12 can be reduced, and ink droplets can be continuously ejected at a high speed.

In a head unit in which a plurality of recording heads 2 are unitized, even when there is a variation in the natural vibration cycle Tc among the plurality of recording heads 2, it is possible to reduce the variation the natural vibration cycle Tc among the plurality of recording heads 2 by changing the fourteenth potential $V_{14}$ of each recording head 2. Therefore, it is possible to curb variations in ejection characteristics such as ink weight and ejection speed of ink droplets ejected from a plurality of recording heads 2.

As illustrated in FIG. 23, in the ink jet recording apparatus 1, it is preferable that the control section supplies the fourth drive signal 204 that is a first drive signal including the first ejection pulse DP1 to the first electrode 61, and the control section supplies the fourteenth potential $V_{14}$ that is a first potential different from a potential supplied to the fourth electrode 80 to the second electrode 62 and the third electrode 63 while the fourth drive signal 204 is being supplied to the first electrode 61. According to this, while the fourth drive signal 204 is being supplied to the first electrode 61, by maintaining the state in which the fourteenth potential $V_{14}$ is supplied to the second electrode 62 and the third electrode 63, natural vibration cycle Tc of the pressure chamber 12 can be adjusted. Therefore, it is possible to reduce the natural vibration cycle Tc of the pressure chamber 12 and continuously eject ink droplets at a high speed. In a head unit in which a plurality of recording heads 2 are unitized or in the ink jet recording apparatus 1 having a plurality of recording heads 2, even when there is a variation in the natural vibration cycle Tc among the plurality of recording heads 2, by changing the fourteenth potential $V_{14}$ for each recording head 2, the variation in the natural vibration cycle Tc among the plurality of recording heads 2 can be reduced. Therefore, it is possible to curb variations in ejection characteristics such as ink weight and ejection speed of ink droplets ejected from a plurality of recording heads 2. In the example described above, the bias potential vbs is supplied to the fourth electrode 80, but the present disclosure is not particularly limited to this, and the fourth electrode 80 may be ground (GND).

In the ink jet recording apparatus 1 of the present embodiment, it is preferable that the control section supplies the bias potential vbs that is a second potential to the fourth electrode 80 while supplying the fourth drive signal 204 that is a first drive signal, and the fourteenth potential $V_{14}$ that is a first potential is equal to or higher than the bias potential vbs. By setting the fourteenth potential $V_{14}$ to a potential higher than the bias potential vbs as described above, it is possible to suppress the application of an electric field reverse to the ejection pulse DP to the piezoelectric actuator 300. Therefore, it is possible to curb the piezoelectric actuator 300 from being cracked or destroyed.

As illustrated in FIG. 23, in the ink jet recording apparatus 1, it is preferable that the first ejection pulse DP1 and the second ejection pulse DP2 have the same waveform shape. According to this, the control of the drive signal generator 216 can be simplified.

Figure 24:
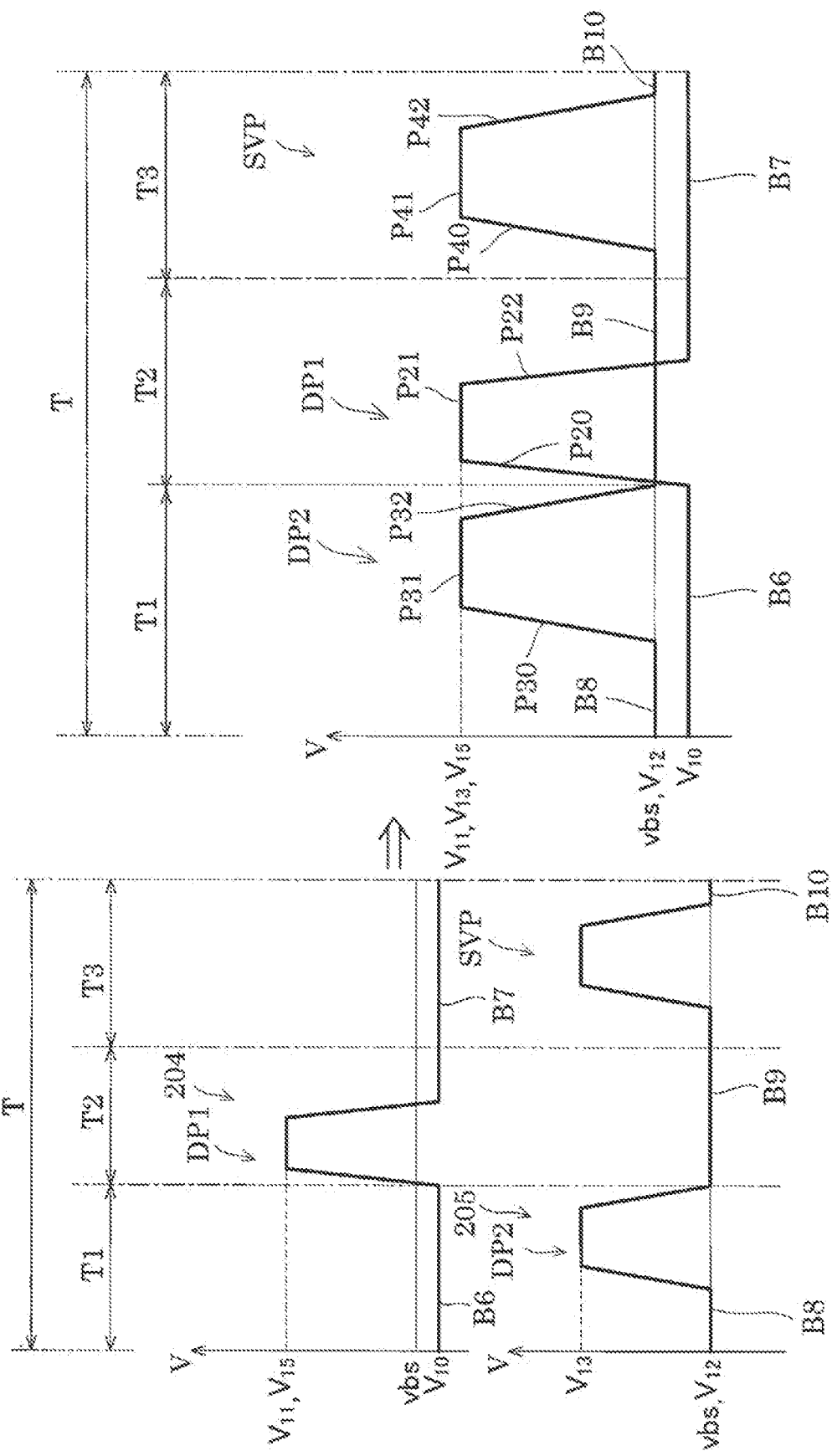
FIG. 24 illustrates drive waveforms of modification examples of the bias potential, the fourth drive signal, and the fifth drive signal.

In addition to the second ejection pulse DP2, the fifth drive signal 205 may have the damping pulse SVP of Embodiment 1 described above. FIG. 24 illustrates a modification example of such fifth drive signal 205. FIG. 24 illustrates drive waveforms of the bias potential vbs, the fourth drive signal 204 and the fifth drive signal 205.

As illustrated in FIG. 24, the unit cycle T of the fourth drive signal 204 and the fifth drive signal 205 is separated into three periods such as a first period T1, a second period T2 and a third period T3.

The first ejection pulse DP1 of the fourth drive signal 204 is generated during the second period T2. The second ejection pulse DP2 of the fifth drive signal 205 is generated during the first period T1.

The damping pulse SVP is generated during the third period T3 of the fifth drive signal 205. The fifth drive signal 205 has the eighth reference element B8, the second ejection pulse DP2, the ninth reference element B9, the damping pulse SVP, and the tenth reference element B10 in this order. The tenth reference element B10 supplies the second electrode 62 and the third electrode 63 with the same twelfth potential $V_{12}$ as the eighth reference element B8 and the ninth reference element B9. The twelfth potential $V_{12}$ is the same potential as the bias potential vbs as described above.

The damping pulse SVP includes a fifth expansion element P40, a fifth expansion maintaining element P41, and a fifth return element P42.

The fifth expansion element P40 supplies the twelfth potential $V_{12}$ to the fifteenth potential $V_{15}$ to the second electrode 62 and the third electrode 63 to deform the piezoelectric actuator 300 and the vibration plate 50 in the −Z direction on the opposite side to the pressure chamber 12. Consequently, the volume of the pressure chamber 12 is increased from the tenth volume to the thirteenth volume.

The fifteenth potential $V_{15}$ of the fifth expansion element P40 is preferably the same potential as the thirteenth potential $V_{13}$ of the second ejection pulse DP2. By setting the fifteenth potential $V_{15}$ and the thirteenth potential $V_{13}$ to the same potential, a circuit of the drive signal generator 216 can be simplified compared with a case of generating different potentials.

The fifth expansion maintaining element P41 continues to apply the fifteenth potential $V_{15}$ to the second electrode 62 and the third electrode 63 to maintain the volume of the pressure chamber 12 expanded by the fifth expansion element P40 as the thirteenth volume for a certain period of time.

The fifth return element P42 applies the fifteenth potential $V_{15}$ to the twelfth potential $V_{12}$ to the second electrode 62 and the third electrode 63 to deform the piezoelectric actuator 300 and vibration plate 50 in the +Z direction. Consequently, the volume of the pressure chamber 12 is reduced from the thirteenth volume and returned to the tenth volume.

By inserting the damping pulse SVP after the second ejection pulse DP2 and the first ejection pulse DP1 as described above, the residual vibration of the ink in the pressure chamber 12 after the ink is ejected from the nozzle 21 can be converged in a short time. That is, when the second active portion 312 and the third active portion 313 of the piezoelectric actuator 300 are driven by the damping pulse SVP, the second active portion 312 and the third active portion 313 are contracted along the Z axis as in FIG. 20, and the piezoelectric actuator 300 and the vibration plate 50 are deformed to protrude in a projection shape in the −Z direction on the opposite side to the pressure chamber 12. In this case, a tensile stress is applied to the portion including the first active portion 311 interposed between the second active portion 312 and the third active portion 313, and thus the apparent Young's modulus increases. By increasing the apparent Young's modulus of the piezoelectric actuator 300, the residual vibration of the ink in the pressure chamber 12 after ink droplets are ejected can be converged in a short time.

Of course, for the fifth drive signal 205 having the damping pulse SVP, as in FIG. 23, by setting the potential supplied to the second electrode 62 and the third electrode 63 by the eighth reference element B8, the ninth reference element B9, and the tenth reference element B10 to a potential different from the bias potential vbs, the natural vibration cycle Tc of the pressure chamber 12 can be adjusted.

As illustrated in FIG. 24, in the ink jet recording apparatus 1, it is preferable that the control section supplies the second electrode 62 and the third electrode 63 with the damping pulse SVP for driving the piezoelectric actuator such that a liquid is not ejected from the nozzle 21 after supplying the first ejection pulse DP1 and the second ejection pulse DP2. According to this, by inserting the damping pulse SVP after the ejection pulse DP, the apparent Young's modulus of the piezoelectric layer 70 can be increased, and thus the residual vibration after the first ejection pulse DP1 and the second ejection pulse DP2 can be converged in a short time. Therefore, ejection of ink droplets can be repeated in a short time, and high-speed continuous ejection can be realized.

The damping pulse SVP may be supplied to the second electrode 62 and the third electrode 63 corresponding to the pressure chamber 12 that does not eject ink droplets. Consequently, the ink in the vicinity of the pressure chamber 12 and the nozzle 21 is slightly vibrated to curb sedimentation of components contained in the ink or to curb accumulation of thickened ink, and thus to curb ejection failure of ink droplets due to the thickened ink.

The driving of the recording head 2 using the drive signals illustrated in FIGS. 18, 23, and 24 of the present embodiment is applicable to the configuration of the above Embodiment 1, that is, the configuration in which the second electrode 62 configures a common electrode for the plurality of second active portions 312 and the third electrode 63 configures a common electrode for the plurality of third active portions 313. That is, the control section may supply the fourth drive signal 204 to the first electrode 61 that configures an individual electrode, and supply the fifth drive signal 205 to the second electrode 62 and the third electrode 63 that configure common electrodes. The second ejection pulse DP2 is also supplied to the second active portion 312 and the third active portion 313 corresponding to the nozzles 21 that do not eject ink droplets. However, ink droplets can be selectively ejected from the nozzles 21 by not ejecting the ink droplets only with the second ejection pulse DP2, in other words, by ejecting the ink droplets only when combined with the first ejection pulse DP1. By supplying only the second ejection pulse DP2, the second ejection pulse DP2 also functions as a micro-vibration pulse. Thus, the ink in the vicinity of the nozzle 21 can be slightly vibrated by driving the second active portion 312 and the third active portion 313 corresponding to the nozzles 21 that do not eject ink droplets with the second ejection pulse DP2. Therefore, it is possible to curb sedimentation of components contained in the ink in the vicinity of the pressure chamber 12 and the nozzle 21 or to curb accumulation of thickened ink, and thus to curb ejection failure of ink droplets due to the thickened ink. Of course, the second ejection pulse DP2 may also be supplied as a micro-vibration pulse to the second active portion 312 and the third active portion 313 that configure individual electrodes of the present embodiment.

Other Embodiments

Although each embodiment of the present disclosure has been described above, a basic configuration of the present disclosure is not limited to the above description.

Here, the piezoelectric actuator 300 and vibration plate 50 are not limited to those described above. Modification examples of the piezoelectric actuator 300 and vibration plate 50 are illustrated in FIGS. 25 to 30. FIGS. 25 to 29 are sectional views of main portions of the recording head 2 according to other embodiments of the present disclosure. FIG. 30 is a plan view in which the channel forming substrate 10 according to another embodiment of the present disclosure is viewed in the +Z direction. The same reference numeral is given to a member similar to that of each of the above embodiments, and the redundant description will be omitted.

Figure 25:
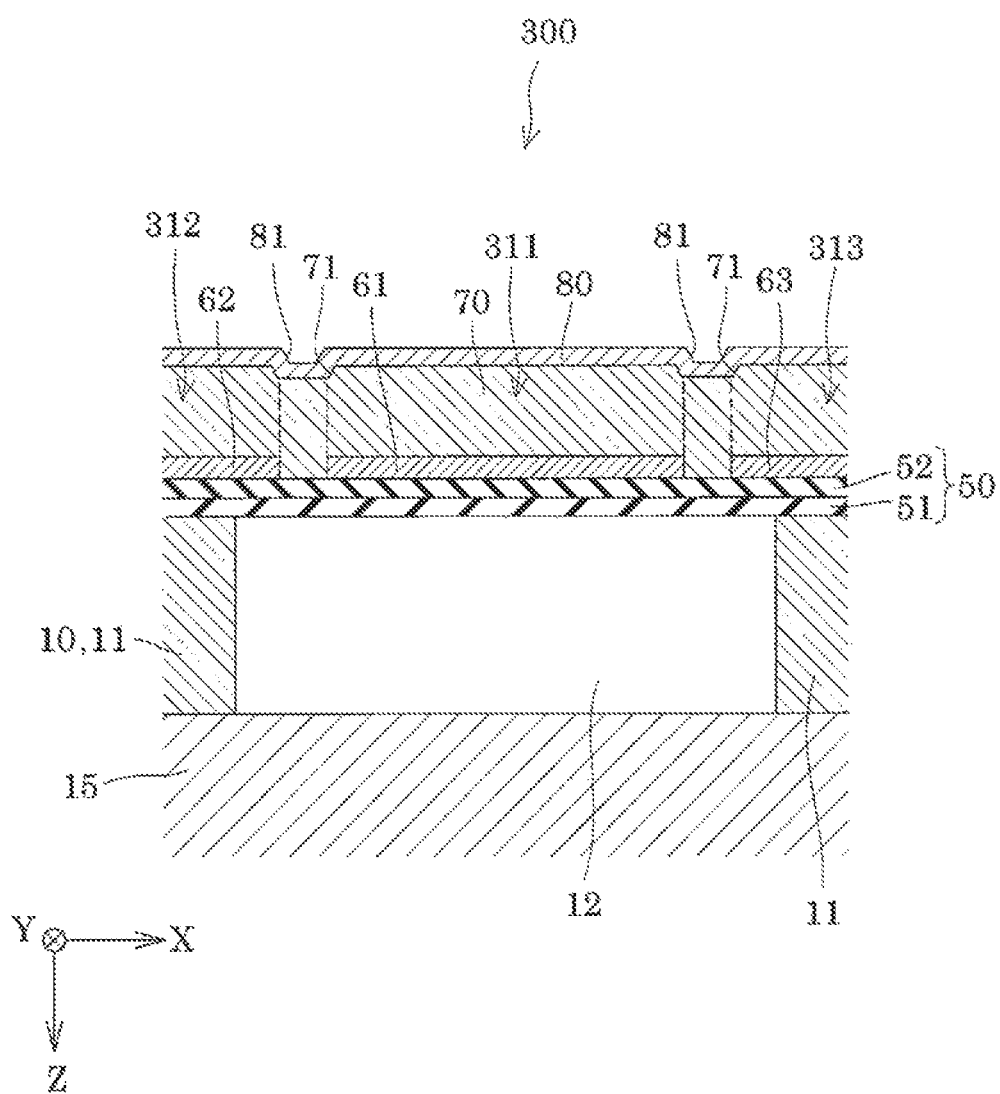
FIG. 25 is a sectional view of a main portion of a recording head according to another embodiment.

As illustrated in FIG. 25, on the surface of the fourth electrode 80 in the −Z direction on the opposite side to the piezoelectric layer 70, recessed grooves 81 are formed between the first electrode 61 and the second electrode 62 and between the first electrode 61 and the third electrode 63 in the +X direction. For example, a recess 71 may be formed on the surface of the piezoelectric layer 70 in the −Z direction by forming the piezoelectric layer 70 on the first electrode 61, the second electrode 62, and the third electrode 63 according to a liquid phase deposition method such as a sol-gel method or a MOD method, and the groove 81 may be formed by forming a film of the fourth electrode 80 on the surface of the piezoelectric layer 70 in the −Z direction on which the recess 71 is formed. Of course, the groove 81 may be formed also in Embodiments 1 and 2 described above. The surface of the piezoelectric layer 70 in the −Z direction may be planarized through chemical mechanical polishing (CMP) such that the groove 81 is not formed in the fourth electrode 80. When the surface of the piezoelectric layer 70 in the −Z direction is flat, the surface of the piezoelectric layer 70 in the −Z direction may be partially etched via a mask to simultaneously form the recess 71 and the groove 81.

In the recording head 2 illustrated in FIG. 25, on the surface of the fourth electrode 80 on the opposite side to the piezoelectric layer 70, it is preferable that the recessed grooves 81 are formed between the first electrode 61 and the second electrode 62, and between the first electrode 61 and the third electrode 63 in the +X direction that is a first direction because deformation is facilitated.

Figure 26:
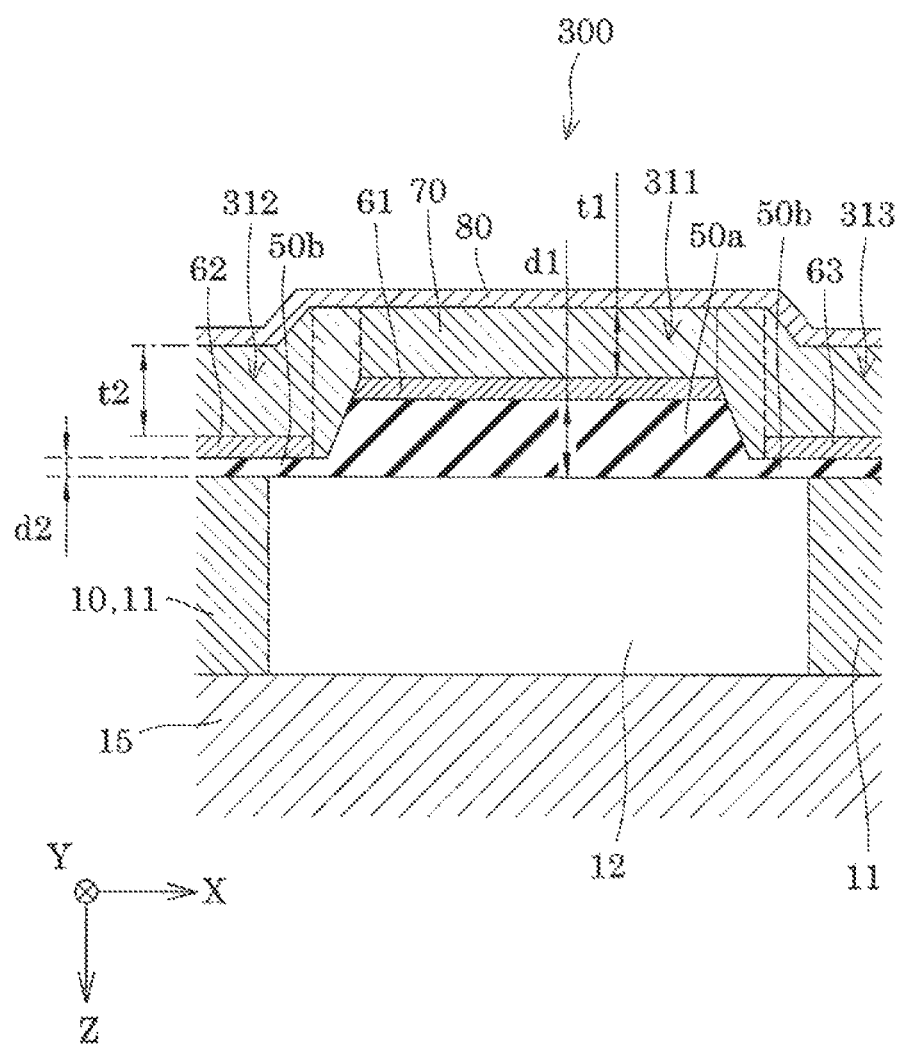
FIG. 26 is a sectional view of a main portion of a recording head according to still another embodiment.

The vibration plate 50 preferably has a Young's modulus lower than that of the piezoelectric layer 70. For example, in each of the above-described embodiments, the insulator film 52 of zirconium oxide ($ZrO_x$) is included, and lead zirconate titanate (PZT) is used for the piezoelectric layer 70, and thus the vibration plate 50 has a Young's modulus lower than that of the piezoelectric layer 70. Therefore, as illustrated in FIG. 26, both ends of the vibration plate 50 in the +X direction are thinner than the center thereof in the +Z direction in the region corresponding to the pressure chamber 12 when viewed in the +Z direction. That is, when viewed in the −Z direction, the vibration plate 50 includes a first vibration portion 50a having a thickness d1 provided in a region overlapping the first electrode 61, and a second vibration portion 50b having a thickness d2 provided in a region overlapping the second electrode 62 and the third electrode 63, where d1>d2.

The first vibration portion 50a and the second vibration portion 50b are formed such that the surfaces thereof in the +Z direction are planarized, and the first vibration portion 50a further protrudes in the −Z direction on the opposite side to the pressure chamber 12 than the second vibration portion 50b to have a larger film thickness. Therefore, in the +Z direction, a distance t1 between the first electrode 61 and the fourth electrode 80 is smaller than a distance t2 between the second electrode 62 and the third electrode 63, and the fourth electrode 80. That is, t1<t2. Each of the distance t1 between the first electrode 61 and the fourth electrode 80 and the distance t2 between the second electrode 62 and the third electrode 63 and the fourth electrode 80 may be replaced with a thickness of the piezoelectric layer 70 in the −Z direction.

In the first vibration portion 50a and the second vibration portion 50b of the vibration plate 50 in FIG. 26, the overall thicknesses d1 and d2 of the vibration plate 50 may be adjusted by changing the thickness of the elastic film 51, for example.

As illustrated in FIG. 26, the second electrode 62, the third electrode 63, the first electrode 61, and the fourth electrode 80 are disposed in the −Z direction that is a stacking direction. It is preferable that the distance t1 between the first electrode 61 and the fourth electrode 80 in the −Z direction is smaller than the distance t2 between the second electrode 62 and the third electrode 63, and the fourth electrode 80. As described above, by making the distance t1 between the first electrode 61 and the fourth electrode 80 smaller than the distance t2, the electric field intensity of the first active portion 311 can be increased. An electric field is applied to the piezoelectric layer 70 in a direction inclined with respect to the +Z direction between the first electrode 61 and the fourth electrode 80 in an XZ plane defined by the X axis and the Z axis. Therefore, the driving efficiency can be improved.

Figure 27:
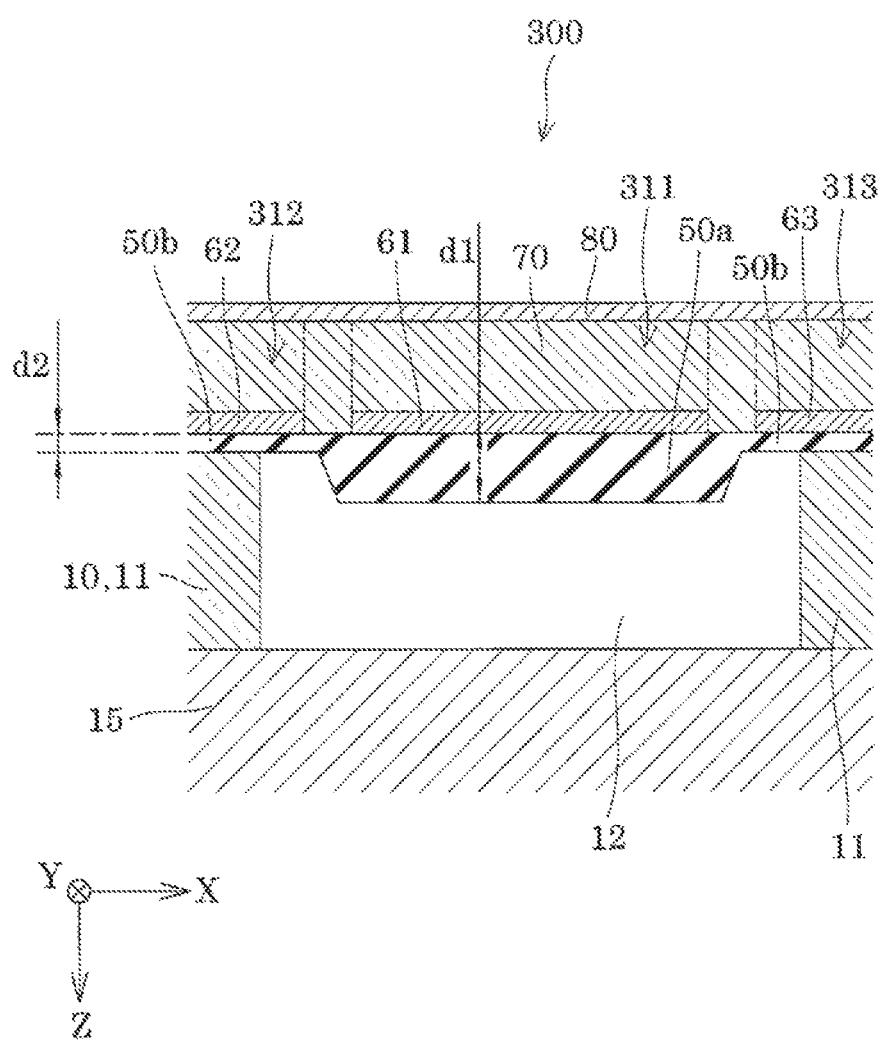
FIG. 27 is a sectional view of a main portion of a recording head according to still another embodiment.

As illustrated in FIG. 27, the first vibration portion 50a and the second vibration portion 50b may be formed such that the surfaces thereof in the −Z direction are planarized, and the first vibration portion 50a further protrudes in the +Z direction on the pressure chamber 12 side than the second vibration portion 50b to have a larger film thickness. In the first vibration portion 50a and the second vibration portion 50b of the vibration plate 50 in FIG. 27, the overall thicknesses d1 and d2 of the vibration plate 50 may be adjusted by changing the thickness of the elastic film 51, for example.

That is, as illustrated in FIGS. 26 and 27, it is preferable that the vibration plate 50 has a Young's modulus larger than that of the piezoelectric layer 70, and the second vibration portion 50b corresponding to both ends in the +X direction that is a first direction is thinner than the first vibration portion 50a corresponding to the center in the region facing the pressure chamber 12 that is a recess in the +Z direction, when viewed in the +Z direction that is a stacking direction. By providing the second vibration portion 50b thinner than the first vibration portion 50a at both ends of the vibration plate 50 in the +X direction as described above, the vibration plate 50 is easily deformed along the Z axis, and it is possible to improve the so-called displacement efficiency in which a large displacement amount can be obtained with a relatively low voltage.

By making the thickness d1 of the first vibration portion 50a of the vibration plate 50 larger than the thickness d2 of the second vibration portion 50b, the first active portion 311 can be separated from a position of the neutral axis of the vibration plate 50. Therefore, the displacement efficiency of the first active portion 311 can be improved.

Figure 28:
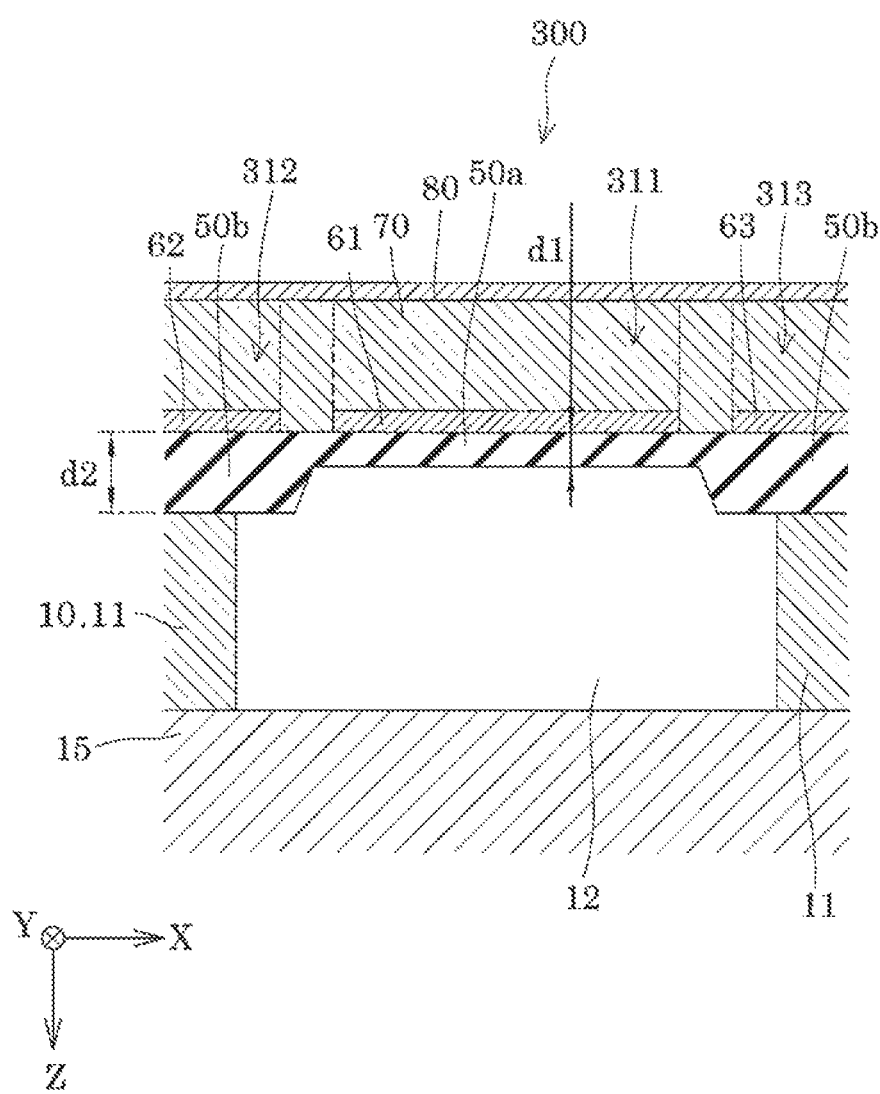
FIG. 28 is a sectional view of a main portion of a recording head according to still another embodiment.

As illustrated in FIG. 28, the thickness d2 of the second vibration portion 50b of the vibration plate 50 may be larger than the thickness d1 of the first vibration portion 50a, that is, d1<d2. Even with such a configuration, the same effect as in FIG. 27 can be achieved.

As illustrated in FIG. 26, it is preferable that both ends of the piezoelectric layer 70 in the +X direction that is a first direction is thicker than the center thereof in the region facing the pressure chamber 12 that is a recess in the −Z direction, when viewed in the −Z direction that is a stacking direction. That is, the thickness t2 of both ends of the piezoelectric layer 70 is preferably larger than the thickness t1 of the center. As described above, the thickness t1 of the piezoelectric layer 70 between the first electrode 61 and the fourth electrode 80 is smaller than the thickness t2 of the piezoelectric layer 70 between the second electrode 62 and the third electrode 63, and the fourth electrode 80, and thus the electric field intensity of the first active portion 311 can be increased. An electric field is applied to the piezoelectric layer 70 in a direction inclined with respect to the +Z direction between the first electrode 61 and the fourth electrode 80 in an XZ plane defined by the X axis and the Z axis. Therefore, the driving efficiency can be improved.

As illustrated in FIG. 28, the thickness d1 of the first vibration portion 50a of the vibration plate 50 may be smaller than the thickness d2 of the second vibration portion 50b. That is, d1<d2. As described above, by setting the thickness d1 of the first vibration portion 50a to be smaller than the thickness of the second vibration portion 50b, the driving efficiency of the first active portion 311 can be improved. By setting the thickness d2 of the second vibration portion 50b that is a region where the vibration plate 50 bends most to be larger than the thickness d1 of the first vibration portion 50a, it is possible to curb destruction of the second vibration portion 50b when the piezoelectric actuator 300 is driven.

Figure 29:
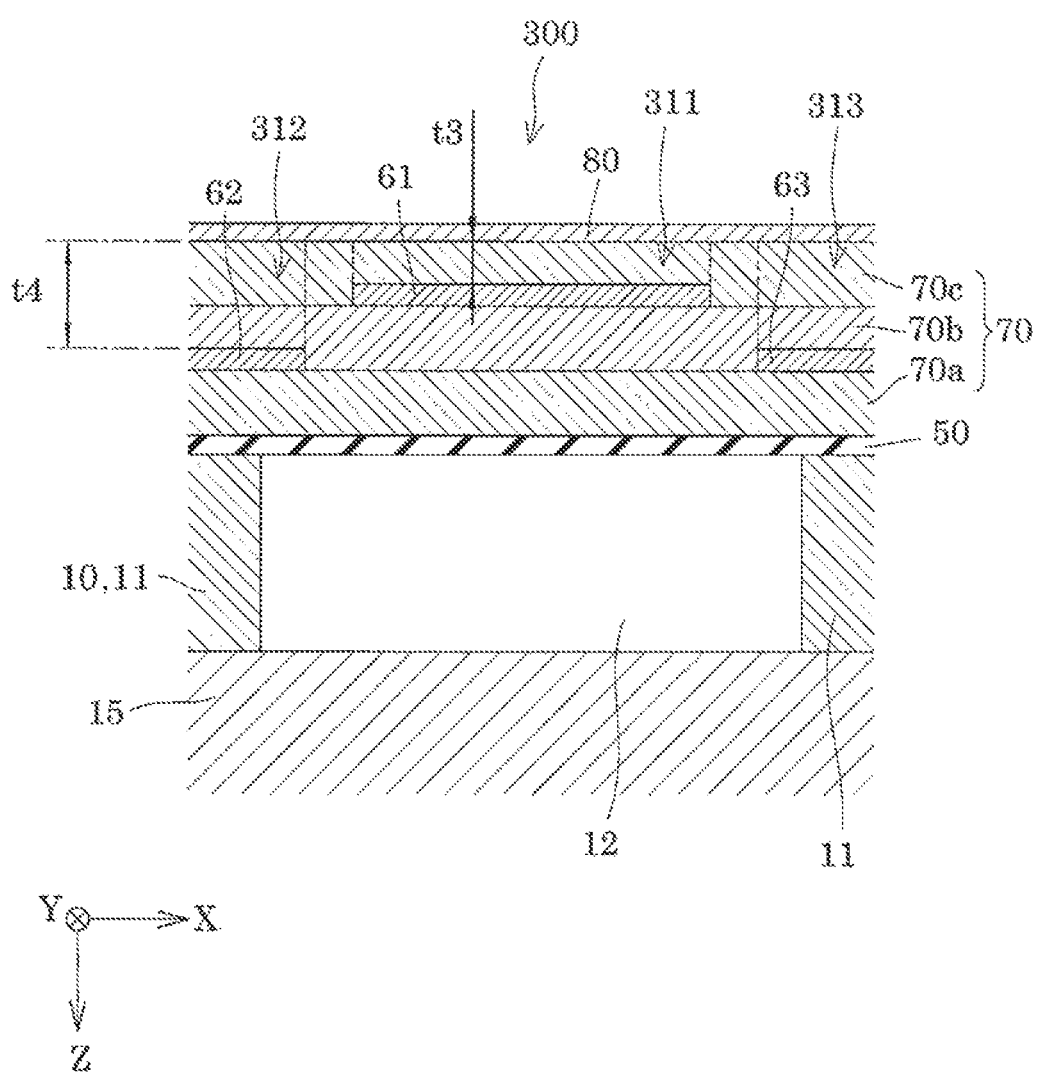
FIG. 29 is a sectional view of a main portion of a recording head according to still another embodiment.
Figure 30:
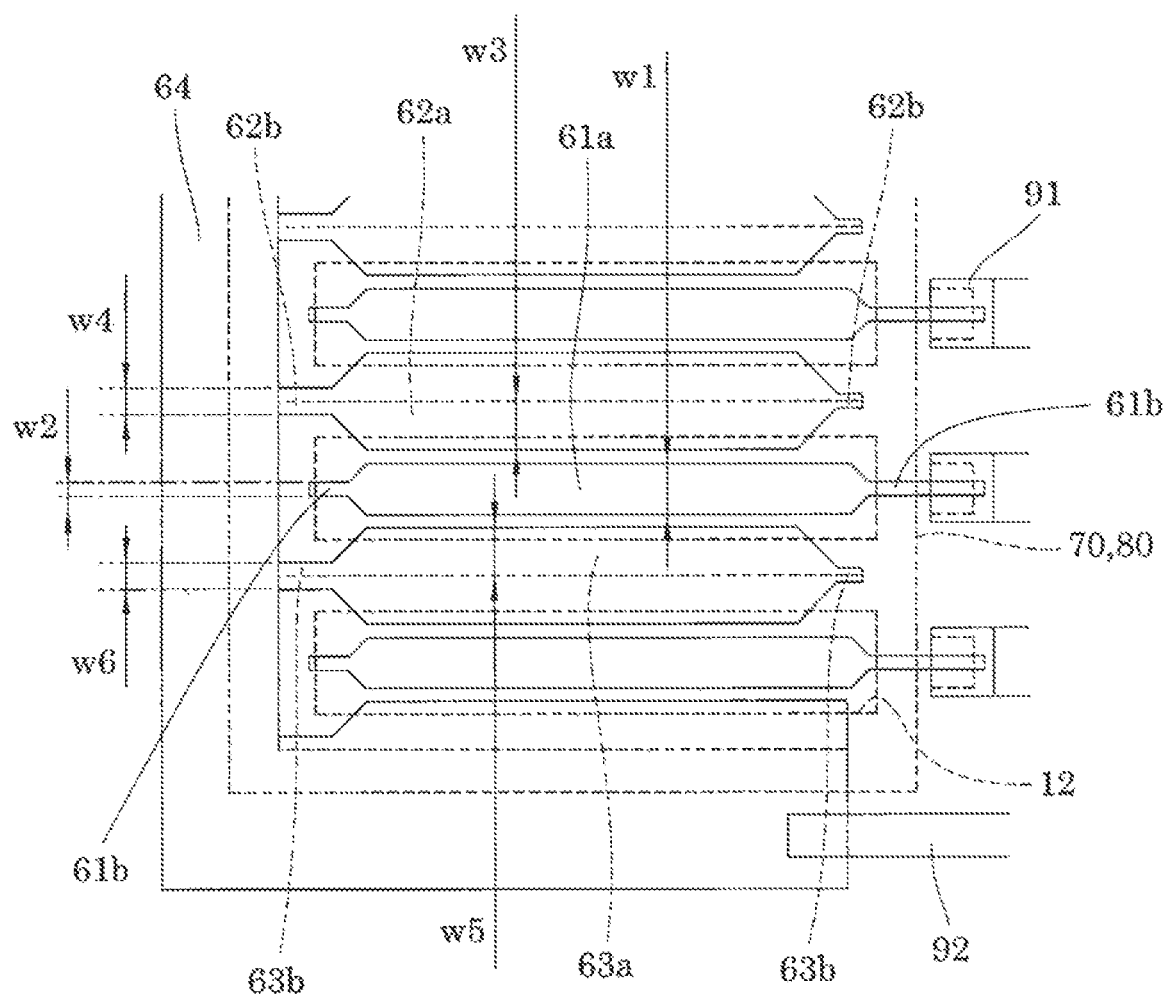
FIG. 30 is an enlarged plan view of a main portion of a channel forming substrate according to still another embodiment.

As illustrated in FIG. 29, the piezoelectric layer 70 of the piezoelectric actuator 300 includes a first piezoelectric layer 70a, a second piezoelectric layer 70b, and a third piezoelectric layer 70c in the −Z direction from the vibration plate 50. The first electrode 61 is provided between the second piezoelectric layer 70b and the third piezoelectric layer 70c. The second electrode 62 and the third electrode 63 are provided between the first piezoelectric layer 70a and the second piezoelectric layer 70b. That is, the second electrode 62 and the third electrode 63, the first electrode 61, and the fourth electrode 80 are disposed in the −Z direction. That is, the first electrode 61, and the second electrode 62 and the third electrode 63 are disposed at different positions in the −Z direction. A distance t3 between the first electrode 61 and the fourth electrode 80 is smaller than a distance t4 between the second electrode 62 and the third electrode 63 and the fourth electrode 80. That is, t3<t4. The first piezoelectric layer 70a and the second piezoelectric layer 70b of the piezoelectric layers 70 are provided on the pressure chamber 12 side of the first electrode 61.

The first electrode 61, and the second electrode 62 and the third electrode 63 are disposed at positions that do not overlap each other when viewed in the −Z direction. In the example illustrated in FIG. 29, the first electrode 61, and the second electrode 62 and the third electrode 63 are disposed at different positions in the −Z direction. Therefore, the first electrode 61, and the second electrode 62 and the third electrode 63 may be disposed at positions partially overlapping each other in the −Z direction.

In the configuration illustrated in FIG. 29, the second electrode 62 and the third electrode 63, the first electrode 61, and the fourth electrode 80 are disposed in the −Z direction that is a stacking direction. It is preferable that the distance d3 between the first electrode 61 and the fourth electrode 80 in the −Z direction is smaller than the distance d4 between the second electrode 62 and the third electrode 63, and the fourth electrode 80. As described above, by making the distance d3 between the first electrode 61 and the fourth electrode 80 smaller than the distance d4, the electric field intensity of the first active portion 311 can be increased. An electric field is applied to the piezoelectric layer 70 in a direction inclined with respect to the +Z direction between the first electrode 61 and the fourth electrode 80 in an XZ plane defined by the X axis and the Z axis. Therefore, the driving efficiency can be improved.

In the configuration illustrated in FIG. 29, it is preferable that the piezoelectric layer 70 has the first piezoelectric layer 70a and the second piezoelectric layer 70b on the pressure chamber 12 side that is a recess of the first electrode 61. As described above, since the first piezoelectric layer 70a and the second piezoelectric layer 70b are provided on the pressure chamber 12 side of the first electrode 61, the distance t3 between the first electrode 61 and the fourth electrode 80 can be made smaller than the distance t4, and the electric field intensity of the first active portion 311 can be increased. An electric field can be applied to the piezoelectric layer 70 in a direction inclined with respect to the +Z direction between the first electrode 61 and the fourth electrode 80 in the XZ plane defined by the X axis and the Z axis. Therefore, driving efficiency can be improved. An electric field in a direction inclined with respect to the +Z direction can be applied to the second piezoelectric layer 70b to be driven between the first electrode 61, and the second electrode 62 and the third electrode 63 in the XZ plane. Therefore, the driving efficiency can be improved.

As illustrated in FIG. 30, the first electrode 61 has a first central portion 61a at the center and first end portions 61b at both ends in a direction along the Y axis at positions overlapping the pressure chamber 12 when viewed in the −Z direction. A width w1 of the first central portion 61a in the +X direction is larger than a width w2 of the first end portion 61b. That is, w1>w2. That is, the width of the first electrode 61 in the +X direction is larger at the center side of the pressure chamber 12 in the +Y direction than at both ends thereof when viewed in the −Z direction.

The second electrode 62 has a second central portion 62a at the center and second end portions 62b at both ends in the direction along the Y axis at positions overlapping the pressure chamber 12 when viewed in the −Z direction. A width w3 of the second central portion 62a in the +X direction is larger than a width w4 of the second end portion 62b. That is, w3>w4.

The third electrode 63 has a third central portion 63a at the center and third end portions 63b at both ends in the direction along the Y axis at positions overlapping the pressure chamber 12 when viewed in the −Z direction. A width w5 of the third central portion 63a in the +X direction is larger than a width w6 of the third end portion 63b. That is, w5>w6. That is, the width of the second electrode 62 and the third electrode 63 in the +X direction is larger at the center side of the pressure chamber 12 in the +Y direction than at both ends when viewed in the −Z direction.

In the example illustrated in FIG. 30, the width in the +X direction of both the first electrode 61, and the second electrode 62 and the third electrode 63 is larger at the center side of the pressure chamber 12 in the +Y direction than both ends thereof when viewed in the −Z direction. However, the present disclosure is not particularly limited to this, and any one of the first electrode 61, and the second electrode 62 and the third electrode 63 may have a width in the +X direction that satisfies the above configuration.

As illustrated in FIG. 30, it is preferable that the width of the first electrode 61 in the +X direction that is a first direction is larger than at the center side of the pressure chamber 12 that is a recess in the +Y direction that is a second direction orthogonal to the +X direction than at both ends thereof when viewed in the −Z direction that is a stacking direction. By making the width w1 of the first central portion 61a at the center of the first electrode 61 larger than the width w2 of the first end portions 61b at both ends as described above, an area of the first electrode 61 in the XY plane can be increased, and the driving efficiency can be improved. Since the first end portion 61b has the smaller width w2 than the first central portion 61a, electric field concentration at the end of the first active portion 311 can be curbed. Therefore, it is possible to curb destruction such as burning and cracking of the piezoelectric layer 70.

As illustrated in FIG. 30, it is preferable that the width of the second electrode 62 and the third electrode 63 in the +X direction that is a first direction is larger than at the center side of the pressure chamber 12 that is a recess in the +Y direction that is a second direction orthogonal to the +X direction than at both ends thereof when viewed in the −Z direction that is a stacking direction. As described above, the width w3 of the second central portion 62a and the width w5 of the third central portion 63a at the centers of the second electrode 62 and the third electrode 63 are respectively larger than the width w4 of the second end portion 62b at both ends and the width w6 of the third end portion 63b at both ends. Thus, an area of the XY plane of the second electrode 62 and the third electrode 63 can be increased, and the driving efficiency can be improved.

In the ink jet recording apparatus 1 described above, a case where the recording head 2 is mounted on the transport body 7 and moved in the direction along the Y axis has been exemplified, but the present disclosure is not particularly limited to this and can also be applied to a so-called line-type recording apparatus in which the recording head 2 is fixed and printing is performed simply by moving the medium S such as paper in the direction along the X axis that is a sub-scanning direction.

In each of the above embodiments, the bias potential vbs is supplied to the fourth electrode 80, but the present disclosure is not particularly limited to this, and the fourth electrode 80 may be ground (GND).

In the above embodiments, the ink jet recording head has been described as an example of a liquid ejecting head, and the ink jet recording apparatus has been described as an example of a liquid ejecting apparatus. The present disclosure is intended for being applied to general liquid ejecting heads and liquid ejecting apparatuses, and can of course be applied to liquid ejecting heads and liquid ejecting apparatuses that eject liquids other than ink. Other liquid ejecting heads include, for example, various recording heads used in image recording apparatuses such as printers, coloring material ejecting heads used in manufacturing color filters such as liquid crystal displays, electrode material ejecting heads used for electrode formation such as organic EL displays and field emission displays (FEDs), and bioorganic material ejecting heads used for bio-chip manufacturing, and the present disclosure can also be applied to liquid ejecting apparatuses having such liquid ejecting heads.

What is claimed is:
1. A piezoelectric device comprising:
   a substrate on which a plurality of recesses are arranged in a first direction;
   a vibration plate; and
   a piezoelectric actuator including a plurality of electrodes and a piezoelectric layer, and the plurality of electrodes including a first electrode, a second electrode, a third electrode, and a fourth electrode, wherein
   the piezoelectric layer is stacked between the first electrode and the fourth electrode, between the second electrode and the fourth electrode, and between the third electrode and the fourth electrode, a plurality of active portions in which the piezoelectric layer is interposed between the plurality of electrodes in a stacking direction are provided, the second electrode and the third electrode are provided from an edge of a region facing a recess to an outside of the recess when viewed in the stacking direction at both ends of the recess in the first direction, the first electrode is formed between the second electrode and the third electrode in the first direction, the second electrode, the third electrode, and the fourth electrode configure common electrodes for the plurality of active portions, the first electrode configures an individual electrode provided independently for each of the active portions, and in the stacking direction, a distance between the first electrode and the fourth electrode is the same as each of a distance between the second electrode and the fourth electrode and a distance between the third electrode and the fourth electrode.

2. The piezoelectric device according to claim 1, wherein the piezoelectric layer is not provided on a recess side of the first electrode.

3. The piezoelectric device according to claim 1, wherein the piezoelectric layer is provided on a recess side of the first electrode.

4. The piezoelectric device according to claim 1, wherein the first electrode, the second electrode, and the third electrode do not overlap one another in the first direction when viewed in the stacking direction.

5. The piezoelectric device according to claim 1, wherein the fourth electrode covers the recess in the first direction when viewed in the stacking direction.

6. The piezoelectric device according to claim 1, wherein the recess has a second direction, as a longitudinal direction, orthogonal to the first direction when viewed in the stacking direction.

7. The piezoelectric device according to claim 1, wherein a width of the first electrode in the first direction is larger at a center side of the recess in a second direction orthogonal to the first direction when viewed in the stacking direction than at both ends of the recess.

8. The piezoelectric device according to claim 1, wherein a width of the second electrode and the third electrode in the first direction is larger at a center side of the recess in a second direction orthogonal to the first direction when viewed in the stacking direction than at both ends of the recess.

9. The piezoelectric device according to claim 1, wherein the vibration plate has a Young's modulus larger than that of the piezoelectric layer, and in the region facing the recess when viewed in the stacking direction, both ends of the vibration plate in the first direction are thinner than a center thereof in the stacking direction.

10. The piezoelectric device according to claim 9, wherein in the region facing the recess when viewed in the stacking direction, both ends of the piezoelectric layer in the first direction are thicker than a center thereof in the stacking direction.

11. A liquid ejecting apparatus comprising:

a substrate on which a plurality of pressure chambers communicating with nozzles ejecting a liquid are arranged in a first direction;

a vibration plate;

a piezoelectric actuator including a plurality of electrodes and a piezoelectric layer, and the plurality of electrodes including a first electrode, a second electrode, a third electrode, and a fourth electrode, wherein the piezoelectric layer is stacked between the first electrode and the fourth electrode, between the second electrode and the fourth electrode, and between the third electrode and the fourth electrode; and a control section that drives the piezoelectric actuator, a plurality of active portions in which the piezoelectric layer is interposed between the plurality of electrodes in a stacking direction are provided, the second electrode and the third electrode are provided to extend from an edge of a region facing a pressure chamber to an outside of the pressure chamber when viewed in the stacking direction at both ends of the pressure chamber in the first direction, the first electrode is formed between the second electrode and the third electrode in the first direction, the second electrode, the third electrode, and the fourth electrode configure common electrodes for the plurality of active portions, the first electrode configures an individual electrode provided independently for each of the active portions, the control section supplies an ejection pulse for ejecting the liquid from the nozzles to the first electrode, and the control section supplies a damping pulse for driving the piezoelectric actuator to the second electrode and the third electrode such that the liquid is not ejected from the nozzles at least after the ejection pulse.

12. The liquid ejecting apparatus according to claim 11, wherein the control section deforms the vibration plate to protrude on an opposite side to the pressure chamber by using the damping pulse.

13. The liquid ejecting apparatus according to claim 11, wherein the control section deforms the vibration plate to protrude toward a pressure chamber side by using the ejection pulse.

14. The liquid ejecting apparatus according to claim 11, wherein the control section supplies a first drive signal including the ejection pulse to the first electrode, and supplies a first potential different from a potential supplied to the fourth electrode to the second electrode and the third electrode while the first drive signal is being supplied to the first electrode.

15. A liquid ejecting apparatus comprising:

a substrate on which a plurality of pressure chambers communicating with nozzles ejecting a liquid are arranged in a first direction;

a vibration plate;

a piezoelectric actuator including a plurality of electrodes, and the piezoelectric layer, and the plurality of electrodes including a first electrode, a second electrode, a third electrode, and a fourth electrode, wherein the piezoelectric layer is stacked between the first electrode and the fourth electrode, between the second electrode and the fourth electrode, and between the third electrode and the fourth electrode; and a control section that drives the piezoelectric actuator, a plurality of active portions in which the piezoelectric layer is interposed between plurality of electrodes in a stacking direction are provided, the second electrode and the third electrode are provided to extend from an edge of a region facing a pressure chamber to an outside of the pressure chamber when viewed in the stacking direction at both ends of the pressure chamber in the first direction, the first electrode is formed between the second electrode and the third electrode in the first direction, the second electrode, the third electrode, and the fourth electrode configure common electrodes for the plurality of active portions, the first electrode configures an individual electrode provided independently for each of the active portions, the control section supplies a first drive signal including an ejection pulse for ejecting the liquid from the nozzles to the first electrode, the control section supplies a first potential different from a potential supplied to the fourth electrode to the second electrode and the third electrode while the first drive signal is being supplied to the first electrode, and in the stacking direction, a distance between the first electrode and the fourth electrode is the same as each of a distance between the second electrode and the fourth electrode and a distance between the third electrode and the fourth electrode.

16. The liquid ejecting apparatus according to claim 15, wherein the control section supplies a second potential to the fourth electrode while the first drive signal is being supplied, and the first potential is equal to or higher than the second potential.

* * * * *